(12) United States Patent
Kanegae et al.

(10) Patent No.: US 7,964,918 B2
(45) Date of Patent: Jun. 21, 2011

(54) SEMICONDUCTOR DEVICE AND METHOD FOR MANUFACTURING THE SAME

(75) Inventors: Kenshi Kanegae, Osaka (JP); Takayuki Yamada, Osaka (JP)

(73) Assignee: Panasonic Corporation, Osaka (JP)

( * ) Notice: Subject to any disclaimer, the term of this patent is extended or adjusted under 35 U.S.C. 154(b) by 224 days.

(21) Appl. No.: 12/248,156

(22) Filed: Oct. 9, 2008

(65) Prior Publication Data

US 2009/0108368 A1 Apr. 30, 2009

(30) Foreign Application Priority Data

Oct. 31, 2007 (JP) ................. 2007-282846

(51) Int. Cl.
*H01L 29/66* (2006.01)
*H01L 21/4763* (2006.01)

(52) U.S. Cl. ............. 257/369; 257/371; 257/E21.177; 257/E27.108; 257/E21.632; 257/204; 257/E27.062; 257/E27.064; 257/E27.067; 438/199; 438/592

(58) Field of Classification Search .......... 438/199, 438/592; 257/369, E21.177, E27.062, E27.064, 257/E21.632
See application file for complete search history.

(56) References Cited

U.S. PATENT DOCUMENTS

| | | | |
|---|---|---|---|
| 5,641,983 A | 6/1997 | Kato et al. | |
| 7,074,664 B1 | 7/2006 | White et al. | |
| 2002/0153573 A1* | 10/2002 | Mogami | 257/369 |
| 2005/0064653 A1* | 3/2005 | Park et al. | 438/232 |
| 2006/0172516 A1 | 8/2006 | Adetutu et al. | |
| 2006/0234433 A1 | 10/2006 | Luan et al. | |
| 2007/0007602 A1 | 1/2007 | Oda et al. | |
| 2007/0122966 A1* | 5/2007 | Hoentschel et al. | 438/231 |
| 2007/0228480 A1* | 10/2007 | Yen et al. | 257/369 |
| 2007/0254425 A1* | 11/2007 | Kim et al. | 438/216 |
| 2008/0042213 A1* | 2/2008 | Nam et al. | 257/369 |
| 2008/0242070 A1* | 10/2008 | Chen et al. | 438/587 |

OTHER PUBLICATIONS

Nishida, Y. et al., "Advanced Poly-Si NMIS and Poly-Si/TiN PMIS Hybrid-gate High-k CMIS using PVD/CVD-Stacked TiN and Local Strain Technique," 2007, Syposium on VLSI Technology Digest of Technical Papers, pp. 214-215.

\* cited by examiner

*Primary Examiner* — Andy Huynh
*Assistant Examiner* — Aaron A Dehne
(74) *Attorney, Agent, or Firm* — McDermott Will & Emery LLP

(57) ABSTRACT

A gate electrode of one of an nFET and a pFET includes a metal-containing layer in contact with a gate insulating film and a first silicon-containing layer formed on the metal-containing layer, and a gate electrode of the other FET includes a second silicon-containing layer in contact with a gate insulating film and a third silicon-containing layer formed on the second silicon-containing layer. The first silicon-containing layer and the third silicon-containing layer are formed by the same silicon-containing material film.

22 Claims, 26 Drawing Sheets

FIG. 21

| Bond before reaction | | Si-Si/M1-M2 ratio (a.u.) | Bond after reaction | |
|---|---|---|---|---|
| Bond dissociation energy ($D^o_{298}$ /kJmol$^{-1}$) | | | Bond dissociation energy ($D^o_{298}$ /kJmol$^{-1}$) | |
| Si-Si | 325.0 | 1.000 | Si-Cl | 406.0 |
| Ti-Ti | 141.4 | 2.298 | Ti-Cl | 405.4 |
| Ti-N | 476.1 | 0.683 | Ti-Cl | |
| Ti-C | 423.0 | 0.768 | Ti-Cl | |
| Ti-O | 672.4 | 0.483 | Ti-Cl | |
| Ta-N | 611.0 | 0.532 | Ta-Cl | 544.0 |
| Ta-O | 799.1 | 0.407 | Ta-Cl | |
| Si-O | 799.6 | 0.406 | Si-Cl | 406.0 |
| Si-N | 470.0 | 0.691 | Si-Cl | |
| Si-C | 451.5 | 0.720 | Si-Cl | |
| Hf-O | 801.7 | 0.405 | Hf-Cl | |
| Hf-N | 536.0 | 0.606 | Hf-Cl | |
| Hf-C | 548.0 | 0.593 | Hf-Cl | |
| Ir-O | 414.6 | 0.784 | Ir-Cl | |
| Ru-O | 528.0 | 0.616 | Ru-Cl | |

FIG. 22

| Bond before reaction | | Si-Si/M1-M2 ratio (a.u.) | Bond after reaction | |
|---|---|---|---|---|
| Bond dissociation energy ($D^o_{298}$ /kJmol$^{-1}$) | | | Bond dissociation energy ($D^o_{298}$ /kJmol$^{-1}$) | |
| Si-Si | 325.0 | 1.000 | Si-Br | 367.8 |
| Ti-Ti | 141.4 | 2.298 | Ti-Br | 439.0 |
| Ti-N | 476.1 | 0.683 | Ti-Br | |
| Ti-C | 423.0 | 0.768 | Ti-Br | |
| Ti-O | 672.4 | 0.483 | Ti-Br | |
| Si-O | 799.6 | 0.406 | Si-Br | 367.8 |
| Si-N | 470.0 | 0.691 | Si-Br | |
| Si-C | 451.5 | 0.720 | Si-Br | |
| Hf-O | 801.7 | 0.405 | Hf-Br | |
| Hf-N | 536.0 | 0.606 | Hf-Br | |
| Hf-C | 548.0 | 0.593 | Hf-Br | |
| Ir-O | 414.6 | 0.784 | Ir-Br | |
| Ru-O | 528.0 | 0.616 | Ru-Br | |

SEMICONDUCTOR DEVICE AND METHOD FOR MANUFACTURING THE SAME

BACKGROUND OF THE INVENTION

1. Field of the Invention

The present invention relates to a semiconductor device, and a method for producing the same. More particularly, the present invention relates to a semiconductor device including a field effect transistor, and a method for producing the same.

2. Description of the Background Art

In recent years, semiconductor devices have been more and more integrated and more and more miniaturized, and transistors have also been miniaturized rapidly. Accordingly, the thickness of the gate insulating film of the transistor has been reduced, and it is now as small as about 2.0 nm or less in terms of the EOT (equivalent oxide thickness). When the thickness thereof is reduced, a conventional $SiO_2$ gate insulating film will have an increased, non-negligible leak current. Thus, a high dielectric constant film (hereinafter referred to as a "high-k film") is used as the gate insulating film. By using a high-k film as the gate insulating film, it is possible to reduce the EOT and reduce the power consumption while ensuring a large physical thickness to thereby suppress the tunnel current.

As transistors are miniaturized, there is a problem with the gate electrode that the capacitance decreases due to the depletion of the electrode. For a conventional polysilicon gate electrode, this capacitance decrease accounts for an about 0.5 nm increase in the thickness of the silicon oxide film, which is non-negligible with respect to the thickness of the gate insulating film. Therefore, for the gate electrode, it has been proposed in the art to use a metal, instead of polysilicon used in the prior art. With a metal gate, it is possible to suppress the depletion problem as described above.

With a gate electrode using a polysilicon film as in the prior art, it is easy to separately produce a p-channel region and an n-channel region, i.e., regions of two different work functions, by using a photolithography method and an ion implantation method. For example, when forming a CMOSFET (Complementary Metal Oxide Semiconductor Field Effect Transistor) in which a polysilicon film is used for the gate electrode, there is a widely-used method in the art (dual work function), in which $n^+$ PolySi is used for the gate electrode of an nMOSFET and $p^+$ PolySi for the gate electrode of a pMOSFET, thereby realizing a low threshold.

With a metal gate, however, no method has been established in the art, equivalent to the above-described method for a polysilicon gate, in which a single type of a film is deposited, after which impurities of different conductivity types are implanted into appropriate regions, thereby easily realizing variations of the work function.

In view of this, a hybrid metal gate electrode structure has been proposed in the art as a gate electrode structure with which a dual work function control is realized while using a metal gate electrode. Specifically, in this gate electrode structure, a pMIS (Metal Insulator Semiconductor) structure with a metal gate is used on the p-channel side for suppressing the depletion as described above, whereas an nMOS structure with $n^+$ PolySi, with which the work function can easily be controlled, is used on the n-channel side where the depletion of the gate electrode is less likely to occur (see Non-Patent Document 1).

A method for forming a CMOSFET using conventional hybrid metal gate electrode structure will now be described.

FIGS. 23A, 23B, 24A and 24B are cross-sectional views each showing a step in a method for forming a CMOSFET using a conventional hybrid metal gate electrode structure.

First, as shown in FIG. 23A, an isolation region 12 is formed in a semiconductor substrate 11 to thereby separate an n-channel region 13 and a p-channel region 14 from each other, after which a p well and an n well (not shown) are formed in the n-channel region 13 and the p-channel region 14, respectively. Then, a high-k film such as an $HfO_2$ film is formed as a gate insulating film 15 on the semiconductor substrate 11 including the regions 13 and 14. Then, a gate electrode material film 21 of TiN, or the like, which is a metal containing film for the pMIS structure, is deposited on the gate insulating film 15.

Then, as shown in FIG. 23B, a portion of the gate electrode material film 21 in the n-channel region 13 is selectively removed by using a resist pattern 19 having an opening corresponding to the n-channel region 13, and then the resist pattern 19 is removed. Then, as shown in FIG. 24A, a polysilicon film 23 is deposited across the entire surface of the semiconductor substrate 11, and then a resist pattern 24 covering gate electrode formation regions is formed.

Then, the polysilicon film 23 in the n-channel region 13 and a multi-layer film of the gate electrode material film 21 and the polysilicon film 23 in the p-channel region 14 are processed into gate electrode patterns, by using the resist pattern 24. Thus, as shown in FIG. 24B, a gate electrode 51 being the polysilicon film 23 is formed in the n-channel region 13, and a gate electrode 52 being a multi-layer film of the gate electrode material film 21 and the polysilicon film 23 is formed in the p-channel region 14. Then, although not shown in the figure, the n-channel region 13 and the p-channel region 14 are subjected to an ion implantation through an ordinary process, by using the gate electrodes as a mask, to thereby form source/drain regions, followed by a heat treatment for activating the impurity.

Non-Patent Document 1: Y. Nishida, et al., Advanced Poly-Si NMIS and Poly-Si/TiN PMIS Hybrid-gate High-k CMIS using PVD/CVD-Stacked TiN and Local Strain Technique, 2007, Symposium on VLSI Technology Digest of Technical Papers, pp. 214-215

SUMMARY OF THE INVENTION

However, with the method for forming a hybrid metal gate electrode described above, when forming gate electrodes by patterning the gate electrode material film using photolithography and dry etching, the metal material for the pMIS structure, which is the difference between the pMIS structure and the nMOS structure, needs to be completely etched away other than in a predetermined region, and the etching process needs to be stopped in the underlying gate insulating film. Then, the gate insulating film, being a thin film having a thickness of about 1 to 3 nm, is penetrated by the overetching, which is necessary to completely etch away the metal material which is the difference between the pMIS structure and the nMOS structure. Then, the underlying semiconductor substrate (silicon substrate) is exposed and the silicon substrate is dug in, thus resulting in silicon substrate chipping (e.g., substrate chipping 31 shown in FIG. 24B). Particularly, where there is a step along the boundary between the isolation region and the active region, the metal material film is thickened on the step portion, and an increased amount of overetch is needed for the gate insulating film on the nMOS side in order to completely remove the metal material film on such a portion. As a result, problems caused by the penetration of the gate insulating film and the entailing substrate chipping, such as the deterioration of transistor characteristics and the increase in the amount of particles, are more pronounced. FIG. 25 shows a case where there occurs a step along the boundary between the isolation region 12 and the active region in the step shown in FIG. 23A in a method for forming a CMOSFET using a conventional hybrid metal gate electrode structure as described above, wherein the gate electrode material film 21 being the metal material film is thickened on the step portion (the increased thickness is denoted by a double-headed arrow 50).

In view of the above, it is an object of the present invention to provide a semiconductor device employing a hybrid metal gate electrode, in which the gate insulating film is not penetrated, and a method for manufacturing the same.

In order to achieve the object set forth above, a first aspect of the present invention is directed to a semiconductor device, including an n-channel field effect transistor and a p-channel field effect transistor formed on a semiconductor substrate, wherein: a gate electrode of one of the n-channel field effect transistor and the p-channel field effect transistor includes a metal-containing layer in contact with a gate insulating film, and a first silicon-containing layer formed on the metal-containing layer; a gate electrode of the other one of the n-channel field effect transistor and the p-channel field effect transistor includes a second silicon-containing layer in contact with a gate insulating film, and a third silicon-containing layer formed on the second silicon-containing layer; and the first silicon-containing layer and the third silicon-containing layer are formed by a same silicon-containing material film.

A second aspect of the present invention is directed to a method for manufacturing the semiconductor device of the first aspect of the present invention, the method including: a step (a) of forming a gate insulating film on a semiconductor substrate having a first transistor region and a second transistor region; a step (b) of forming a first silicon-containing material film on the gate insulating film; a step (c) of removing a portion of the first silicon-containing material film that is located in the first transistor region; a step (d), after the step (c), of forming a metal-containing material film on a portion of the gate insulating film that is located in the first transistor region and a portion of the first silicon-containing material film that is located in the second transistor region; a step (e) of removing a portion of the metal-containing material film that is located in the second transistor region; a step (f), after the step (e), of forming a second silicon-containing material film on a portion of the metal-containing material film that is located in the first transistor region and the portion of the first silicon-containing material film that is located in the second transistor region; and a step (g) of patterning the metal-containing material film and the second silicon-containing material film in the first transistor region to thereby form a first gate electrode, and patterning the first silicon-containing material film and the second silicon-containing material film in the second transistor region to thereby form a second gate electrode.

In order to achieve the object set forth above, a third aspect of the present invention is directed to a semiconductor device, including an n-channel field effect transistor and a p-channel field effect transistor formed on a semiconductor substrate, wherein: a gate electrode of one of the n-channel field effect transistor and the p-channel field effect transistor includes a metal-containing layer in contact with a gate insulating film, a first conductive oxide layer formed on the metal-containing layer, and a first silicon-containing layer formed on the first conductive oxide layer; a gate electrode of the other one of the n-channel field effect transistor and the p-channel field effect transistor includes a second silicon-containing layer in contact with a gate insulating film, a second conductive oxide layer formed on the second silicon-containing layer, and a third silicon-containing layer formed on the second conductive oxide layer; and the first silicon-containing layer and the third silicon-containing layer are formed by a same silicon-containing material film.

A fourth aspect of the present invention is directed to a method for manufacturing the semiconductor device of the third aspect of the present invention, the method including: a step (a) of forming a gate insulating film on a semiconductor substrate having a first transistor region and a second transistor region; a step (b) of successively forming a first silicon-containing material film and a first conductive oxide film on the gate insulating film; a step (c) of removing a portion of the first conductive oxide film and the first silicon-containing material film that is located in the first transistor region; a step (d), after the step (c), of successively forming a metal-containing material film and a second conductive oxide film on a portion of the gate insulating film that is located in the first transistor region and on a portion of the first conductive oxide film that is located in the second transistor region; a step (e) of removing a portion of the second conductive oxide film and the metal-containing material film that is located in the second transistor region; a step (f), after the step (e), of forming a second silicon-containing material film on a portion of the second conductive oxide film that is located in the first transistor region and on the portion of the first conductive oxide film that is located in the second transistor region; and a step (g) of patterning the metal-containing material film, the second conductive oxide film and the second silicon-containing material film in the first transistor region to thereby form a first gate electrode, and patterning the first silicon-containing material film, the first conductive oxide film and the second silicon-containing material film in the second transistor region to thereby form a second gate electrode.

According to the first to fourth aspects of the present invention, the first silicon-containing material film (the second silicon-containing layer), which serves as an overetch absorbing layer when etching the metal-containing material film, is formed in advance in the second transistor region (the other transistor region), in which the metal-containing material film (the metal-containing layer) in contact with the gate insulating film is not formed as a part of the gate electrode. Therefore, by setting the thickness of the first silicon-containing material film, etc., so that the amount of overetch of the gate insulating film when etching the metal-containing material film becomes substantially equal between the transistor regions, it is possible to reduce the non-uniformity in the amount of overetch of the gate insulating film between the transistor regions. Thus, since the penetration of the gate insulating film and the entailing problems such as the chipping of the substrate can be prevented, it is possible to avoid the risk of lowering the yield due to deterioration of the transistor characteristics, the increase in the particles, etc., whereby it is possible to provide a high-performance semiconductor device at a low cost.

According to the first to fourth aspects of the present invention, the amount of overetch at the time of etching during the gate electrode process is substantially equal between the transistor regions, whereby gate dimension variations due to overetching can be equalized between the transistor regions. Therefore, it is possible to reduce the gate dimension variations between the transistors, i.e., the n-channel field effect transistor and the p-channel field effect transistor, whereby it is possible to provide a semiconductor device with stable transistor characteristics.

In the semiconductor device of the first aspect of the present invention, an entirety of the second silicon-containing layer and the third silicon-containing layer may be a silicide layer.

In the method for manufacturing a semiconductor device of the second aspect of the present invention, the step (c) may include a step of removing the portion of the first silicon-containing material film that is located in the first transistor region by using an etching cover film that covers the portion of the first silicon-containing material film that is located in the second transistor region; and the method may further include, before the step (f), a step of removing the etching cover film. In such a case, the step (e) may include a step of removing the portion of the metal-containing material film that is located in the second transistor region by using another etching cover film that covers the portion of the metal-containing material film that is located in the first transistor region; and the method may further include, before the step (f), a step of removing the other etching cover film.

In the semiconductor device of the third aspect of the present invention, the first conductive oxide layer and the second conductive oxide layer may be of an oxide containing at least one of Ir and Ru.

In order to achieve the object set forth above, a fifth aspect of the present invention is directed to a semiconductor device, including an n-channel field effect transistor and a p-channel field effect transistor formed on a semiconductor substrate, wherein: a gate electrode of one of the n-channel field effect transistor and the p-channel field effect transistor includes a metal-containing layer in contact with a gate insulating film, and a first silicon-containing layer formed on the metal-containing layer; a gate electrode of the other one of the n-channel field effect transistor and the p-channel field effect transistor includes a second silicon-containing layer in contact with a gate insulating film, a conductive oxide layer formed on the second silicon-containing layer, another metal-containing layer formed on the conductive oxide layer, and a third silicon-containing layer formed on the other metal-containing layer; the metal-containing layer and the other metal-containing layer are formed by a same metal-containing film; and the first silicon-containing layer and the third silicon-containing layer are formed by a same silicon-containing material film.

A sixth aspect of the present invention is directed to a method for manufacturing the semiconductor device of the fifth aspect of the present invention, the method including: a step (a) of forming a gate insulating film on a semiconductor substrate having a first transistor region and a second transistor region; a step (b) of successively forming a first silicon-containing material film and a conductive oxide film on the gate insulating film; a step (c) of removing a portion of the conductive oxide film and the first silicon-containing material film that is located in the first transistor region; a step (d), after the step (c), of successively forming a metal-containing material film and a second silicon-containing material film on a portion of the gate insulating film that is located in the first transistor region and on a portion of the conductive oxide film that is located in the second transistor region; a step (e) of patterning the second silicon-containing material film and the metal-containing material film in the first transistor region to thereby form a first gate electrode, and patterning the second silicon-containing material film and the metal-containing material film in the second transistor region into a gate electrode shape; a step (f), after the step (e), of forming an insulating film that covers the first transistor region and the second transistor region; a step (g) of etching back the insulating film and the conductive oxide film in the second transistor region while protecting the first transistor region with a resist, removing the resist, and then patterning the first silicon-containing material film in the second transistor region into a gate electrode shape while protecting the first transistor region with the insulating film to thereby form a second gate electrode; and a step (h), after the step (g), of removing the insulating film remaining in the first transistor region.

In order to achieve the object set forth above, a seventh aspect of the present invention is directed to a semiconductor device, including an n-channel field effect transistor and a p-channel field effect transistor formed on a semiconductor substrate, wherein: a gate electrode of one of the n-channel field effect transistor and the p-channel field effect transistor includes a metal-containing layer in contact with a gate insulating film, a conductive oxide layer formed on the metal-containing layer, and a silicon-containing layer formed on the conductive oxide layer; a gate electrode of the other one of the n-channel field effect transistor and the p-channel field effect transistor includes another silicon-containing layer in contact with a gate insulating film; and the silicon-containing layer and the other silicon-containing layer are formed by a same silicon-containing material film.

An eighth aspect of the present invention is directed to a method for manufacturing the semiconductor device of the seventh aspect of the present invention, the method including: a step (a) of forming a gate insulating film on a semiconductor substrate having a first transistor region and a second transistor region; a step (b) of forming a metal-containing material film and a conductive oxide film on the gate insulating film; a step (c) of removing a portion of the conductive oxide film and the metal-containing material film that is located in the second transistor region; a step (d), after the step (c), of forming a silicon-containing material film on a portion of the conductive oxide film that is located in the first transistor region and on a portion of the gate insulating film that is located in the second transistor region; a step (e) of patterning the silicon-containing material film in the first transistor region into a gate electrode shape and patterning the silicon-containing material film in the second transistor region to thereby form a second gate electrode; a step (f), after the step (e), of forming an insulating film that covers the first transistor region and the second transistor region; a step (g) of etching back the insulating film and the conductive oxide film in the first transistor region while protecting the second transistor region with a resist, removing the resist, and then patterning the metal-containing material film in the first transistor region into a gate electrode shape while protecting the second transistor region with the insulating film to thereby form a first gate electrode; and a step (h), after the step (g), of removing the insulating film remaining in the second transistor region.

According to the fifth to eighth aspects of the present invention, an insulating film, which is to serve as an etching stopper film, is formed in advance so as to cover the transistor region where there is a large amount of overetch, before the overetching during the gate electrode process. Thus, since the penetration of the gate insulating film and the entailing problems such as the chipping of the substrate can be prevented, it is possible to avoid the risk of lowering the yield due to deterioration of the transistor characteristics, the increase in the particles, etc., whereby it is possible to provide a high-performance semiconductor device at a low cost.

According to the fifth to eighth aspects of the present invention, the amount of overetch at the time of etching during the gate electrode process will not be excessive in either transistor region, whereby the gate dimension variations due to overetching can be equalized between the transistor regions. Therefore, it is possible to reduce the gate dimension variations between the transistors, i.e., the n-channel field effect transistor and the p-channel field effect transistor, whereby it is possible to provide a semiconductor device with stable transistor characteristics.

In the semiconductor device of the fifth aspect of the present invention, a first offset spacer may be formed on a side surface of a multi-layer structure of the metal-containing layer and the first silicon-containing layer; a second offset spacer may be formed on a side surface of a multi-layer structure of the second silicon-containing layer and the conductive oxide layer; the first offset spacer may be a multi-layer film of a first offset film and a second offset film formed outside the first offset film; and the second offset spacer may be a single-layer film of the second offset film. In such a case, the second offset spacer may be a multi-layer film of the first offset film and the second offset film on a side surface of a multi-layer structure of the other metal-containing layer and the third silicon-containing layer. Specifically, a width of the multi-layer structure of the second silicon-containing layer and the conductive oxide layer may be larger than that of the multi-layer structure of the other metal-containing layer and the third silicon-containing layer; and a width of the second offset spacer on the side surface of the multi-layer structure of the second silicon-containing layer and the conductive oxide layer may be smaller than that of the second offset spacer on the side surface of the multi-layer structure of the other metal-containing layer and the third silicon-containing layer.

In the semiconductor device of the first, third and fifth aspects of the present invention, at least an upper portion of each of the first silicon-containing layer and the third silicon-containing layer may be a silicide layer containing at least one of Ni, Co, Ti, W and Pt.

In the semiconductor device of the first, third and fifth aspects of the present invention, the second silicon-containing layer may be of a material obtained by doping polysilicon, amorphous silicon or silicon germanium with at least one impurity selected from P (phosphorus), As (arsenic), B (boron), In (indium), N (nitrogen), C (carbon) and F (fluorine).

In the method for manufacturing a semiconductor device of the sixth aspect of the present invention, the step (f) may include a step of forming the insulating film so as to cover a side surface of each of the second silicon-containing material film and the metal-containing material film patterned in the second transistor region; and the step (h) may include a step of forming another insulating film across an entire surface of the semiconductor substrate and then etching back the other insulating film and the insulating film to thereby form a first offset spacer being a multi-layer film of the insulating film and the other insulating film on a side surface of the first gate electrode, and form a second offset spacer including the insulating film covering a side surface of the second silicon-containing material film and the metal-containing material film of the second gate electrode, and the other insulating film covering the insulating film and a side surface of the conductive oxide film and the first silicon-containing material film of the second gate electrode.

In the semiconductor device of the seventh aspect of the present invention, an entirety of the other silicon-containing layer may be a silicide layer.

In the semiconductor device of the seventh aspect of the present invention, at least an upper portion of each of the silicon-containing layer and the other silicon-containing layer may be a silicide layer containing at least one of Ni, Co, Ti, W and Pt.

In the semiconductor device of the seventh aspect of the present invention, a first offset spacer may be formed on a side surface of a multi-layer structure of the metal-containing layer and the conductive oxide layer; a second offset spacer may be formed on a side surface of the other silicon-containing layer; the second offset spacer may be a multi-layer film of a first offset film and a second offset film formed outside the first offset film; and the first offset spacer may be a single-layer film of the second offset film. In such a case, the first offset spacer may be a multi-layer film of the first offset film and the second offset film on a side surface of the silicon-containing layer. Specifically, a width of the multi-layer structure of the metal-containing layer and the conductive oxide layer may be larger than that of the silicon-containing layer; and a width of the first offset spacer on the side surface of the multi-layer structure of the metal-containing layer and the conductive oxide layer may be smaller than that of the second offset spacer on the side surface of the silicon-containing layer.

In the semiconductor device of the fifth and seventh aspects of the present invention, where the first and second offset spacers are formed, the first offset film and the second offset film may each be a silicon oxide film, a silicon nitride film, a silicon carbide film, a silicon oxide nitride film or a silicon oxide carbide film.

In the semiconductor device of the fifth and seventh aspects of the present invention, the conductive oxide layer may be of an oxide containing at least one of Ir and Ru.

In the semiconductor device of the first, third, fifth and seventh aspects of the present invention, the metal-containing layer may be a metal film of at least one metal selected from a group consisting of Ni, Pd, Pt, Co, Rh, Ru, Cu, Ag and Au, or a film of a silicide or a carbide of at least one metal selected from the group of metals.

In the semiconductor device of the first, third, fifth and seventh aspects of the present invention, the metal-containing layer may be a metal film of at least one metal selected from a group consisting of Ti, Zr, Hf, V, Nb, Ta, Cr, Mo and W, or a film of a nitride, a silicide or a carbide of at least one metal selected from the group of metals.

In the semiconductor device of the first, third, fifth and seventh aspects of the present invention, the gate insulating film may be a single-layer film of an insulating film selected from the group consisting of an $SiO_2$ film, an $HfO_2$ film, an $HfAl_xO_y$ film, an $HfSi_xO_y$ film and a film obtained by adding nitrogen to one of these films, or a multi-layer insulating film including at least one insulating film selected from the group of insulating films.

In the method for manufacturing a semiconductor device of the eighth aspect of the present invention, the step (f) may include a step of forming the insulating film so as to cover a side surface of the silicon-containing material film patterned in the first transistor region; and the step (h) may include a step of forming another insulating film across an entire surface of the semiconductor substrate and then etching back the other insulating film and the insulating film to thereby form a first offset spacer including the insulating film covering a side surface of the silicon-containing material film of the first gate electrode and the other insulating film covering the insulating film and a side surface of the conductive oxide film and the metal-containing material film of the first gate electrode, and form a second offset spacer being a multi-layer film of the insulating film and the other insulating film on a side surface of the second gate electrode.

In the semiconductor device of the first and third aspects of the present invention, a thickness of the metal-containing layer and a thickness of the second silicon-containing layer may be determined based on a bond dissociation energy D (M1-M2) being an energy required for dissociating a bond between a metal M1 of the metal-containing layer and an element M2 thereof being the same as or different from the metal M1, and a bond dissociation energy D (Si—Si) being an energy required for dissociating a silicon bond of the second silicon-containing layer. In such a case, where the bond dissociation energy D (M1-M2) is larger than the bond dissociation energy D (Si—Si), the thickness of the second silicon-containing layer may be set to be larger than that of the metal-containing layer; and where the bond dissociation energy D (M1-M2) is smaller than the bond dissociation energy D (Si—Si), the thickness of the second silicon-containing layer may be set to be smaller than that of the metal-containing layer. The metal-containing layer may contain Ti or Ta; the second silicon-containing layer may contain polysilicon; and the thickness of the second silicon-containing layer may be set to be smaller than that of the metal-containing layer. The metal-containing layer may contain TiN, TiC, TiO, TaN, TaC or TaO; the second silicon-containing layer may contain polysilicon; and the thickness of the second silicon-containing layer may be set to be larger than that of the metal-containing layer.

In the method for manufacturing a semiconductor device of the second and fourth aspects of the present invention, a thickness of the first silicon-containing material film may be set, based on a thickness of the metal-containing material film and an etching rate ratio between the first silicon-containing material film and the metal-containing material film in the step (g), so that etching of the first silicon-containing material film and that of the metal-containing material film complete substantially simultaneously. In such a case, the thickness of the first silicon-containing material film may be set based on following expressions:

$$TIME1 = TH1/ER1 \quad \text{Expression 1}$$

$$TIME2 = TH2/ER2 \quad \text{Expression 2}$$

$$TIME2 \times 1.2 > TIME1 > TIME2 \times 0.8 \quad \text{Expression 3}$$

where TIME1 denotes an amount of time required for the etching of the first silicon-containing material film to complete, TIME2 an amount of time required for the etching of the metal-containing material film to complete, TH1 the thickness of the first silicon-containing material film, TH2 the thickness of the metal-containing material film, ER1 an etching rate of the first silicon-containing material film in the step (g), and ER2 an etching rate of the metal-containing material film in the step (g).

In the first to eighth aspects of the present invention, a separate gate insulating film may be formed in each transistor region.

As described above, according to the present invention, since the penetration of the gate insulating film and the entailing problems such as the chipping of the substrate can be prevented, it is possible to avoid the risk of lowering the yield due to deterioration of the transistor characteristics, the increase in the particles, etc., whereby it is possible to provide a high-performance semiconductor device at a low cost.

According to the present invention, the amount of overetch at the time of etching during the gate electrode process is substantially equal between the transistor regions, whereby gate dimension variations due to overetching can be equalized between the transistor regions. Therefore, it is possible to reduce the gate dimension variations between the transistors, i.e., the n-channel field effect transistor and the p-channel field effect transistor, whereby it is possible to provide a semiconductor device with stable transistor characteristics.

Thus, the present invention is useful as a semiconductor device including a CMOS device logic element or a memory device such as an SRAM where an n-channel field effect transistor and a p-channel field effect transistor are present on the same chip and a method for manufacturing the same.

BRIEF DESCRIPTION OF THE DRAWINGS

FIG. 21 shows bond dissociation energies for various materials in a case where a chlorine-based etching gas is used.

FIG. 22 shows bond dissociation energies for various materials in a case where a bromine-based etching gas is used.

DETAILED DESCRIPTION OF THE INVENTION

First Embodiment

A semiconductor device according to a first embodiment of the present invention, and a method for manufacturing the same will now be described with reference to the drawings.

FIGS. 1A to 1C, 2A to 2C and 3A to 3C are cross-sectional views each showing a step in a method for manufacturing a semiconductor device according to the first embodiment of the present invention. In FIGS. 1A to 1C, 2A to 2C and 3A to 3C, the np boundary is denoted by a broken line 110.

Figure 1A:
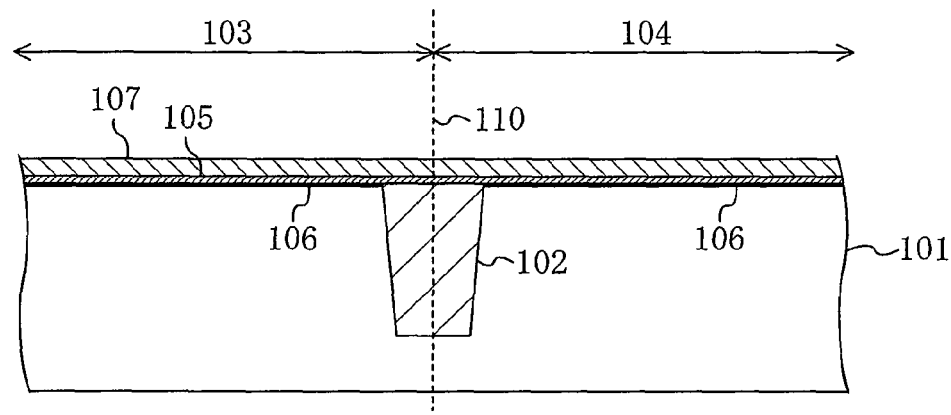
FIGS. 1A to 1C are cross-sectional views each showing a step in a method for manufacturing a semiconductor device according to a first embodiment of the present invention.

First, as shown in FIG. 1A, an isolation region 102 such as an STI (shallow trench isolation), for example, is formed in a semiconductor substrate 101 to thereby separate an n-channel region 103 and a p-channel region 104 from each other, after which the n-channel region 103 and the p-channel region 104 are each subjected to a well-forming ion implantation. Then, the n-channel region 103 and the p-channel region 104 are each subjected to a threshold-adjusting ion implantation. Then, a process is performed to make a gate insulating film having an appropriate thickness and an appropriate film quality for each transistor function such as a logic transistor, an SRAM (static random access memory) transistor and an input/output I/O transistor, for example. FIG. 1A shows a case where a gate insulating film 105 for a logic transistor, for example, is formed in each of the n-channel region 103 and the p-channel region 104. Specifically, the gate insulating film 105 is a high dielectric constant film whose relative dielectric constant is sufficiently higher than that of a silicon oxide film, e.g., a hafnium silicon oxide film (an $HfSi_xO_y$ film), formed on the surface of the semiconductor substrate 101. The EOT (equivalent silicon oxide film thickness) of the $HfSi_xO_y$ film is about 2.0 nm. At the interface between the gate insulating film 105 and the semiconductor substrate 101, the semiconductor substrate 101 is oxidized to thereby form an ultra thin silicon oxide film whose thickness is about 1 nm, for example, as an interface layer 106.

Then, as shown in FIG. 1A, a polysilicon film doped with P (phosphorus) and having a thickness of about 5 to 20 nm, for example, is deposited directly above the gate insulating film 105 as a first gate electrode material film 107 for controlling the threshold of the transistor in the n-channel region 103. The first gate electrode material film 107 serves as an overetch absorbing layer, and the thickness thereof, etc., are set so that the amount of overetch to the gate insulating film 105 is substantially equal between the n-channel region 103 and the p-channel region 104 at the time of dry etching during the gate electrode process to be performed in a subsequent step.

Figure 1B:
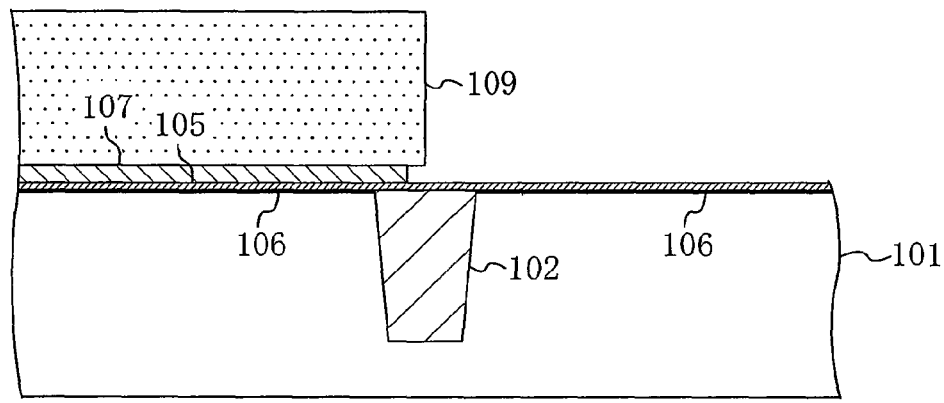

Then, as shown in FIG. 1B, a resist pattern 109 having an opening in the p-channel region 104 is formed on the first gate electrode material film 107, and the structure is etched using the resist pattern 109 as a mask to thereby remove a portion of the first gate electrode material film 107 that is located in the p-channel region 104. A potassium hydroxide solution ($KOH/H_2O$=0.3 g/150 cc) heated to 65° C., for example, is used for the etching of the polysilicon film being the first gate electrode material film 107. Then, the etching can be done while preventing a damage such as thinning of the gate insulating film 105. Alternatively, the first gate electrode material film 107 can be removed by using, for example, a diluted APM (ammonia-hydrogen peroxide mixture) solution ($NH_3$:$H_2O_2$:$H_2O$=3 to 10:1:200 to 1000) heated to 80° C., or a chemical dry etching using a low-damage remote plasma. Alternatively, the first gate electrode material film 107 can be removed by first removing halfway the first gate electrode material film 107 by a dry etching by RIE (reactive ion etching), for example, and then additionally performing an etching by using a diluted APM solution or a potassium hydroxide solution or a chemical dry etching using a low-damage remote plasma. In such a case, it is possible to reduce the amount by which the first gate electrode material film 107 in the n-channel region 103 recesses from the side surface of the resist pattern 109 in the np boundary 110. After etching the first gate electrode material film 107, the resist pattern 109 is removed by using an SPM (sulfuric acid-hydrogen peroxide mixture) solution or a thinner solution, for example.

Figure 1C:
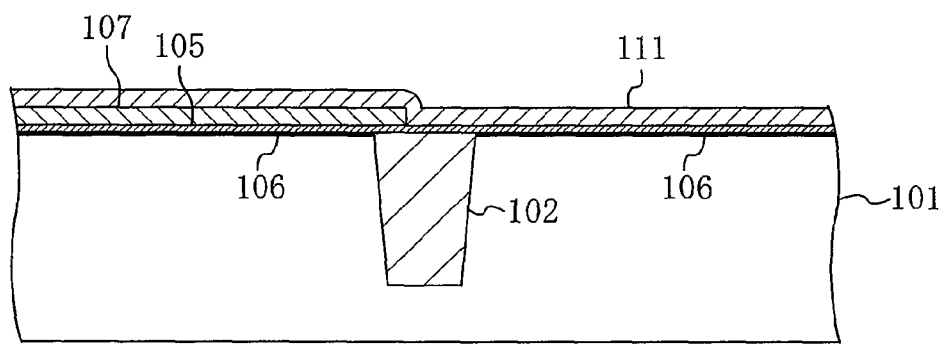

Then, as shown in FIG. 1C, a TiN film having a thickness of about 5 to 20 nm, for example, is deposited entirely across the n-channel region 103 and the p-channel region 104, as a second gate electrode material film 111 for controlling the threshold of the transistor in the p-channel region 104.

The thickness of the first gate electrode material film 107 to be the overetch absorbing layer described above is predetermined so that the etching of the first gate electrode material film 107 and the etching of the second gate electrode material film 111 complete substantially simultaneously, based on the thickness of the second gate electrode material film 111 for controlling the threshold of the transistor in the p-channel region 104 and the etching rate ratio between the gate electrode material films in the gate process.

The specific thickness of the first gate electrode material film 107 to be the overetch absorbing layer is determined based on Expressions 1 to 3 below.

TIME1=*TH*1/ER1   Expression 1

TIME2=*TH*2/ER2   Expression 2

TIME2×1.2>TIME1>TIME2×0.8   Expression 3

Herein, TIME1 denotes the amount of time required for completing the etching of the first gate electrode material film 107, TIME2 denotes the amount of time required for completing the etching of the second gate electrode material film 111, TH1 denotes the thickness of the first gate electrode material film 107, TH2 denotes the thickness of the second gate electrode material film 111, ER1 denotes the etching rate of the first gate electrode material film 107 in the gate process, and ER2 denotes the etching rate of the second gate electrode material film 111 in the gate process.

According to Expressions 1 to 3 above, where the thickness of the second gate electrode material film 111, i.e., the TiN film thickness (TH2), is 10 nm, the etching rate (ER2) of TiN is 30 nm/min, and the etching rate of the first gate electrode material film 107, i.e., the etching rate (ER1) of polysilicon is 35 nm/min, TIME2 is 20 sec. Therefore, TIME1 can be set to 16 to 24 sec. Therefore, the thickness (TH1) of the first gate electrode material film 107 can be set to 9.3 to 14 nm. If the thickness (TH1) of the first gate electrode material 107 is set to 11.7 nm, TIME1=TIME2 holds, whereby the etching of the first gate electrode material film 107 and the etching of the second gate electrode material film 111 complete simultaneously. Thus, the amount of overetch of the gate insulating film 105 can be equalized between the n-channel region 103 and the p-channel region 104.

Figure 2A:
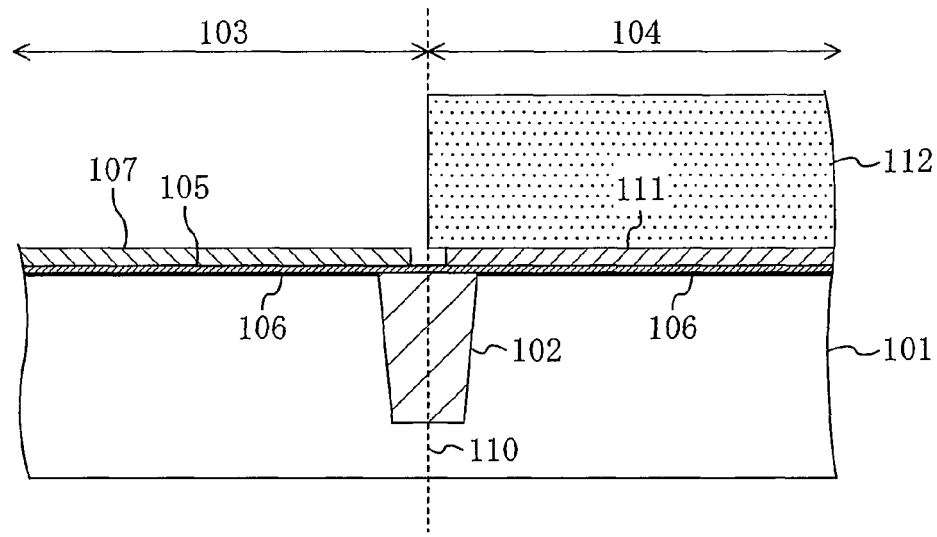
FIGS. 2A to 2C are cross-sectional views each showing a step in the method for manufacturing a semiconductor device according to the first embodiment of the present invention.

Then, as shown in FIG. 2A, a resist pattern 112 having an opening in the n-channel region 103 is formed on a second gate electrode film 111 deposited so as to cover the first gate electrode material film 107 in the n-channel region 103, and then the second gate electrode material film 111, i.e., the TiN film, is etched using the resist pattern 112 as a mask, to thereby remove a portion of the second gate electrode material film 111 that is located in the n-channel region 103. The TiN film being the second gate electrode material film 111 can be removed by, for example, a chemical such as an SPM solution, diluted hydrochloric acid or hydrogen peroxide or a chemical dry etching using a low-damage remote plasma. Alternatively, a dry etching by RIE, for example, may be used to selectively remove the second gate electrode material film 111 in the n-channel region 103, wherein the etching can be stopped at the surface of the first gate electrode material film 107. Where a dry etching by RIE is used, it is possible to reduce the amount by which the second gate electrode material film 111 in the p-channel region 104 recesses from the side surface of the resist pattern 112 in the np boundary 110. After etching the second gate electrode material film 111, the resist pattern 112 is removed by using an SPM solution or a thinner solution, for example.

Figure 2B:
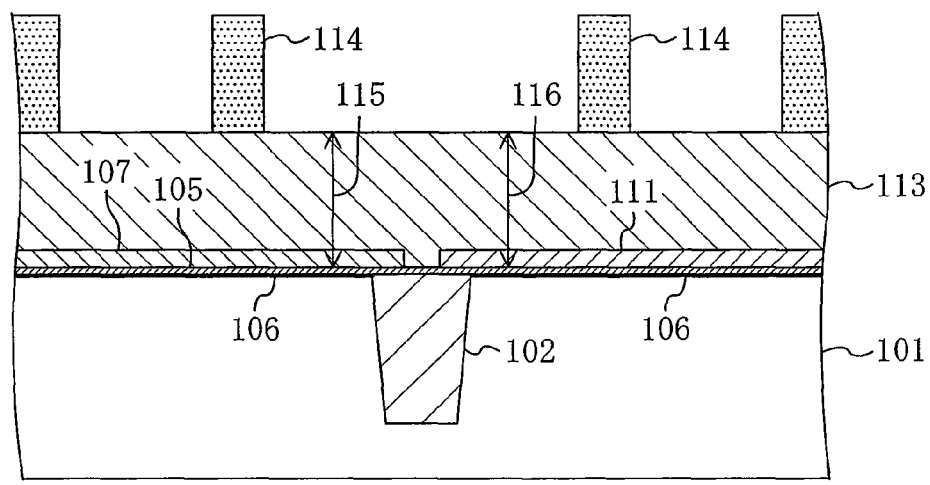

Then, as shown in FIG. 2B, a polysilicon film doped with P (phosphorus) and having a thickness of about 80 nm to 150 nm, for example, is deposited, as a third gate electrode material film 113, across the entire surface of the semiconductor substrate 101, and then a resist pattern 114 that covers the respective gate electrode formation regions of the n-channel region 103 and the p-channel region 104 is formed by photolithography on the third gate electrode material film 113. Due to the presence of the first gate electrode material film 107 to be an overetch absorbing layer, the difference between the n-channel gate electrode height 115 in the n-channel region 103 and the p-channel gate electrode height 116 in the p-channel region 104 is reduced, thus increasing the focus margin in the formation of the resist pattern 114, whereby it is possible to form a more minute pattern as the resist pattern 114.

Figure 2C:
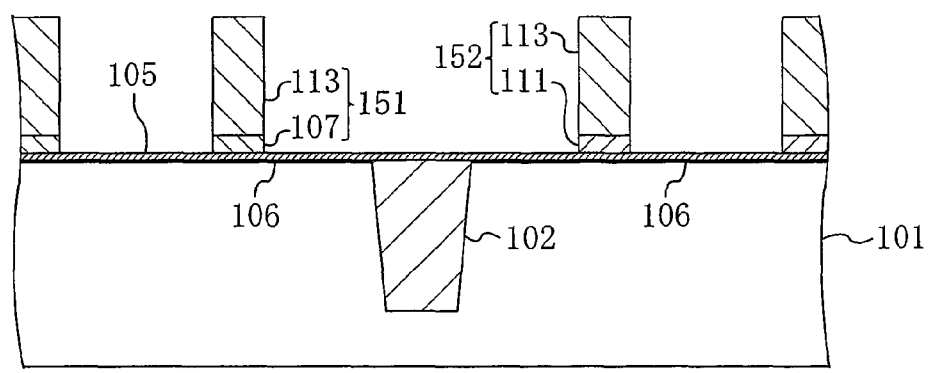

Then, a multi-layer film of the third gate electrode material film 113 and the first gate electrode material film 107 in the n-channel region 103 and a multi-layer film of the third gate electrode material film 113 and the second gate electrode material film 111 in the p-channel region 104 are subjected simultaneously to an anisotropic dry etching using a halogen-based etching gas, for example, using the resist pattern 114 as a mask, and then the resist pattern 114 is removed. Thus, as shown in FIG. 2C, a gate electrode 151 and a gate electrode 152 are formed in the n-channel region 103 and in the p-channel region 104, respectively, wherein the gate electrode 151 includes the first gate electrode material film (polysilicon film) 107 in contact with the gate insulating film and the third gate electrode material film (polysilicon film) 113 thereon, and the gate electrode 152 includes the second gate electrode material film (TiN film) 111 in contact with the gate insulating film and the third gate electrode material film (polysilicon film) 113 thereon. The etching of the third gate electrode material film 113, which is formed as a common component in the n-channel region 103 and the p-channel region 104, completes simultaneously in the n-channel region 103 and in the p-channel region 104. Following the etching of the third gate electrode material film 113, the first gate electrode material film 107 in the n-channel region 103 and the second gate electrode material film 111 in the p-channel region 104 are etched simultaneously. As described above, the thickness of the first gate electrode material film 107 to be an overetch absorbing layer is predetermined based on the thickness of the second gate electrode material 111 for controlling the threshold of the transistor in the p-channel region 104 and the etching rate ratio between the gate electrode material films in the gate process so that the etching of the first gate electrode material film 107 and the etching of the second gate electrode material film 111 complete substantially simultaneously. Therefore, the etching of the first gate electrode material film 107 and the etching of the second gate electrode material film 111 complete simultaneously in the n-channel region 103 and the p-channel region 104, respectively. Thus, the amount of overetch of the gate insulating film 105 can be equalized between the n-channel region 103 and the p-channel region 104, thereby preventing an excessive overetch of the gate insulating film 105. Therefore, the penetration of the gate insulating film 105 and the entailing problems such as the chipping of the semiconductor substrate 101 do not occur.

Figure 3A:
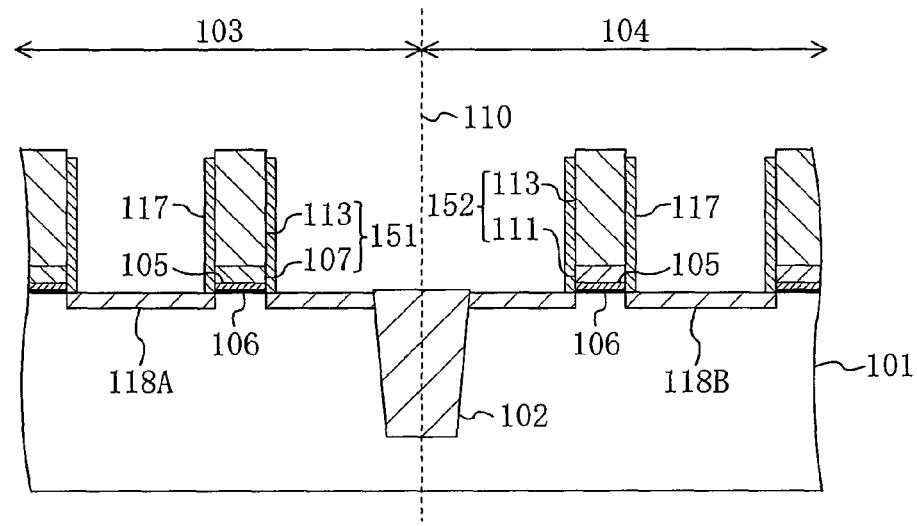
FIGS. 3A to 3C are cross-sectional views each showing a step in the method for manufacturing a semiconductor device according to the first embodiment of the present invention.

Then, as shown in FIG. 3A, an insulating film such as a TEOS (tetraethylorthosilicate) film or an SiN film is deposited to a thickness of about 5 to 20 nm by an LP-CVD (low pressure-chemical vapor deposition) method, for example, entirely across the n-channel region 103 and the p-channel region 104, and then the insulating film is etched back by an anisotropic dry etching to thereby form an offset spacer 117 on the side surface of the gate electrodes 151 and 152. Then, the n-channel region 103 and the p-channel region 104 are subjected to an ion implantation using the gate electrodes 151 and 152 and the offset spacer 117 as a mask to thereby form an extension doped layer 118A on both sides of the gate electrode 151 in the n-channel region 103, and an extension doped layer 118B on both sides of the gate electrode 152 in the p-channel region 104.

Figure 3B:
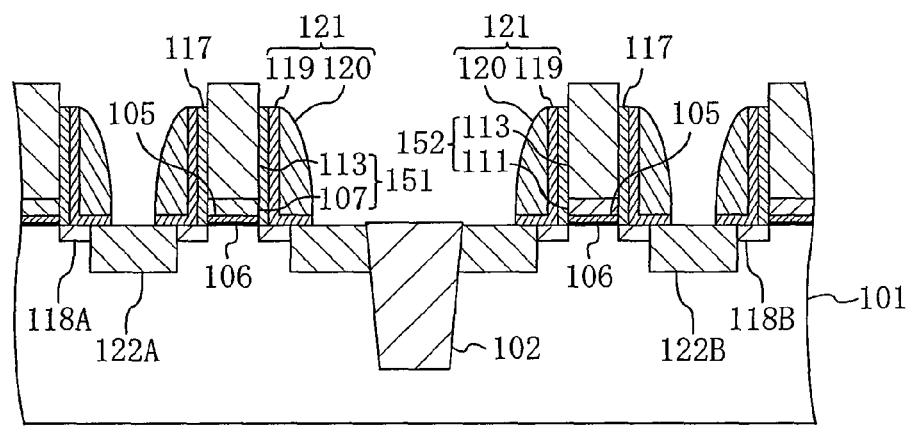

Then, as shown in FIG. 3B, an NSG (nondoped silicate glass) film is deposited to a thickness of about 5 to 10 nm entirely across the n-channel region 103 and the p-channel region 104 by an SA-CVD (sub atmospheric-chemical vapor deposition) method, for example, and then an SiN film is deposited to a thickness of about 20 to 40 nm by an ALD (atomic layer deposition) method, for example. Then, the multi-layer film of an NSG film and an SiN film is etched back by an anisotropic dry etching to thereby form a sidewall spacer 121 including a sidewall lower layer film 119 and a sidewall upper layer film 120 on the side surface of the gate electrodes 151 and 152 with the offset spacer 117 interposed therebetween. As the sidewall lower layer film 119, a TEOS film may be formed by an LP-CVD method, for example, instead of an NSG film. Then, ions of As (arsenic) and P (phosphorus) are implanted into the n-channel region 103, using the gate electrode 151, the offset spacer 117 and the sidewall spacer 121 as a mask, to thereby form a source/drain doped layer 122A on the outer side of the extension doped layer 118A in the n-channel region 103 as viewed from the gate electrode 151. Ions of B (boron) are implanted into the p-channel region 104, using the gate electrode 152, the offset spacer 117 and the sidewall spacer 121 as a mask, to thereby form a source/drain doped layer 122B on the outer side of the extension doped layer 118B in the p-channel region 104 as viewed from the gate electrode 152. Then, an activation heat treatment is performed so as to activate impurities, which have been introduced into the semiconductor substrate 101 through the ion implantation process.

Figure 3C:
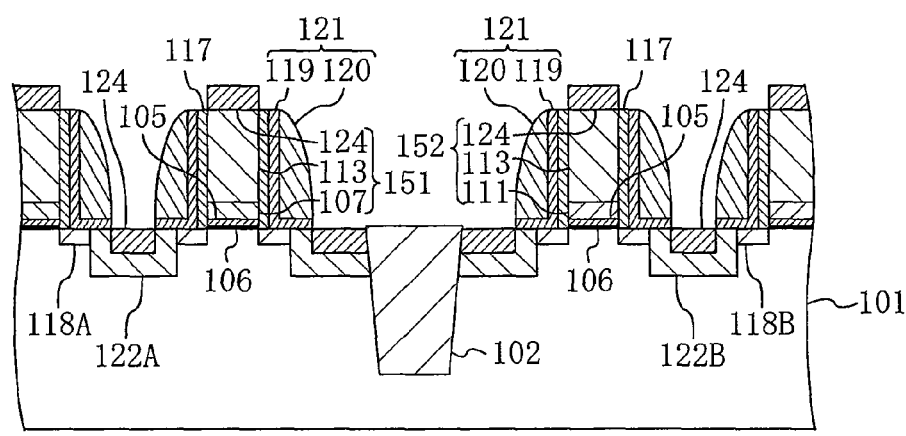

Then, an Ni film, for example, is deposited as a refractory metal film by a sputtering method, or the like, entirely across the n-channel region 103 and the p-channel region 104, and a silicidation heat treatment is performed, after which the Ni film in the un-silicided area is removed by a wet etching, for example. Thus, as shown in FIG. 3C, an Ni silicide layer 124 is formed on the surface of the source/drain doped layers 122A and 122B and on the surface of the gate electrodes 151 and 152.

In the first embodiment as described above, the first gate electrode material film (polysilicon film) 107, which is to serve as an overetch absorbing layer when etching the second gate electrode material film (TiN film) 111, is formed in advance in the n-channel region 103, in which the second gate electrode material film (TiN film) 111 in contact with the gate insulating film 105 is not formed as a part of the gate electrode 151. Therefore, by setting the thickness of the first gate electrode material film (polysilicon film) 107, etc., so that the amount of overetch of the gate insulating film 105 when etching the second gate electrode material film (TiN film) 111 becomes substantially equal between the transistor regions, it is possible to reduce the non-uniformity in the amount of overetch of the gate insulating film 105 between the transistor regions. Thus, since the penetration of the gate insulating film 105 and the entailing problems such as the chipping of the substrate can be prevented, it is possible to avoid the risk of lowering the yield due to deterioration of the transistor characteristics, the increase in the particles, etc., whereby it is possible to provide a high-performance semiconductor device at a low cost.

In the first embodiment, the amount of overetch at the time of etching during the gate electrode process is substantially equal between the transistor regions, whereby gate dimension variations due to overetching can be equalized between the transistor regions. Therefore, it is possible to reduce the gate dimension variations between the transistors, i.e., the n-channel field effect transistor and the p-channel field effect transistor, whereby it is possible to provide a semiconductor device with stable transistor characteristics.

First Variation of First Embodiment

A semiconductor device according to a first variation of the first embodiment of the present invention, and a method for manufacturing the same will now be described with reference to the drawings.

FIGS. 4A to 4C and 5A to 5C are cross-sectional views each showing a step in a method for manufacturing a semiconductor device according to a first variation of the first embodiment of the present invention. In FIGS. 4A to 4C and 5A to 5C, like elements to those of the first embodiment shown in FIGS. 1A to 1C, 2A to 2C and 3A to 3C are denoted by like reference numerals and will not be further described below.

Figure 4A:
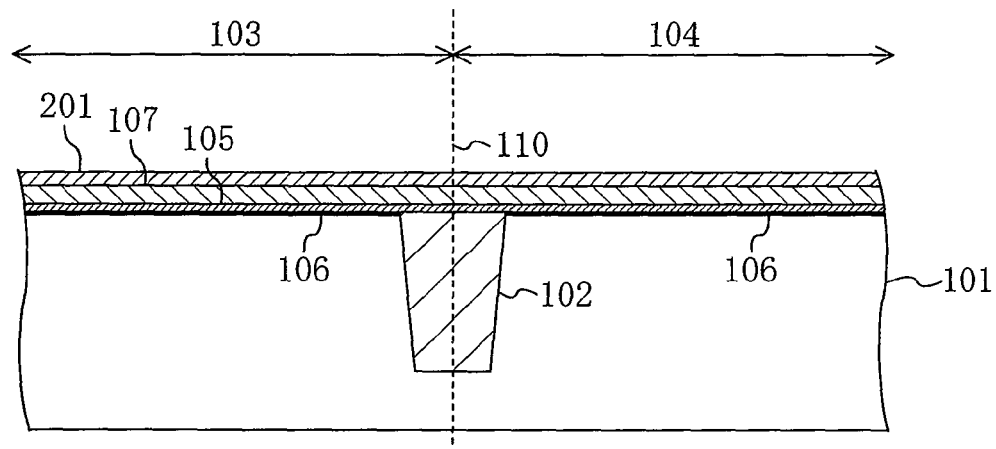
FIGS. 4A to 4C are cross-sectional views each showing a step in a method for manufacturing a semiconductor device according to a first variation of the first embodiment of the present invention.

First, as shown in FIG. 4A, an isolation region 102 such as an STI (shallow trench isolation), for example, is formed in a semiconductor substrate 101 to thereby separate an n-channel region 103 and a p-channel region 104 from each other, after which the n-channel region 103 and the p-channel region 104 are each subjected to a well-forming ion implantation. Then, the n-channel region 103 and the p-channel region 104 are each subjected to a threshold-adjusting ion implantation. Then, a process is performed to make a gate insulating film having an appropriate thickness and an appropriate film quality for each transistor function such as a logic transistor, an SRAM transistor and an input/output I/O transistor, for example. FIG. 4A shows a case where a gate insulating film 105 for a logic transistor, for example, is formed in each of the n-channel region 103 and the p-channel region 104. Specifically, the gate insulating film 105 is a high dielectric constant film whose relative dielectric constant is sufficiently higher than that of a silicon oxide film, e.g., a hafnium silicon oxide film (an $HfSi_xO_y$ film), formed on the surface of the semiconductor substrate 101. The EOT of the $HfSi_xO_y$ film is about 2.0 nm. At the interface between the gate insulating film 105 and the semiconductor substrate 101, the semiconductor substrate 101 is oxidized to thereby form an ultra thin silicon oxide film whose thickness is about 1 nm, for example, as an interface layer 106.

Then, as shown in FIG. 4A, a polysilicon film doped with P (phosphorus) and having a thickness of about 5 to 20 nm, for example, is deposited directly above the gate insulating film 105 as a first gate electrode material film 107 for controlling the threshold of the transistor in the n-channel region 103. The first gate electrode material film 107 serves as an overetch absorbing layer, and the thickness thereof, etc., are set so that the amount of overetch to the gate insulating film 105 is substantially equal between the n-channel region 103 and the p-channel region 104 at the time of dry etching during the gate electrode process to be performed in a subsequent step.

Then, as shown in FIG. 4A, a first etching cover film 201 of HDP-NSG (high density plasma-nondoped silicate glass), for example, is formed on the first gate electrode material film 107.

Figure 4B:
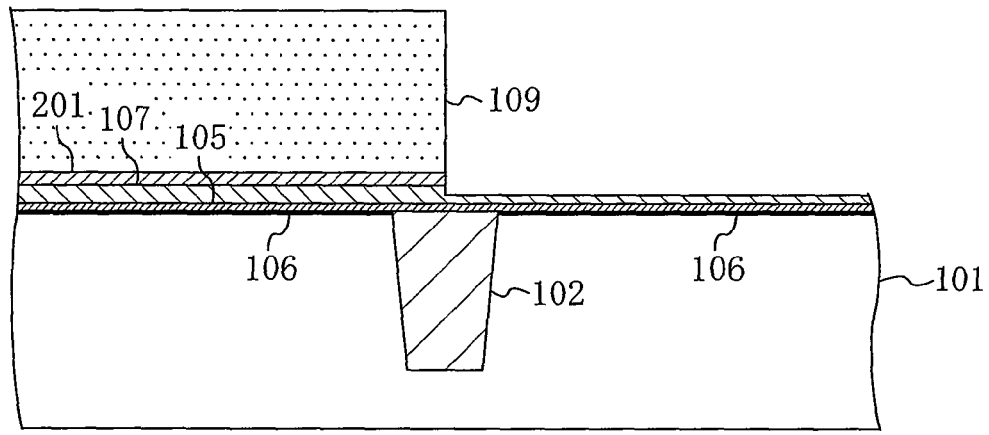

Then, as shown in FIG. 4B, a resist pattern 109 having an opening in the p-channel region 104 is formed on the first etching cover film 201, and an anisotropic dry etching is performed using the resist pattern 109 as a mask to thereby remove a portion of the first etching cover film 201 that is located in the p-channel region 104 while removing halfway a portion of the first gate electrode material film 107 that is located in the p-channel region 104. Then, the resist pattern 109 is removed.

Figure 4C:
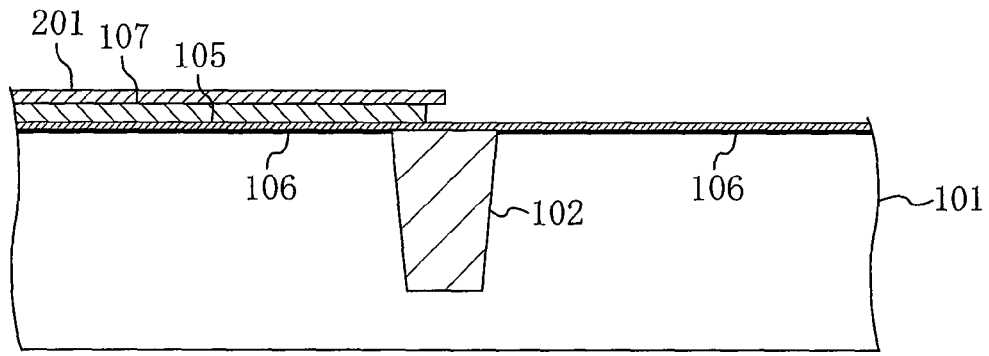

Then, as shown in FIG. 4C, the portion of the first gate electrode material film 107 remaining in the p-channel region 104 is removed by using the first etching cover film 201 covering the n-channel region 103 as a mask. A potassium hydroxide solution (KOH/H$_2$O=0.3 g/150 cc) heated to 65° C., for example, is used for the etching of the polysilicon film being the first gate electrode material film 107. Then, the etching can be done while preventing a damage such as thinning of the gate insulating film 105. Alternatively, the first gate electrode material film 107 can be removed by using, for example, a diluted APM solution (NH$_3$:H$_2$O$_2$:H$_2$O=3 to 10:1: 200 to 1000) heated to 80° C., or a chemical dry etching using a low-damage remote plasma.

In this variation, since the first gate electrode material film 107 is etched using the first etching cover film 201 as a mask, the substrate surface is not exposed to other chemicals, etc., after the etching, thus preventing damages, etc., to the surface of the gate insulating film 105.

Figure 5A:
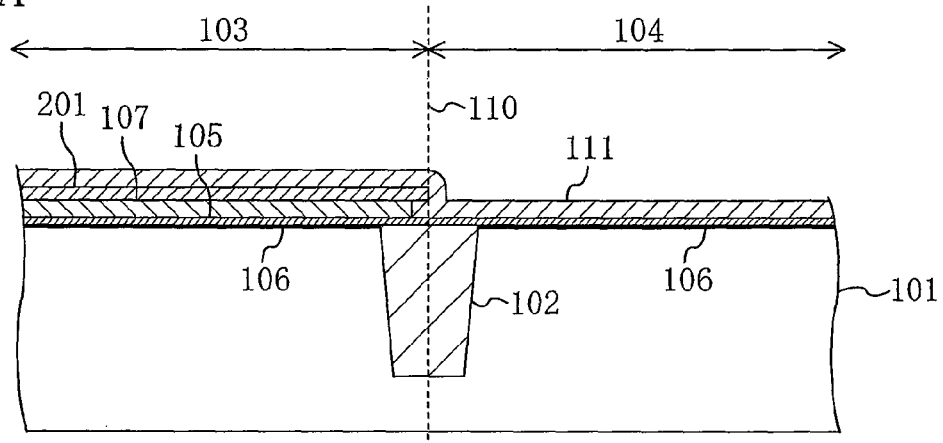
FIGS. 5A to 5C are cross-sectional views each showing a step in the method for manufacturing a semiconductor device according to the first variation of the first embodiment of the present invention.

Then, as shown in FIG. 5A, a TiN film having a thickness of about 5 to 20 nm, for example, is deposited entirely across the n-channel region 103 and the p-channel region 104, as a second gate electrode material film 111 for controlling the threshold of the transistor in the p-channel region 104.

The thickness of the first gate electrode material film 107 to be the overetch absorbing layer described above is predetermined so that the etching of the first gate electrode material film 107 and the etching of the second gate electrode material film 111 complete substantially simultaneously, based on the thickness of the second gate electrode material 111 for controlling the threshold of the transistor in the p-channel region 104 and the etching rate ratio between the gate electrode material films in the gate process. The specific thickness of the first gate electrode material film 107 to be the overetch absorbing layer is determined based on Expressions 1 to 3 above discussed in the first embodiment.

Figure 5B:
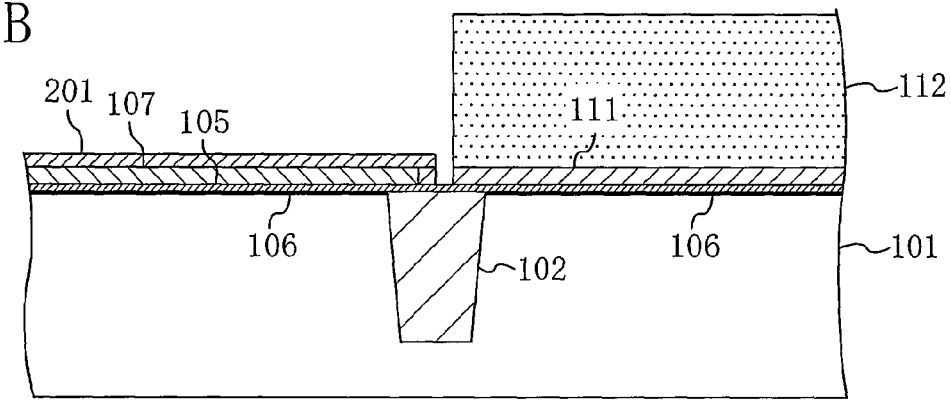

Then, as shown in FIG. 5B, a resist pattern 112 having an opening in the n-channel region 103 is formed on the second gate electrode film 111, and then the second gate electrode material film 111, i.e., the TiN film, is etched using the first etching cover film 201 in the n-channel region 103 and the resist pattern 112 as a mask, to thereby remove a portion of the second gate electrode material film 111 that is located in the n-channel region 103. The TiN film being the second gate electrode material film 111 can be removed by a dry etching by RIE, for example. Alternatively, a chemical such as an SPM solution, diluted hydrochloric acid or hydrogen peroxide or a chemical dry etching using a low-damage remote plasma, for example, may be used to remove the TiN film being the second gate electrode material film 111. After etching the second gate electrode material film 111, the resist pattern 112 is removed by using an SPM solution or a thinner solution, for example. Then, the HDP-NSG film being the first etching cover film 201 is removed by, for example, an anisotropic dry etching or a wet etching using an HF chemical (hydrogen fluoride), or the like.

In this variation, when etching the second gate electrode material film 111, the first etching cover film 201 serves as a stopper in the n-channel region 103, whereby the surface of the underlying first gate electrode material film 107 will not be etched.

Figure 5C:
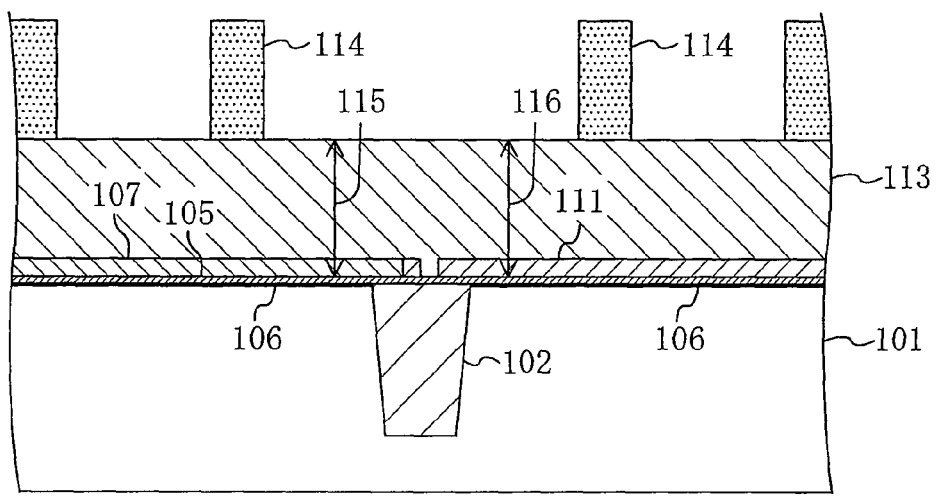

Then, as shown in FIG. 5C, a polysilicon film doped with P (phosphorus) and having a thickness of about 80 nm to 150 nm, for example, is deposited, as a third gate electrode material film 113, across the entire surface of the semiconductor substrate 101, and then a resist pattern 114 that covers the respective gate electrode formation regions of the n-channel region 103 and the p-channel region 104 is formed by photolithography on the third gate electrode material film 113. Due to the presence of the first gate electrode material film 107 to be an overetch absorbing layer, the difference between the n-channel gate electrode height 115 in the n-channel region 103 and the p-channel gate electrode height 116 in the p-channel region 104 is reduced, thus increasing the focus margin in the formation of the resist pattern 114, whereby it is possible to form a more minute pattern as the resist pattern 114.

Then, steps as shown in FIGS. 2C and 3A to 3C of the first embodiment are performed to thereby obtain a semiconductor device having a similar structure to that of the first embodiment.

In the first variation of the first embodiment as described above, the first gate electrode material film (polysilicon film) 107, which is to serve as an overetch absorbing layer when etching the second gate electrode material film (TiN film) 111, is formed in advance in the n-channel region 103, in which the second gate electrode material film (TiN film) 111 in contact with the gate insulating film 105 is not formed as a part of the gate electrode 151, as in the first embodiment. Therefore, by setting the thickness of the first gate electrode material film (polysilicon film) 107, etc., so that the amount of overetch of the gate insulating film 105 when etching the second gate electrode material film (TiN film) 111 becomes substantially equal between the transistor regions, it is possible to reduce the non-uniformity in the amount of overetch of the gate insulating film 105 between the transistor regions. Thus, since the penetration of the gate insulating film 105 and the entailing problems such as the chipping of the substrate can be prevented, it is possible to avoid the risk of lowering the yield due to deterioration of the transistor characteristics, the increase in the particles, etc., whereby it is possible to provide a high-performance semiconductor device at a low cost.

In the first variation of the first embodiment, since the amount of overetch at the time of etching during the gate electrode process is substantially equal between the transistor regions, the gate dimension variations due to overetching can be equalized between the transistor regions. Therefore, it is possible to reduce the gate dimension variations between the transistors, i.e., the n-channel field effect transistor and the p-channel field effect transistor, whereby it is possible to provide a semiconductor device with stable transistor characteristics.

In the first variation of the first embodiment, since the polysilicon film being the first gate electrode material 107 is etched using the first etching cover film 201 as a hard mask, the substrate surface is not exposed to other chemicals, etc., after the etching, thus preventing damages, etc., to the surface of the gate insulating film 105.

In the first variation of the first embodiment, since the first etching cover film 201 serves as an etching stopper when etching away the TiN film being the second gate electrode material film 111 formed in the n-channel region 103, the surface of the first gate electrode material film 107 under the first etching cover film 201 is not etched, whereby it is possible to prevent film thinning, or the like, from occurring in the n-channel region 103.

Second Variation of First Embodiment

A semiconductor device according to a second variation of the first embodiment of the present invention, and a method for manufacturing the same will now be described with reference to the drawings.

FIGS. 6A, 6B, 7A and 7B are cross-sectional views each showing a step in the method for manufacturing a semiconductor device according to the second variation of the first embodiment of the present invention. In FIGS. 6A, 6B, 7A and 7B, like elements to those of the first embodiment shown in FIGS. 1A to 1C, 2A to 2C and 3A to 3C or to those of the first variation of the first embodiment shown in FIGS. 4A to 4C and 5A to 5C are denoted by like reference numerals and will not be further described below.

First, in this variation, steps as shown in FIGS. 4A to 4C of the first variation of the first embodiment are performed.

Figure 6A:
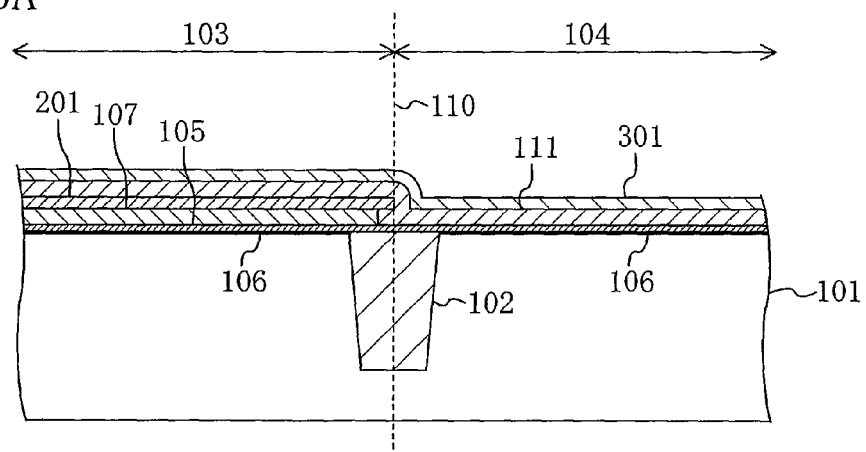
FIGS. 6A and 6B are cross-sectional views each showing a step in a method for manufacturing a semiconductor device according to a second variation of the first embodiment of the present invention.

Then, as shown in FIG. 6A, a TiN film having a thickness of about 5 to 20 nm, for example, is deposited entirely across the n-channel region 103 and the p-channel region 104, as a second gate electrode material film 111 for controlling the threshold of the transistor in the p-channel region 104.

The thickness of the first gate electrode material film 107 to be the overetch absorbing layer described above is predetermined so that the etching of the first gate electrode material film 107 and the etching of the second gate electrode material film 111 complete substantially simultaneously, based on the thickness of the second gate electrode material 111 for controlling the threshold of the transistor in the p-channel region 104 and the etching rate ratio between the gate electrode material films in the gate process. The specific thickness of the first gate electrode material film 107 to be the overetch absorbing layer is determined based on Expressions 1 to 3 above discussed in the first embodiment.

Then, as shown in FIG. 6A, a second etching cover film 301 of HDP-NSG, for example, is formed on the second gate electrode material film 111.

Figure 6B:
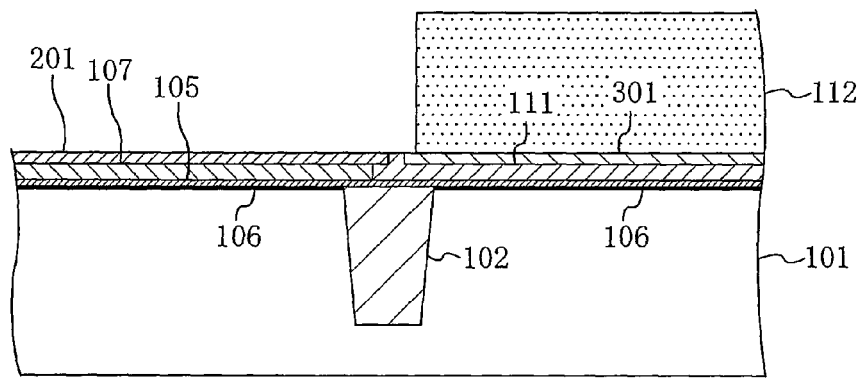

Then, as shown in FIG. 6B, a resist pattern 112 having an opening in the n-channel region 103 is formed on the second etching cover film 301, and then a portion of the second etching cover film 301 that is located in the n-channel region 103 and a portion of the second gate electrode material film 111, i.e., the TiN film, that is located in the n-channel region 103 are successively etched away. The HDP-NSG film being the second etching cover film 301 and the TiN film being the second gate electrode material film 111 can be removed by a dry etching by RIE, for example. Alternatively, after etching away the HDP-NSG film being the second etching cover film 301 by using an HF chemical (hydrogen fluoride), for example, a chemical such as an SPM solution, diluted hydrochloric acid or hydrogen peroxide or a chemical dry etching using a low-damage remote plasma, for example, may be used so as to remove the TiN film being the second gate electrode material film 111. After etching the second etching cover film 301 and the second gate electrode material film 111, the resist pattern 112 is removed by using, for example, an SPM solution, a thinner solution, or the like.

In this variation, when etching the second etching cover film 301 and the second gate electrode material film 111, the first etching cover film 201 serves as a stopper in the n-channel region 103, thereby preventing the surface of the underlying first gate electrode material film 107 from being etched.

Figure 7A:
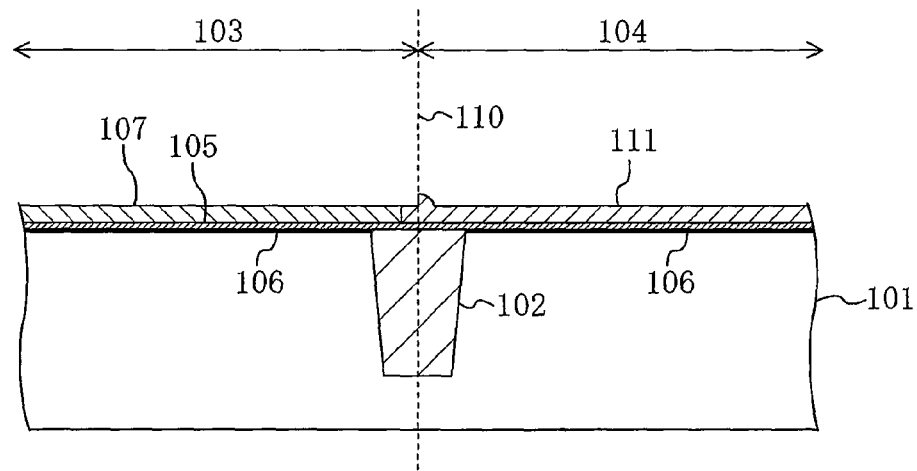
FIGS. 7A and 7B are cross-sectional views each showing a step in the method for manufacturing a semiconductor device according to the second variation of the first embodiment of the present invention.

Then, as shown in FIG. 7A, the HDP-NSG film being the first etching cover film 201 remaining in the n-channel region 103 and the HDP-NSG film being the second etching cover film 301 remaining in the p-channel region 104 are removed by, for example, an anisotropic dry etching or a wet etching using an HF chemical (hydrogen fluoride), or the like.

Figure 7B:
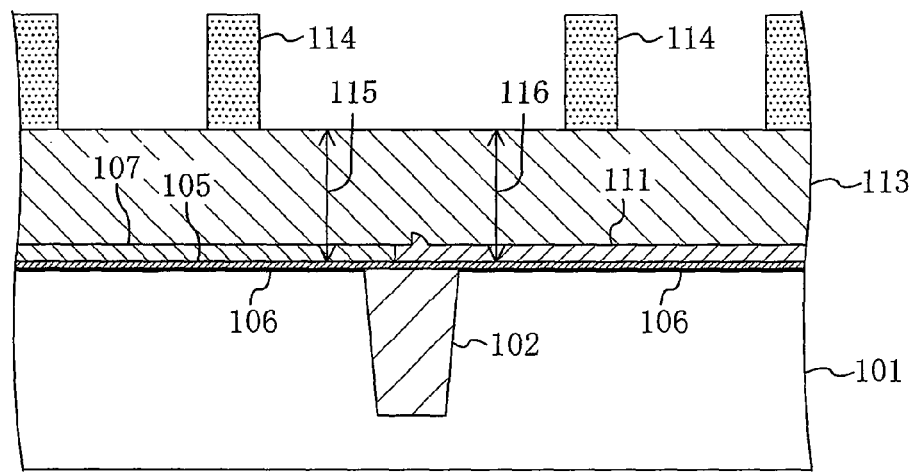

Then, as shown in FIG. 7B, a polysilicon film doped with P (phosphorus) and having a thickness of about 80 nm to 150 nm, for example, is deposited, as a third gate electrode material film 113, across the entire surface of the semiconductor substrate 101, and then a resist pattern 114 that covers the respective gate electrode formation regions of the n-channel region 103 and the p-channel region 104 is formed by photolithography on the third gate electrode material film 113. Due to the presence of the first gate electrode material film 107 to be an overetch absorbing layer, the difference between the n-channel gate electrode height 115 in the n-channel region 103 and the p-channel gate electrode height 116 in the p-channel region 104 is reduced, thus increasing the focus margin in the formation of the resist pattern 114, whereby it is possible to form a more minute pattern as the resist pattern 114.

Then, steps as shown in FIGS. 2C and 3A to 3C of the first embodiment are performed to thereby obtain a semiconductor device having a similar structure to that of the first embodiment.

In the second variation of the first embodiment as described above, the first gate electrode material film (polysilicon film) 107, which is to serve as an overetch absorbing layer when etching the second gate electrode material film (TiN film) 111, is formed in advance in the n-channel region 103, in which the second gate electrode material film (TiN film) 111 in contact with the gate insulating film 105 is not formed as a part of the gate electrode 151, as in the first embodiment. Therefore, by setting the thickness of the first gate electrode material film (polysilicon film) 107, etc., so that the amount of overetch of the gate insulating film 105 when etching the second gate electrode material film (TiN film) 111 becomes substantially equal between the transistor regions, it is possible to reduce the non-uniformity in the amount of overetch of the gate insulating film 105 between the transistor regions. Thus, since the penetration of the gate insulating film 105 and the entailing problems such as the chipping of the substrate can be prevented, it is possible to avoid the risk of lowering the yield due to deterioration of the transistor characteristics, the increase in the particles, etc., whereby it is possible to provide a high-performance semiconductor device at a low cost.

In the second variation of the first embodiment, since the amount of overetch at the time of etching during the gate electrode process is substantially equal between the transistor regions, the gate dimension variations due to overetching can be equalized between the transistor regions. Therefore, it is possible to reduce the gate dimension variations between the transistors, i.e., the n-channel field effect transistor and the p-channel field effect transistor, whereby it is possible to provide a semiconductor device with stable transistor characteristics.

In the second variation of the first embodiment, since the polysilicon film being the first gate electrode material film 107 is etched using the first etching cover film 201 as a hard mask, the substrate surface is not exposed to other chemicals, etc., after the etching, thus preventing damages, etc., to the surface of the gate insulating film 105.

In the second variation of the first embodiment, since the first etching cover film 201 serves as an etching stopper when etching away the TiN film being the second gate electrode material film 111 formed in the n-channel region 103, the surface of the first gate electrode material film 107 under the first etching cover film 201 is not etched, whereby it is possible to prevent film thinning, or the like, from occurring in the n-channel region 103.

In the second variation of the first embodiment, when patterning the resist pattern 112 on the second gate electrode material film 111, the second etching cover film 301 exists between the second gate electrode material film 111 and the resist pattern 112. Therefore, it is possible to prevent resist deactivation, or the like, from occurring due to the second gate electrode material film 111 being of a metal-containing material, resulting in resist trailing, such as when the resist pattern 112 is patterned directly on the second gate electrode material film 111.

Third Variation of First Embodiment

A semiconductor device according to a third variation of the first embodiment of the present invention, and a method for manufacturing the same will now be described with reference to the drawings.

FIGS. 26A to 26C, 27A to 27C and 28A to 28C are cross-sectional views each showing a step in the method for manufacturing a semiconductor device according to the third variation of the first embodiment of the present invention. In FIGS. 26A to 26C, 27A to 27C and 28A to 28C, like elements to those of the first embodiment shown in FIGS. 1A to 1C, 2A to 2C and 3A to 3C are denoted by like reference numerals and will not be further described below.

Figure 26A:
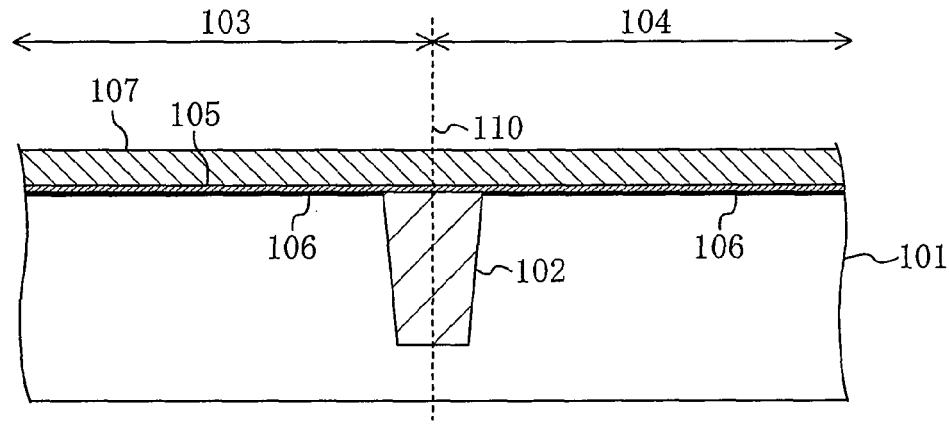
FIGS. 26A to 26C are cross-sectional views each showing a step in a method for manufacturing a semiconductor device according to a third variation of the first embodiment of the present invention.
Figure 26B:
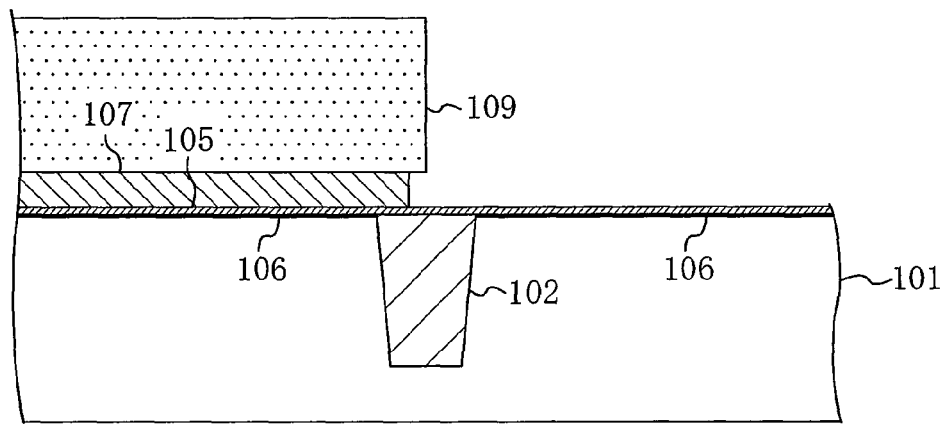
Figure 26C:
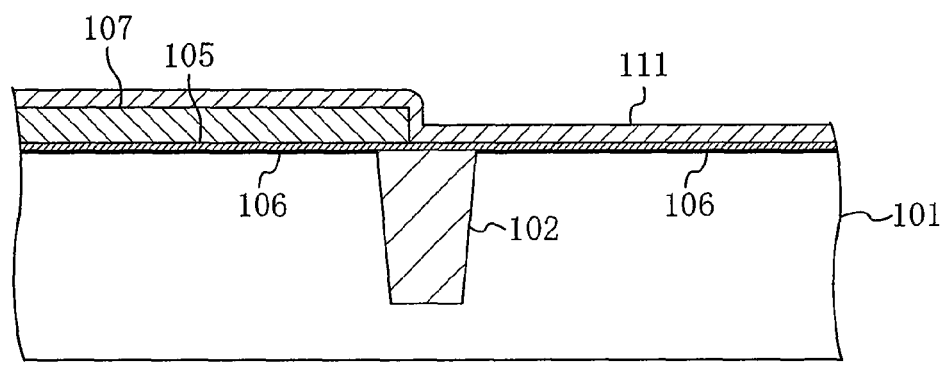
Figure 27A:
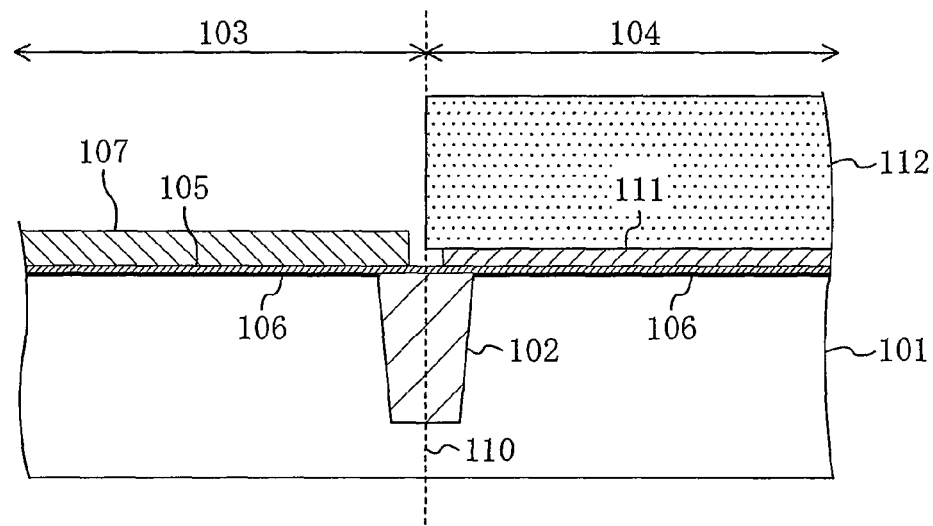
FIGS. 27A to 27C are cross-sectional views each showing a step in the method for manufacturing a semiconductor device according to the third variation of the first embodiment of the present invention.
Figure 27B:
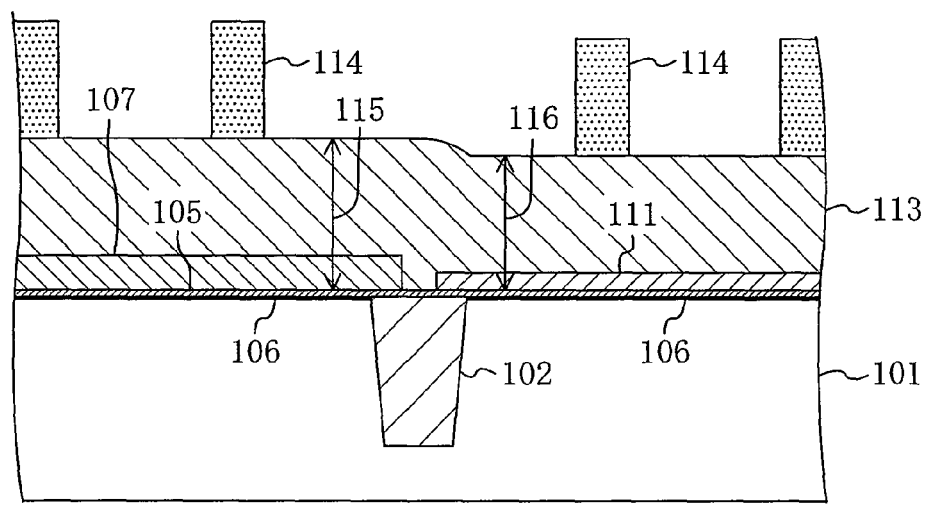
Figure 27C:
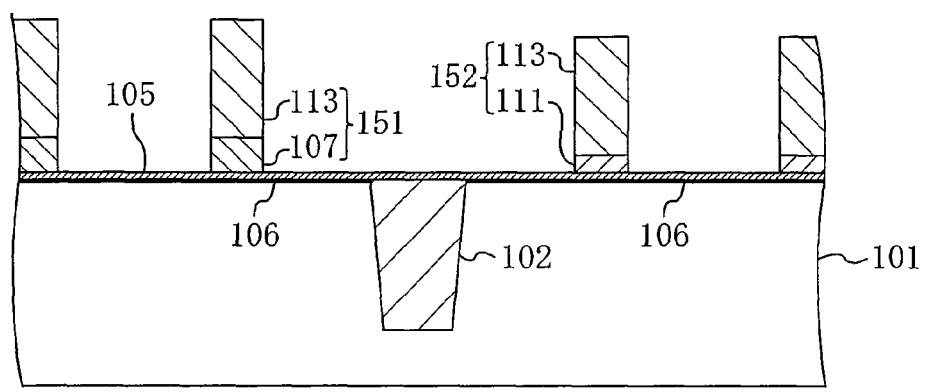
Figure 28A:
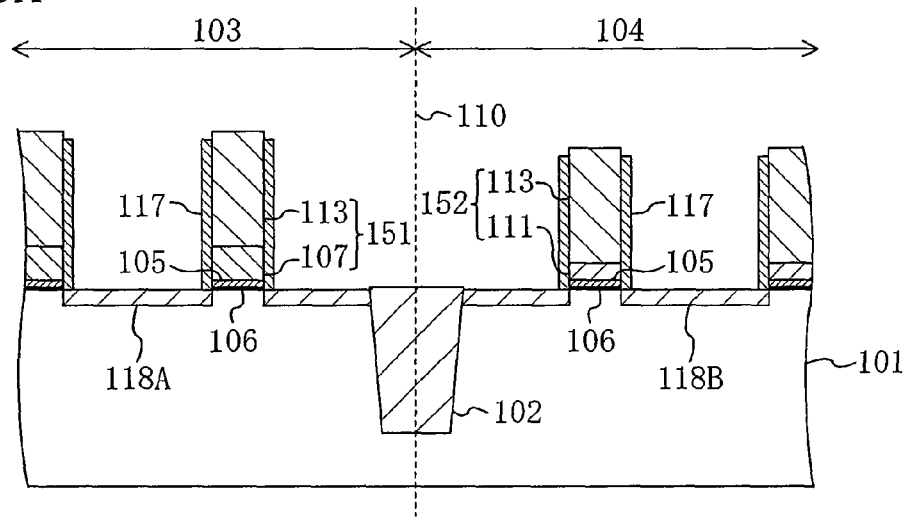
FIGS. 28A to 28C are cross-sectional views each showing a step in the method for manufacturing a semiconductor device according to the third variation of the first embodiment of the present invention.
Figure 28B:
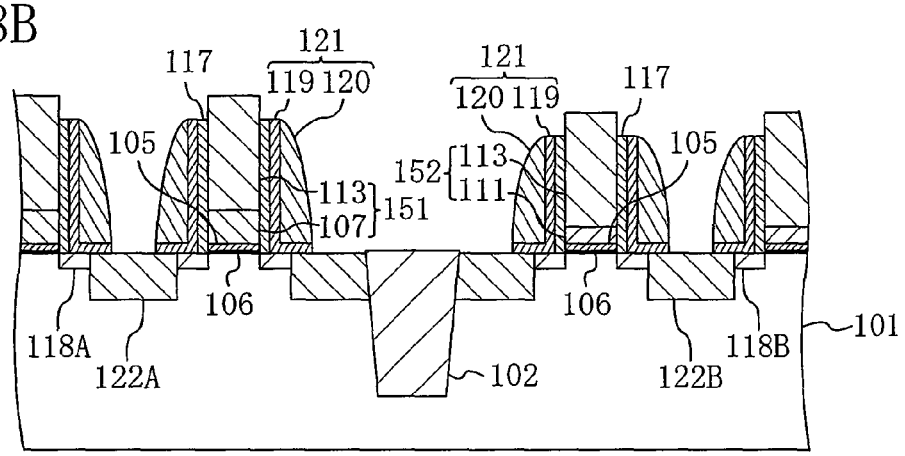
Figure 28C:
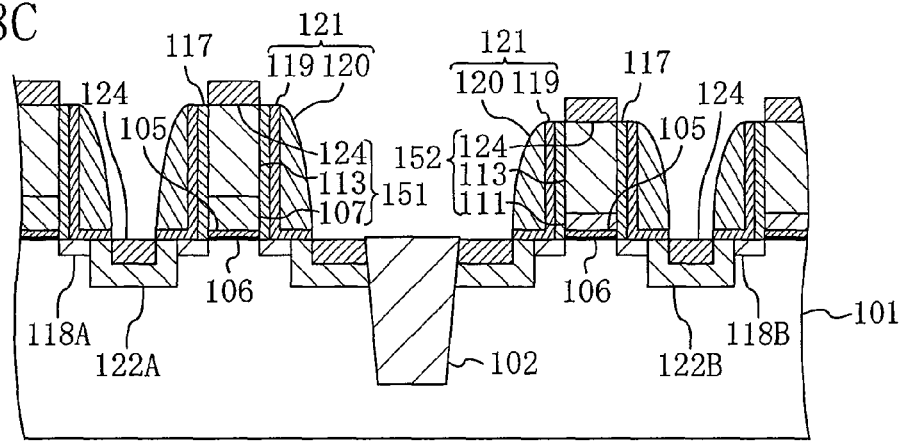

First, a step shown in FIG. 26A is performed, as shown in FIG. 1A of the first embodiment. This variation differs from the first embodiment in that the thickness of the polysilicon film deposited as the first gate electrode material film 107 is about 10 to 40 nm, which is larger, by about a factor of 2, than the thickness (about 5 to 20 nm) of the metal film to be deposited as the second gate electrode material film 111 in the step shown in FIG. 26C to be described later (corresponding to the step of FIG. 1C of the first embodiment). In this variation, the metal film may be, for example, a Ta-based metal film such as a TaN film or a TaCN film, or an oxygen-containing metal film such as a TiON film, a TiCNO film, a TaCO film or a TaCNO film.

Then, steps shown in FIGS. 26B, 26C, 27A to 27C and 28A to 28C are successively performed, as shown in FIGS. 1B, 1C, 2A to 2C and 3A to 3C of the first embodiment. The steps are equal to the corresponding steps of the first embodiment, except that the thickness of the first gate electrode material film 107 is larger than that in the first embodiment.

Also in the third variation of the first embodiment described above, it is possible to obtain effects similar to those of the first embodiment.

Where a Ta-based metal film or an oxygen-containing metal film as listed above is used as the second gate electrode material film 111, as in this variation, since the bond dissociation energy between constituent elements of such a metal film is greater than that required for dissociating a silicon bond, the etching rate of such a metal film is smaller than that of a polysilicon film. Therefore, it is particularly effective in realizing the effects of the present invention to make the thickness of the polysilicon film deposited as the first gate electrode material film 107 larger than the thickness of the metal film deposited as the second gate electrode material film 111, as in this variation.

Second Embodiment

A semiconductor device according to a second embodiment of the present invention, and a method for manufacturing the same will now be described with reference to the drawings.

FIGS. 8A to 8C, 9A to 9C, 10A to 10C and 11A to 11C are cross-sectional views each showing a step in the method for manufacturing a semiconductor device according to the second embodiment of the present invention. In FIGS. 8A to 8C, 9A to 9C, 10A to 10C and 11A to 11C, like elements to those of the first embodiment shown in FIGS. 1A to 1C, 2A to 2C and 3A to 3C are denoted by like reference numerals and will not be further described below.

Figure 8A:
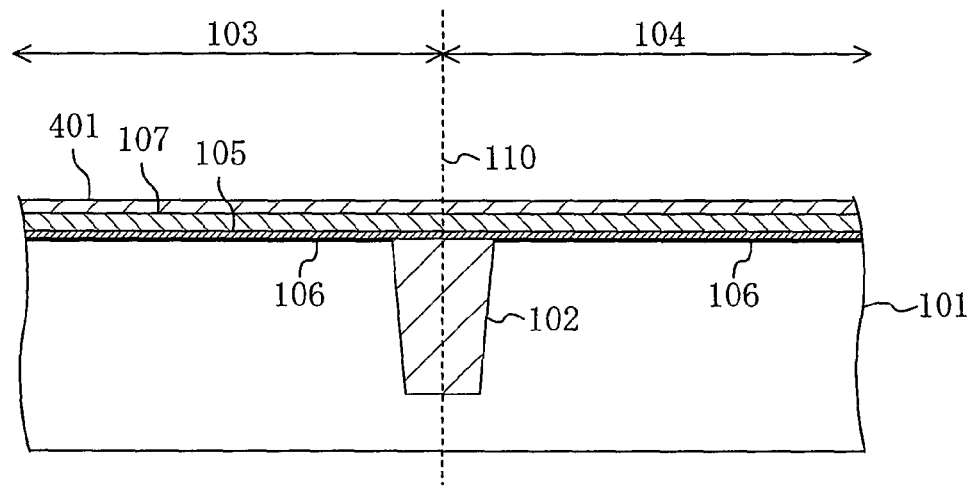
FIGS. 8A to 8C are cross-sectional views each showing a step in a method for manufacturing a semiconductor device according to a second embodiment of the present invention.

First, as shown in FIG. 8A, an isolation region 102 such as an STI, for example, is formed in a semiconductor substrate 101 to thereby separate an n-channel region 103 and a p-channel region 104 from each other, after which the n-channel region 103 and the p-channel region 104 are each subjected to a well-forming ion implantation. Then, the n-channel region 103 and the p-channel region 104 are each subjected to a threshold-adjusting ion implantation. Then, a process is performed to make a gate insulating film having an appropriate thickness and an appropriate film quality for each transistor function such as a logic transistor, an SRAM transistor and an input/output I/O transistor, for example. FIG. 8A shows a case where a gate insulating film 105 for a logic transistor, for example, is formed in each of the n-channel region 103 and the p-channel region 104. Specifically, the gate insulating film 105 is a high dielectric constant film whose relative dielectric constant is sufficiently higher than that of a silicon oxide film, e.g., a hafnium silicon oxide film (an $HfSi_xO_y$ film), formed on the surface of the semiconductor substrate 101. The EOT of the $HfSi_xO_y$ film is about 2.0 nm. At the interface between the gate insulating film 105 and the semiconductor substrate 101, the semiconductor substrate 101 is oxidized to thereby form an ultra thin silicon oxide film whose thickness is about 1 nm, for example, as an interface layer 106.

Then, as shown in FIG. 8A, a polysilicon film doped with P (phosphorus) and having a thickness of about 5 to 20 nm, for example, is deposited directly above the gate insulating film 105 as a first gate electrode material film 107 for controlling the threshold of the transistor in the n-channel region 103. The first gate electrode material film 107 serves as an overetch absorbing layer, and the thickness thereof, etc., are set so that the amount of overetch to the gate insulating film 105 is substantially equal between the n-channel region 103 and the p-channel region 104 at the time of dry etching during the gate electrode process to be performed in a subsequent step.

Then, as shown in FIG. 8A, a first etching stopper film 401 of an Ru (ruthenium) oxide, an Ir (iridium) oxide, or the like, being a conductive oxide is formed on the first gate electrode material film 107.

Figure 8B:
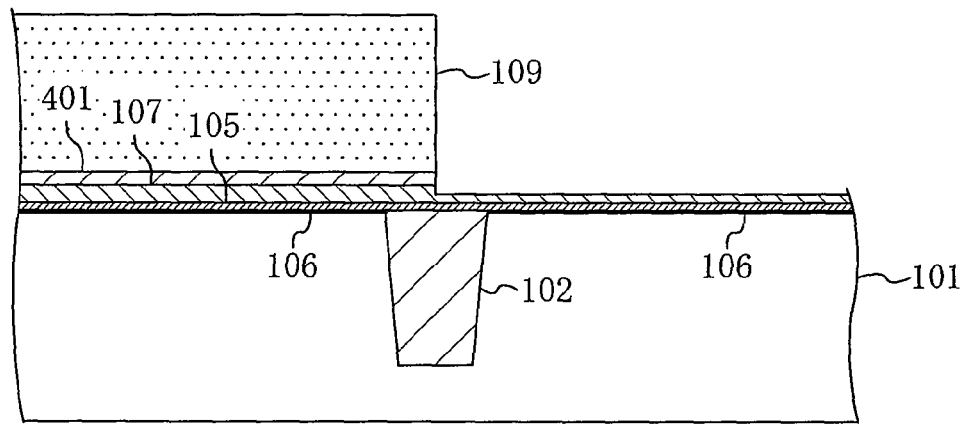

Then, as shown in FIG. 8B, a resist pattern 109 having an opening in the p-channel region 104 is formed on the first etching stopper film 401, and an anisotropic dry etching is performed using the resist pattern 109 as a mask to thereby remove a portion of the first etching stopper film 401 that is located in the p-channel region 104 while removing halfway a portion of the first gate electrode material film 107 that is located in the p-channel region 104. Then, the resist pattern 109 is removed.

Figure 8C:
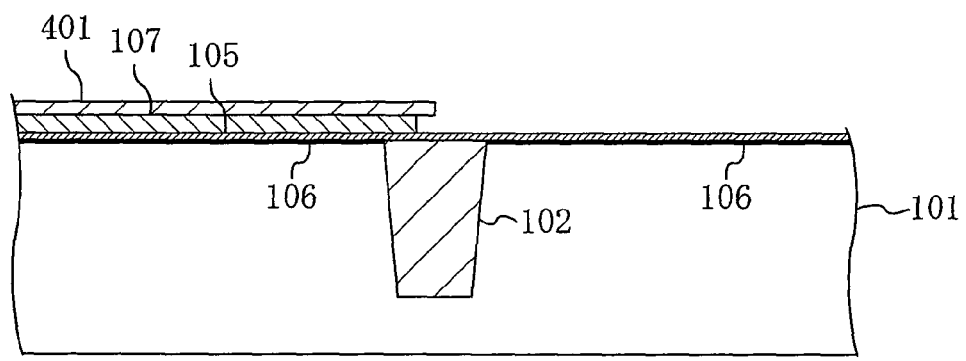

Then, as shown in FIG. 8C, the portion of the first gate electrode material film 107 remaining in the p-channel region 104 is removed by using the first etching stopper film 401 covering the n-channel region 103 as a mask. A potassium hydroxide solution ($KOH/H_2O$=0.3 g/150 cc) heated to 65° C., for example, is used for the etching of the polysilicon film being the first gate electrode material film 107. Then, the etching can be done while preventing a damage such as thinning of the gate insulating film 105. Alternatively, the first gate electrode material film 107 can be removed by using, for example, a diluted APM solution ($NH_3:H_2O_2:H_2O$=3 to 10:1: 200 to 1000) heated to 80° C., or a chemical dry etching using a low-damage remote plasma.

In the present embodiment, since the first gate electrode material film 107 is etched using the first etching stopper film 401 as a mask, the substrate surface is not exposed to other chemicals, etc., after the etching, thus preventing damages, etc., to the surface of the gate insulating film 105.

Figure 9A:
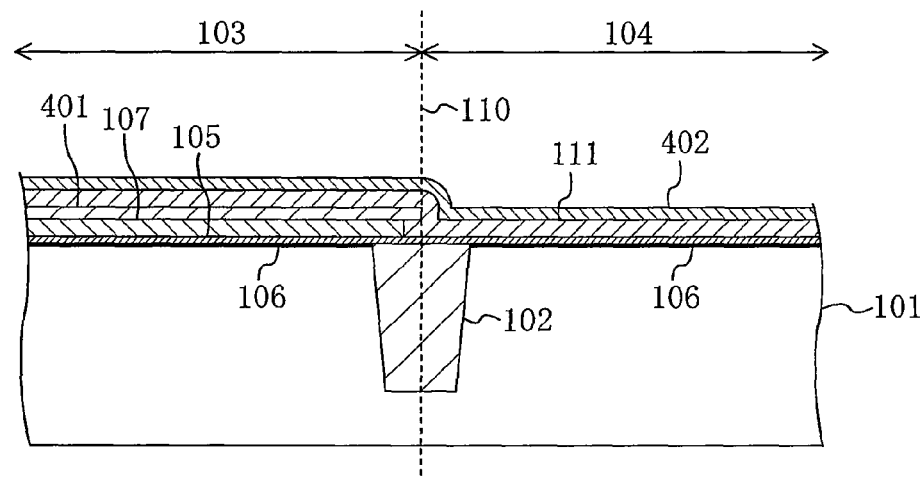
FIGS. 9A to 9C are cross-sectional views each showing a step in the method for manufacturing a semiconductor device according to the second embodiment of the present invention.

Then, as shown in FIG. 9A, a TiN film having a thickness of about 5 to 20 nm, for example, is deposited entirely across the n-channel region 103 and the p-channel region 104, as a second gate electrode material film 111 for controlling the threshold of the transistor in the p-channel region 104.

The thickness of the first gate electrode material film 107 to be the overetch absorbing layer described above is predetermined so that the etching of the first gate electrode material film 107 and the etching of the second gate electrode material film 111 complete substantially simultaneously, based on the thickness of the second gate electrode material 111 for controlling the threshold of the transistor in the p-channel region 104 and the etching rate ratio between the gate electrode material films in the gate process. The specific thickness of the first gate electrode material film 107 to be the overetch absorbing layer is determined based on Expressions 1 to 3 above discussed in the first embodiment.

Then, as shown in FIG. 9A, a second etching stopper film 402 of an Ru (ruthenium) oxide, an Ir (iridium) oxide, or the like, being a conductive oxide is formed on the second gate electrode material 111.

Figure 9B:
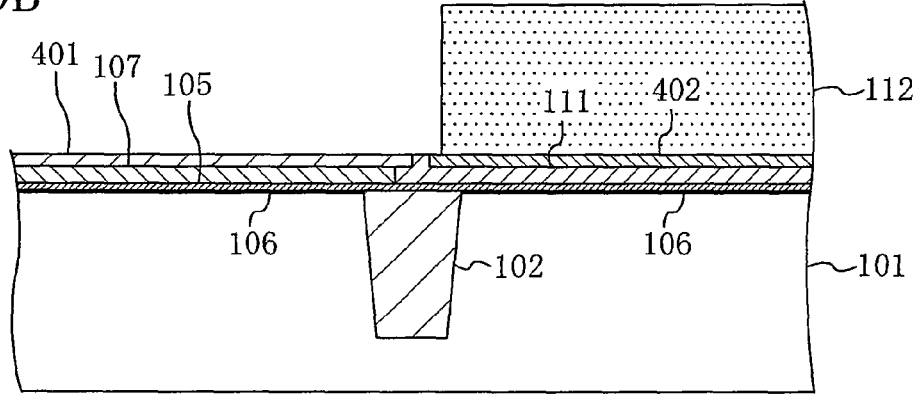

Then, as shown in FIG. 9B, a resist pattern 112 having an opening in the n-channel region 103 is formed on the second etching stopper film 402, and then a portion of the second etching stopper film 402 that is located in the n-channel region 103 and a portion of the second gate electrode material film 111, i.e., the TiN film, that is located in the n-channel region 103 are successively etched away. The conductive oxide film being the second etching stopper film 402 and the TiN film being the second gate electrode material film 111 can be removed by a dry etching by RIE, for example. Alternatively, after etching away the conductive oxide film being the second etching stopper film 402 by using an HF chemical (hydrogen fluoride), for example, a chemical such as an SPM solution, diluted hydrochloric acid or hydrogen peroxide or a chemical dry etching using a low-damage remote plasma, for example, may be used so as to remove the TiN film being the second gate electrode material film 111. After etching the second etching stopper film 402 and the second gate electrode material film 111, the resist pattern 112 is removed by using, for example, an SPM solution, a thinner solution, or the like.

In the present embodiment, when etching the second etching stopper film 402 and the second gate electrode material film 111, the first etching stopper film 401 serves as a stopper in the n-channel region 103, thereby preventing the surface of the underlying first gate electrode material film 107 from being etched.

Figure 9C:
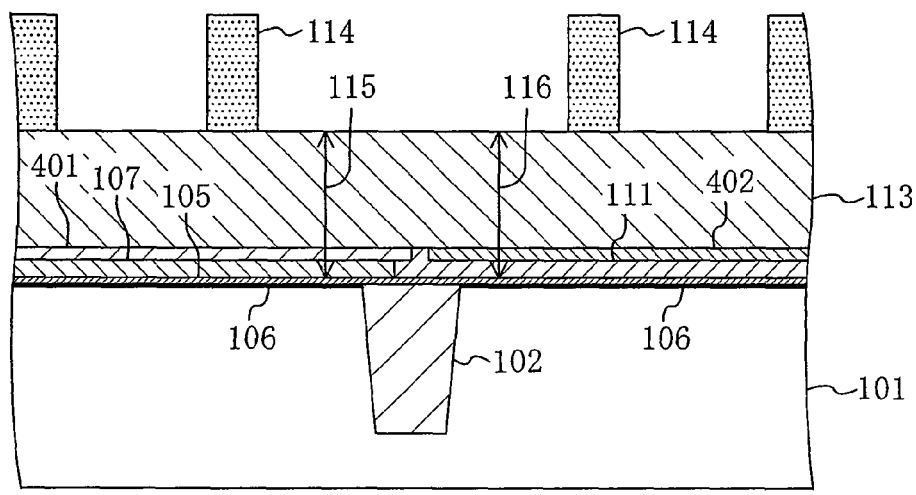

Then, as shown in FIG. 9C, a polysilicon film doped with P (phosphorus) and having a thickness of about 80 nm to 150 nm, for example, is deposited, as a third gate electrode material film 113, across the entire surface of the semiconductor substrate 101, i.e., on the first etching stopper film 401 in the n-channel region 103 and on the second etching stopper film 402 in the p-channel region 104, and then a resist pattern 114 that covers the respective gate electrode formation regions of the n-channel region 103 and the p-channel region 104 is formed by photolithography on the third gate electrode material film 113. Due to the presence of the first gate electrode material film 107 to be an overetch absorbing layer, the difference between the n-channel gate electrode height 115 in the n-channel region 103 and the p-channel gate electrode height 116 in the p-channel region 104 is reduced, thus increasing the focus margin in the formation of the resist pattern 114, whereby it is possible to form a more minute pattern as the resist pattern 114.

Figure 10A:
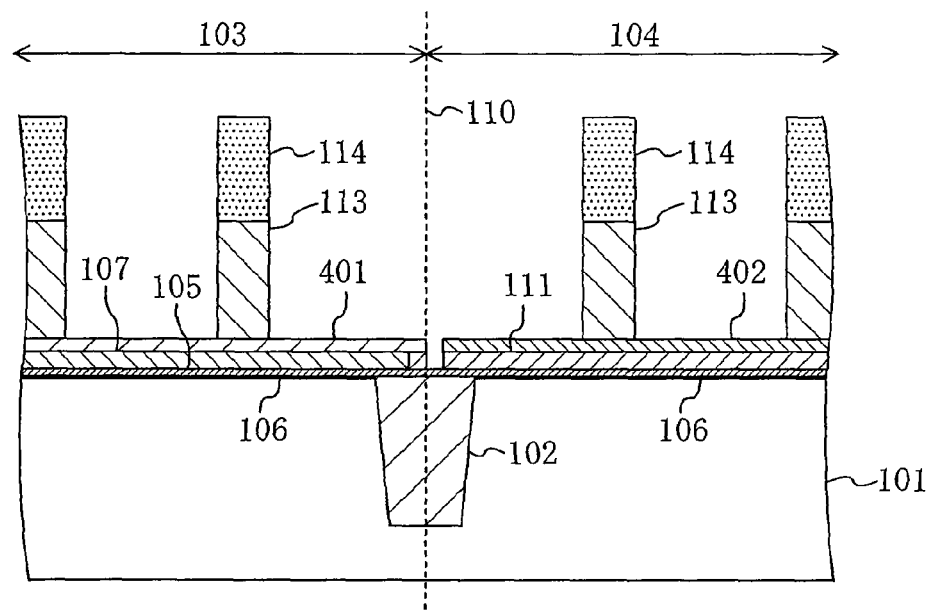
FIGS. 10A to 10C are cross-sectional views each showing a step in the method for manufacturing a semiconductor device according to the second embodiment of the present invention.

Then, as shown in FIG. 10A, the third gate electrode material film 113 is subjected to an anisotropic dry etching using a halogen-based etching gas, for example, using the resist pattern 114 as a mask. The etching of the third gate electrode material film 113, which is formed as a common component in the n-channel region 103 and the p-channel region 104, completes simultaneously in the n-channel region 103 and in the p-channel region 104. The first etching stopper film 401 and the second etching stopper film 402 absorb the influence of variations in the thickness of the third gate electrode material film 113 (including thickness variations due to the step between the isolation region 102 and an active region adjacent thereto) so that the surface of the first etching stopper film 401 and the surface of the second etching stopper film 402 are exposed upon completion of the etching of the third gate electrode material film 113.

Figure 10B:
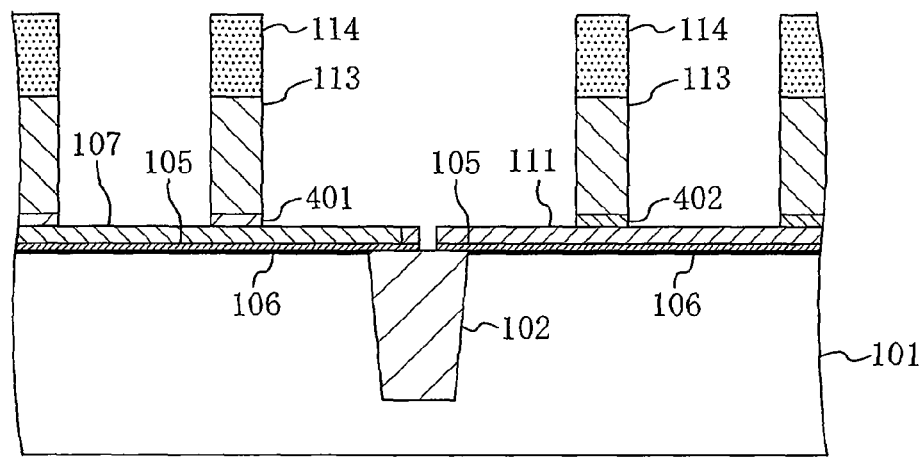

Then, as shown in FIG. 10B, the first etching stopper film 401 and the second etching stopper film 402 are subjected to an anisotropic dry etching using a fluorine-based etching gas such as a fluorocarbon gas, for example, using the resist pattern 114 as a mask. The first etching stopper film 401 and the second etching stopper film 402 are etched until the surface of the first gate electrode material film 107 and the surface of the second gate electrode material film 111 are exposed through the opening of the resist pattern 114. Since a high degree of etching selectivity is obtained between the first etching stopper film 401 being a conductive oxide film and the first gate electrode material film 107 being a polysilicon film and between the second etching stopper film 402 being a conductive oxide film and the second gate electrode material film 111 being a TiN film, the first etching stopper film 401 and the second etching stopper film 402 can be etched without substantially chipping the underlying first gate electrode material film 107 and the underlying second gate electrode material film 111.

Figure 10C:
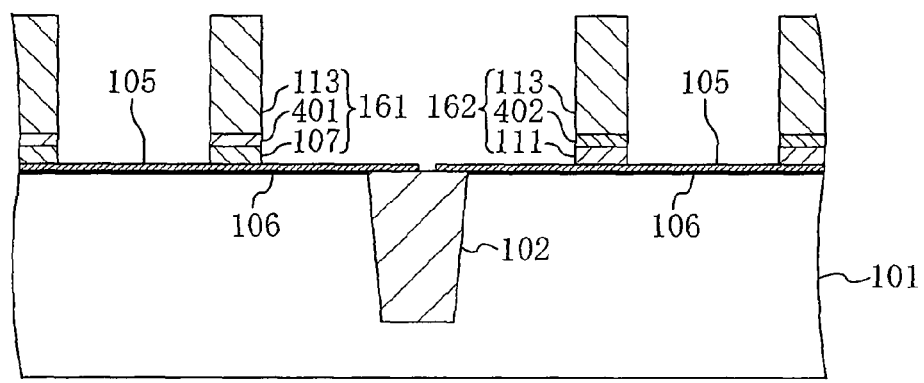

Then, the first gate electrode material film 107 in the n-channel region 103 and the second gate electrode material film 111 in the p-channel region 104 are simultaneously subjected to an anisotropic dry etching using a halogen-based etching gas, for example, using the resist pattern 114 as a mask, and then the resist pattern 114 is removed. Thus, as shown in FIG. 10C, a gate electrode 161 and a gate electrode 162 are formed in the n-channel region 103 and in the p-channel region 104, respectively, wherein the gate electrode 161 includes the first gate electrode material film (polysilicon film) 107 in contact with the gate insulating film, the first etching stopper film (conductive oxide film) 401 and the third gate electrode material film (polysilicon film) 113, and the gate electrode 162 includes the second gate electrode material film (TiN film) 111 in contact with the gate insulating film, the second etching stopper film (conductive oxide film) 402 and the third gate electrode material film (polysilicon film) 113. As described above, the thickness of the first gate electrode material film 107 to be an overetch absorbing layer is predetermined based on the thickness of the second gate electrode material 111 for controlling the threshold of the transistor in the p-channel region 104 and the etching rate ratio between the gate electrode material films in the gate process so that the etching of the first gate electrode material film 107 and the etching of the second gate electrode material film 111 complete substantially simultaneously. Therefore, the etching of the first gate electrode material film 107 and the etching of the second gate electrode material film 111 complete simultaneously in the n-channel region 103 and the p-channel region 104, respectively. Thus, the amount of overetch of the gate insulating film 105 can be equalized between the n-channel region 103 and the p-channel region 104, thereby preventing an excessive overetch of the gate insulating film 105. Therefore, the penetration of the gate insulating film 105 and the entailing problems such as the chipping of the semiconductor substrate 101 do not occur.

While the resist pattern 114 is removed after the formation of the gate electrodes 161 and 162 in the present embodiment, the resist pattern 114 may be removed after the completion of the etching of the third gate electrode material film 113 shown in FIG. 10A. In other words, the patterned third gate electrode material film 113 may be used as a mask in the etching of the first etching stopper film 401 and the second etching stopper film 402 shown in FIG. 10B, and in the etching of the first gate electrode material film 107 and the second gate electrode material film 111 shown in FIG. 10C.

Figure 11A:
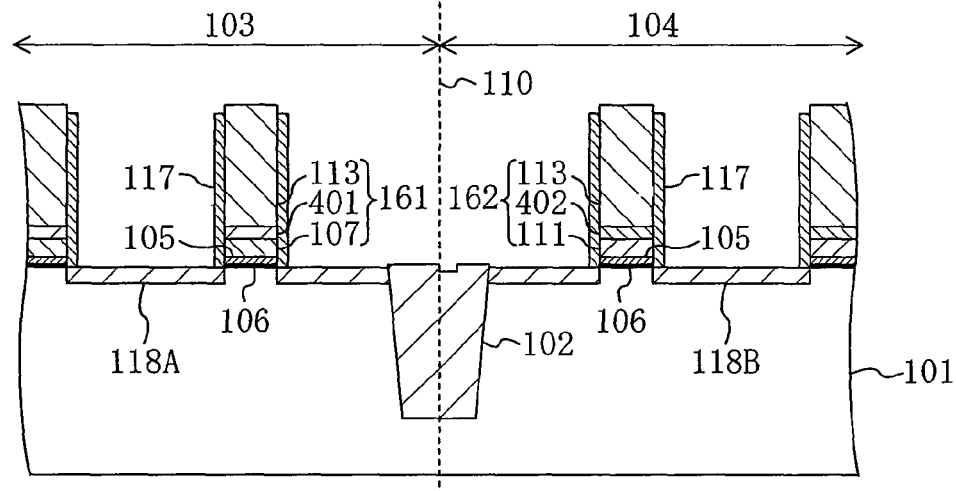
FIGS. 11A to 11C are cross-sectional views each showing a step in the method for manufacturing a semiconductor device according to the second embodiment of the present invention.

Then, as shown in FIG. 11A, an insulating film such as a TEOS film or an SiN film is deposited to a thickness of about 5 to 20 nm by an LP-CVD method, for example, entirely across the n-channel region 103 and the p-channel region 104, and then the insulating film is etched back by an anisotropic dry etching to thereby form an offset spacer 117 on the side surface of the gate electrodes 161 and 162. Then, the n-channel region 103 and the p-channel region 104 are subjected to an ion implantation using the gate electrodes 161 and 162 and the offset spacer 117 as a mask to thereby form an extension doped layer 118A on both sides of the gate electrode 161 in the n-channel region 103, and an extension doped layer 118B on both sides of the gate electrode 162 in the p-channel region 104.

Figure 11B:
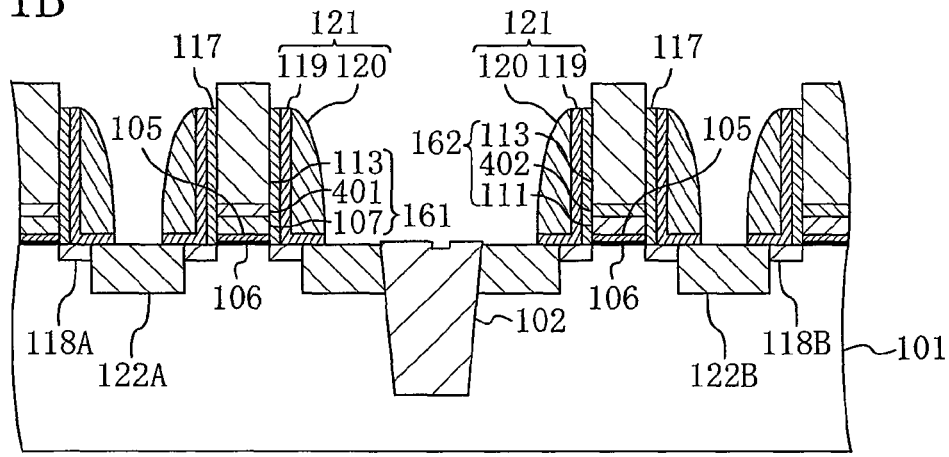

Then, as shown in FIG. 11B, an NSG film is deposited to a thickness of about 5 to 10 nm entirely across the n-channel region 103 and the p-channel region 104 by an SA-CVD method, for example, and then an SiN film is deposited to a thickness of about 20 to 40 nm by an ALD method, for example. Then, the multi-layer film of an NSG film and an SiN film is etched back by an anisotropic dry etching to thereby form a sidewall spacer 121 including a sidewall lower layer film 119 and a sidewall upper layer film 120 on the side surface of the gate electrodes 161 and 162 with the offset spacer 117 interposed therebetween. As the sidewall lower layer film 119, a TEOS film may be formed by an LP-CVD method, for example, instead of an NSG film. Then, ions of As (arsenic) and P (phosphorus) are implanted into the n-channel region 103, using the gate electrode 161, the offset spacer 117 and the sidewall spacer 121 as a mask, to thereby form a source/drain doped layer 122A on the outer side of the extension doped layer 118A in the n-channel region 103 as viewed from the gate electrode 161. Ions of B (boron) are implanted into the p-channel region 104, using the gate electrode 162, the offset spacer 117 and the sidewall spacer 121 as a mask, to thereby form a source/drain doped layer 122B on the outer side of the extension doped layer 118B in the p-channel region 104 as viewed from the gate electrode 162. Then, an activation heat treatment is performed so as to activate impurities, which have been introduced into the semiconductor substrate 101 through the ion implantation process.

Figure 11C:
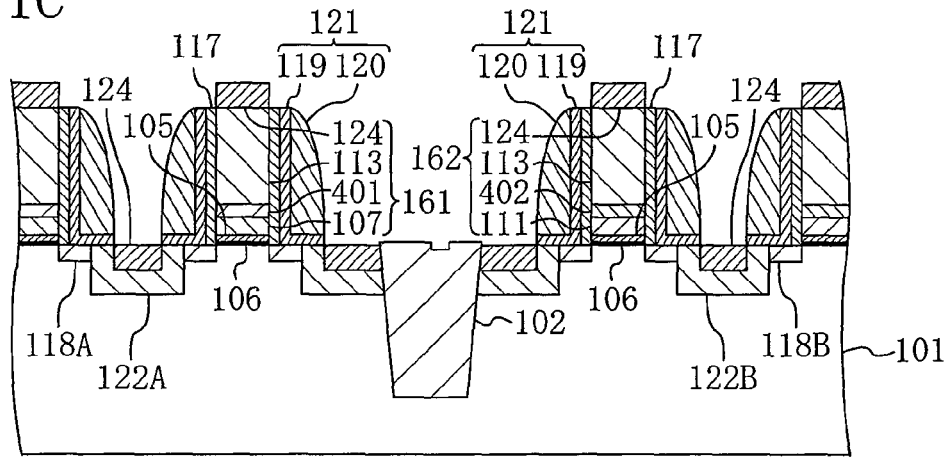

Then, an Ni film, for example, is deposited as a refractory metal film by a sputtering method, or the like, entirely across the n-channel region 103 and the p-channel region 104, and a silicidation heat treatment is performed, after which the Ni film in the un-silicided area is removed by a wet etching, for example. Thus, as shown in FIG. 11C, an Ni silicide layer 124 is formed on the surface of the source/drain doped layers 122A and 122B and on the surface of the gate electrodes 161 and 162.

In the second embodiment as described above, the first gate electrode material film (polysilicon film) 107, which is to serve as an overetch absorbing layer when etching the second gate electrode material film (TiN film) 111, is formed in advance in the n-channel region 103, in which the second gate electrode material film (TiN film) 111 in contact with the gate insulating film 105 is not formed as a part of the gate electrode 161. Therefore, by setting the thickness of the first gate electrode material film (polysilicon film) 107, etc., so that the amount of overetch of the gate insulating film 105 when etching the second gate electrode material film (TiN film) 111 becomes substantially equal between the transistor regions, it is possible to reduce the non-uniformity in the amount of overetch of the gate insulating film 105 between the transistor regions. With the provision of the first etching stopper film 401, which serves as an etching stopper when etching the third gate electrode material film (polysilicon film) 113 above the first gate electrode material film (polysilicon film) 107, it is possible to prevent film thinning, or the like, of the first gate electrode material film (polysilicon film) 107 whose thickness, etc., are set to predetermined values. Thus, since the penetration of the gate insulating film 105 and the entailing problems such as the chipping of the substrate can be prevented, it is possible to avoid the risk of lowering the yield due to deterioration of the transistor characteristics, the increase in the particles, etc., whereby it is possible to provide a high-performance semiconductor device at a low cost.

In the second embodiment, since the amount of overetch at the time of etching during the gate electrode process is substantially equal between the transistor regions, the gate dimension variations due to overetching can be equalized between the transistor regions. Therefore, it is possible to reduce the gate dimension variations between the transistors, i.e., the n-channel field effect transistor and the p-channel field effect transistor, whereby it is possible to provide a semiconductor device with stable transistor characteristics.

Third Embodiment

A semiconductor device according to a third embodiment of the present invention, and a method for manufacturing the same will now be described with reference to the drawings.

FIGS. 12A to 12C, 13A to 13C, 14A to 14C, 15A to 15C and 16A and 16B are cross-sectional views each showing a step in the method for manufacturing a semiconductor device according to the second embodiment of the present invention. In FIGS. 12A to 12C, 13A to 13C, 14A to 14C, 15A to 15C and 16A and 16B, like elements to those of the first embodiment shown in FIGS. 1A to 1C, 2A to 2C and 3A to 3C are denoted by like reference numerals and will not be further described below.

Figure 12A:
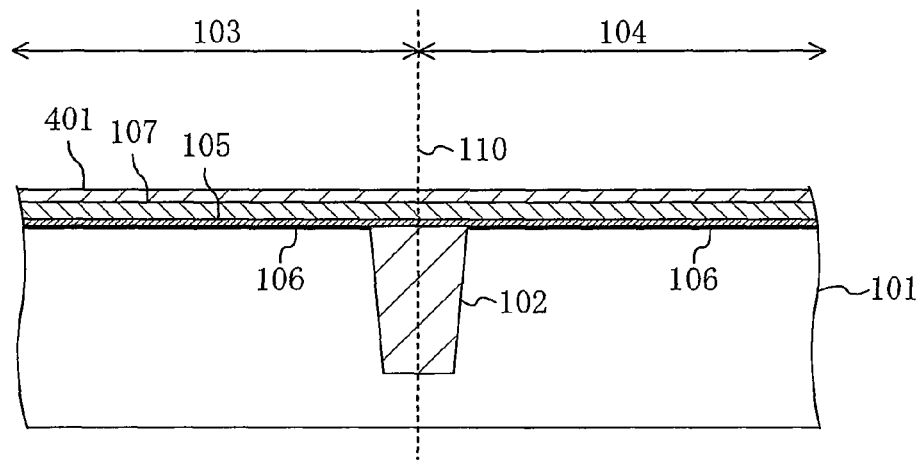
FIGS. 12A to 12C are cross-sectional views each showing a step in a method for manufacturing a semiconductor device according to a third embodiment of the present invention.

First, as shown in FIG. 12A, an isolation region 102 such as an STI, for example, is formed in a semiconductor substrate 101 to thereby separate an n-channel region 103 and a p-channel region 104 from each other, after which the n-channel region 103 and the p-channel region 104 are each subjected to a well-forming ion implantation. Then, the n-channel region 103 and the p-channel region 104 are each subjected to a threshold-adjusting ion implantation. Then, a process is performed to make a gate insulating film having an appropriate thickness and an appropriate film quality for each transistor function such as a logic transistor, an SRAM transistor and an input/output I/O transistor, for example. FIG. 12A shows a case where a gate insulating film 105 for a logic transistor, for example, is formed in each of the n-channel region 103 and the p-channel region 104. Specifically, the gate insulating film 105 is a high dielectric constant film whose relative dielectric constant is sufficiently higher than that of a silicon oxide film, e.g., a hafnium silicon oxide film (an $HfSi_xO_y$ film), formed on the surface of the semiconductor substrate 101. The EOT of the $HfSi_xO_y$ film is about 2.0 nm. At the interface between the gate insulating film 105 and the semiconductor substrate 101, the semiconductor substrate 101 is oxidized to thereby form an ultra thin silicon oxide film whose thickness is about 1 nm, for example, as an interface layer 106.

Then, as shown in FIG. 12A, a polysilicon film doped with P (phosphorus) and having a thickness of about 5 to 20 nm, for example, is deposited directly above the gate insulating film 105 as a first gate electrode material film 107 for controlling the threshold of the transistor in the n-channel region 103.

Then, as shown in FIG. 12A, an etching stopper film 401 of an Ru (ruthenium) oxide, an Ir (iridium) oxide, or the like, being a conductive oxide is formed on the first gate electrode material film 107.

Figure 12B:
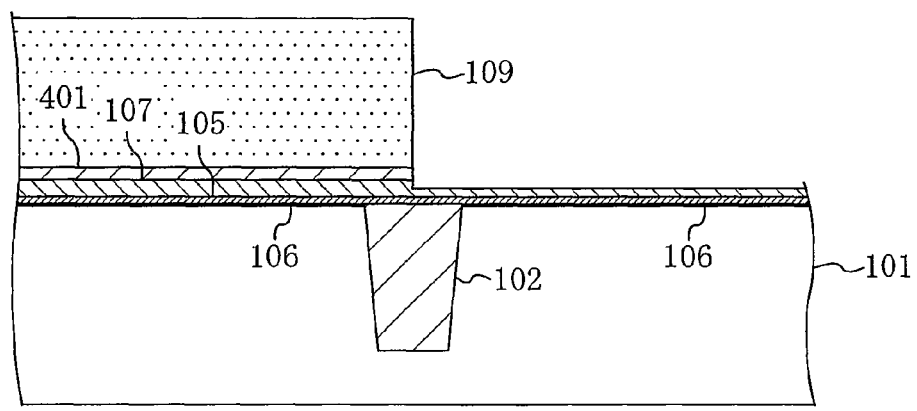

Then, as shown in FIG. 12B, a resist pattern 109 having an opening in the p-channel region 104 is formed on the etching stopper film 401, and an anisotropic dry etching is performed using the resist pattern 109 as a mask to thereby remove a portion of the etching stopper film 401 that is located in the p-channel region 104 while removing halfway a portion of the first gate electrode material film 107 that is located in the p-channel region 104. Then, the resist pattern 109 is removed.

Figure 12C:
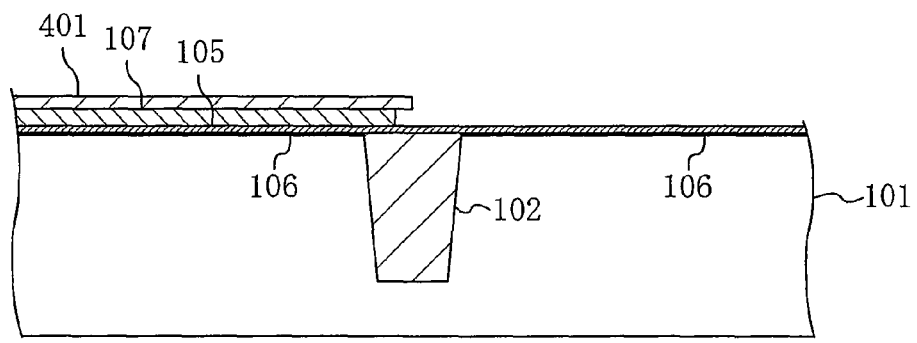

Then, as shown in FIG. 12C, the portion of the first gate electrode material film 107 remaining in the p-channel region 104 is removed by using the etching stopper film 401 covering the n-channel region 103 as a mask. A potassium hydroxide solution ($KOH/H_2O$=0.3 g/150 cc) heated to 65° C., for example, is used for the etching of the polysilicon film being the first gate electrode material film 107. Then, the etching can be done while preventing a damage such as thinning of the gate insulating film 105. Alternatively, the first gate electrode material film 107 can be removed by using, for example, a diluted APM solution ($NH_3:H_2O_2:H_2O$=3 to 10:1:200 to 1000) heated to 80° C., or a chemical dry etching using a low-damage remote plasma.

In the present embodiment, since the first gate electrode material film 107 is etched using the etching stopper film 401 as a mask, the substrate surface is not exposed to other chemicals, etc., after the etching, thus preventing damages, etc., to the surface of the gate insulating film 105.

Figure 13A:
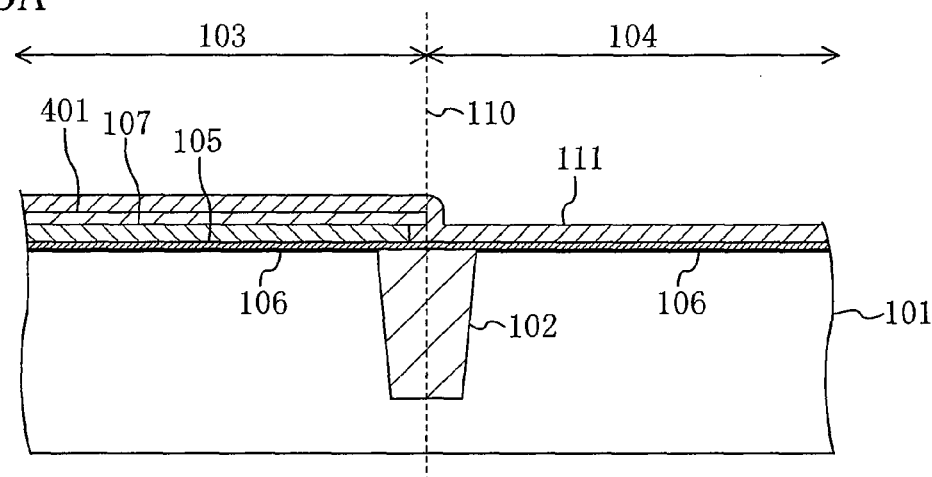
FIGS. 13A to 13C are cross-sectional views each showing a step in the method for manufacturing a semiconductor device according to the third embodiment of the present invention.

Then, as shown in FIG. 13A, a TiN film having a thickness of about 5 to 20 nm, for example, is deposited entirely across the n-channel region 103 and the p-channel region 104, as a second gate electrode material film 111 for controlling the threshold of the transistor in the p-channel region 104.

Figure 13B:
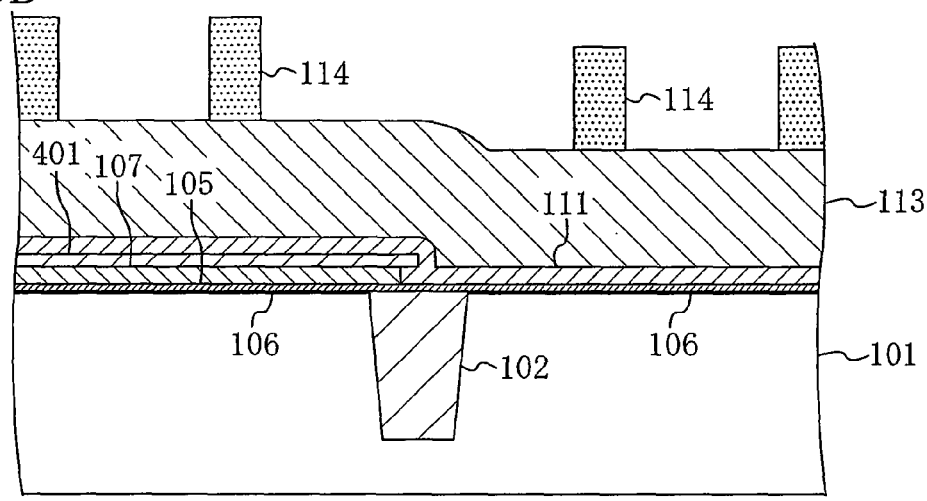

Then, as shown in FIG. 13B, a polysilicon film doped with P (phosphorus) and having a thickness of about 80 nm to 150 nm, for example, is deposited, as a third gate electrode material film 113, across the entire surface of the second gate electrode material film 111, and then a resist pattern 114 that covers the respective gate electrode formation regions of the n-channel region 103 and the p-channel region 104 is formed by photolithography on the third gate electrode material film 113.

Figure 13C:
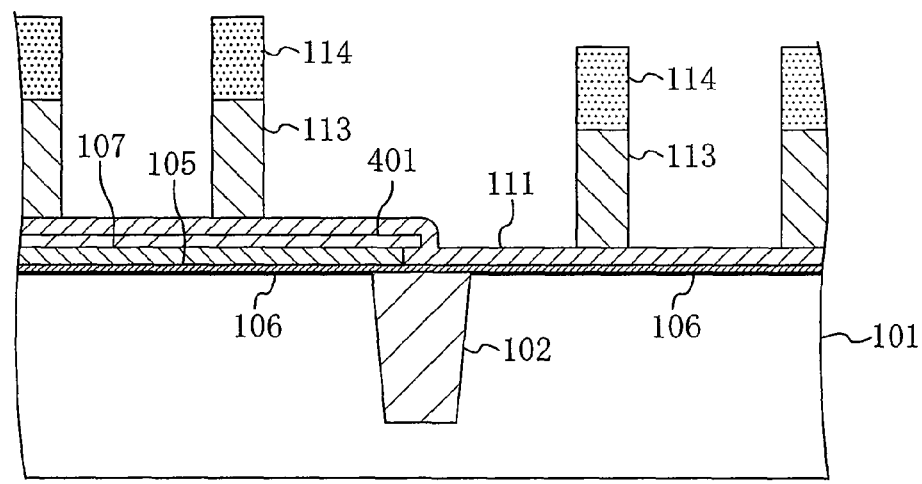

Then, as shown in FIG. 13C, the third gate electrode material film 113 is subjected to an anisotropic dry etching using a halogen-based etching gas, for example, using the resist pattern 114 as a mask. The etching of the third gate electrode material film 113, which is formed as a common component in the n-channel region 103 and the p-channel region 104, completes simultaneously in the n-channel region 103 and in the p-channel region 104, leaving the surface of the second gate electrode material film 111 exposed through the opening of the resist pattern 114.

Figure 14A:
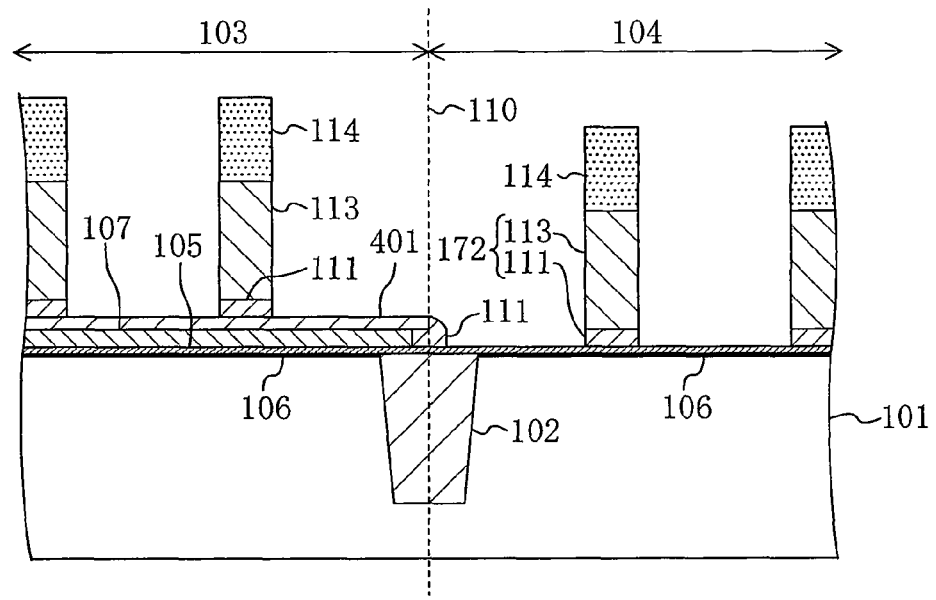
FIGS. 14A to 14C are cross-sectional views each showing a step in the method for manufacturing a semiconductor device according to the third embodiment of the present invention.

Then, as shown in FIG. 14A, the second gate electrode material 111, which is formed as a common component in the n-channel region 103 and the p-channel region 104, is etched still using the resist pattern 114 as a mask. Then, in the p-channel region 104, a gate electrode 172 is formed, the gate electrode 172 including the second gate electrode material film (TiN film) 111 in contact with the gate insulating film, and the third gate electrode material film (polysilicon film) 113 formed thereon. In the n-channel region 103, the etching is stopped by the etching stopper film (conductive oxide film) 401 lying under the second gate electrode material 111. At the same time, in the p-channel region 104, the etching is stopped by the gate insulating film 105 lying under the second gate electrode material film 111. Since the type and the thickness of the film to be etched in the n-channel region 103 are the same as those in the p-channel region 104, the amount of overetch to the gate insulating film 105 in the p-channel region 104 will not be excessive, thereby preventing the penetration of the gate insulating film 105 in the p-channel region 104.

Figure 14B:
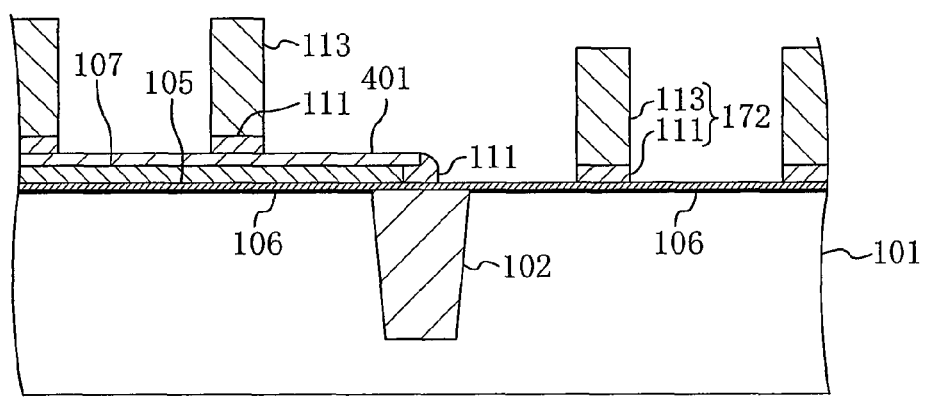
Figure 14C:
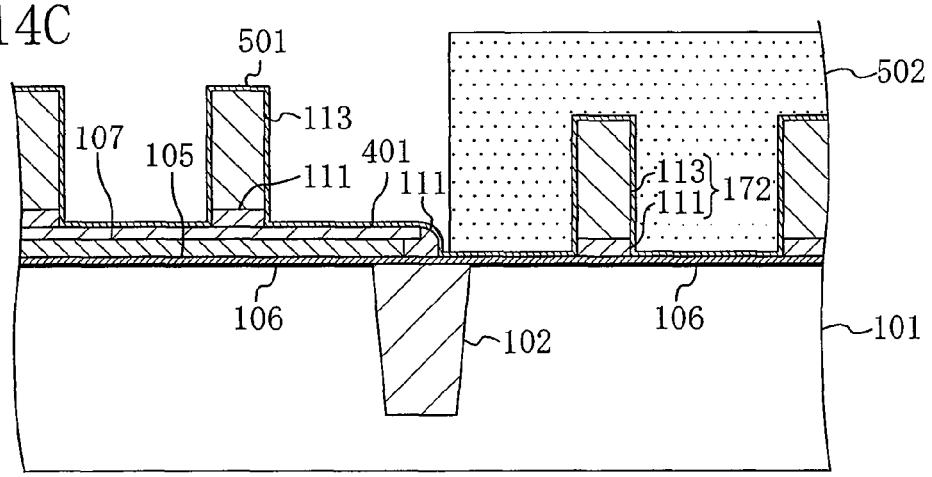

Then, the resist pattern 114 is removed, as shown in FIG. 14B, and a first offset cover film 501 of a TEOS film having a thickness of about 5 nm is deposited by an LP-CVD method, for example, entirely across the n-channel region 103 and the p-channel region 104, after which a resist pattern 502 having an opening in the n-channel region 103 is formed on the first offset cover film 501, as shown in FIG. 14C.

Figure 15A:
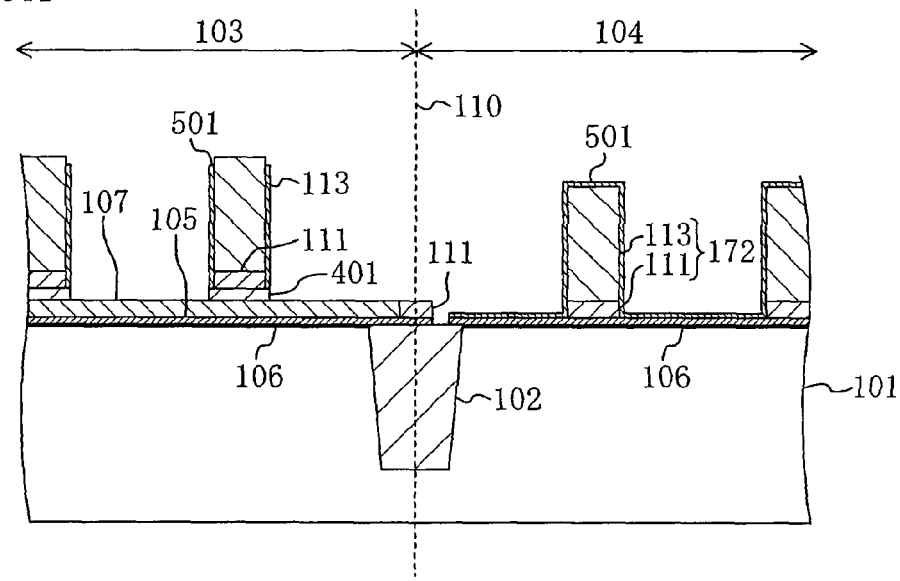
FIGS. 15A to 15C are cross-sectional views each showing a step in the method for manufacturing a semiconductor device according to the third embodiment of the present invention.

Then, the first offset cover film 501 and the etching stopper film 401 covering the n-channel region 103 is etched back using the resist pattern 502 as a mask to thereby remove the first offset cover film 501 and the etching stopper film 401 covering the n-channel region 103, as shown in FIG. 15A. Thus, the etching stopper film 401 is patterned into the shape of a gate electrode 171 in the n-channel region 103 (see FIG. 15B). The first offset cover film 501 remains on the side surface of the multi-layer structure of the second gate electrode material film (TiN film) 111 and the third gate electrode material film (polysilicon film) 113 to be a part of the gate electrode 171 in the n-channel region 103. With the first offset cover film 501, it is possible to prevent the side wall of the second gate electrode material film 111 from being exposed both in the n-channel region 103 and in the p-channel region 104, and it is also possible to increase the thickness of the etching stopper film on the surface of the semiconductor substrate 101 in the p-channel region 104 when etching the first gate electrode material film 107 in the n-channel region 103 in a subsequent step. Then, the resist pattern 502 is removed by an ashing, an SPM solution, etc. Since the side wall of the second gate electrode material film 111 is prevented from being exposed as described above, it is possible to suppress oxidization, abnormal reaction, etc., of the second gate electrode material film 111, i.e., the TiN film.

Figure 15B:
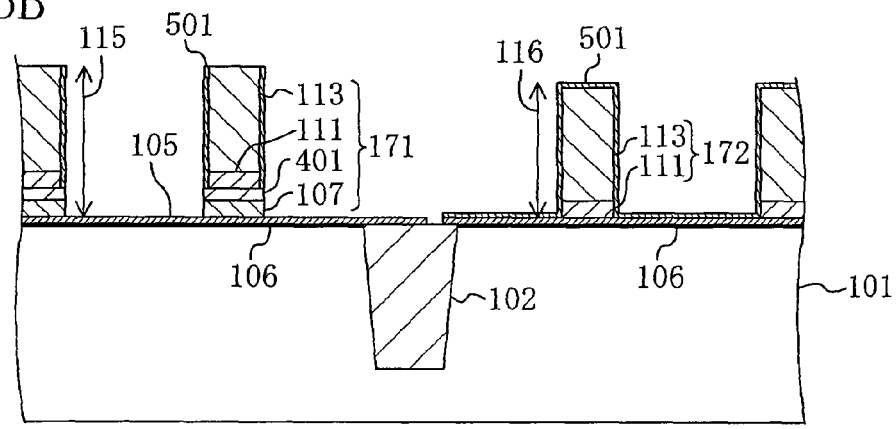

Then, as shown in FIG. 15B, the first gate electrode material 107 in the n-channel region 103 is etched back, using the third gate electrode material film 113 and the first offset cover film 501 in the n-channel region 103 as a mask, while covering the p-channel region 104 with the first offset cover film 501, so as to expose the surface of the gate insulating film 105 in the n-channel region 103. Thus, the gate electrode 171 is formed in the n-channel region 103, wherein the gate electrode 171 includes the first gate electrode material film (polysilicon film) 107 in contact with the gate insulating film, the etching stopper film (conductive oxide film) 401 formed thereon, the second gate electrode material film (TiN film) 111 formed thereon, and the third gate electrode material film (polysilicon film) 113 formed thereon. Being protected by the first offset cover film 501, the surface of the semiconductor substrate 101 and the surface of the gate electrode 172 in the p-channel region 104 are not etched, thus preserving the shapes of these elements. When the etching stopper film 401 and the first gate electrode material 107 in the n-channel region 103 are etched back, the third gate electrode material film 113 is etched back at the same time since the upper surface of the third gate electrode material film 113 in the n-channel region 103 is exposed, but the gate height 115 of the gate electrode 171 in the n-channel region 103 is brought closer to the gate height 116 of the gate electrode 172 in the p-channel region 104 because of this.

Figure 15C:
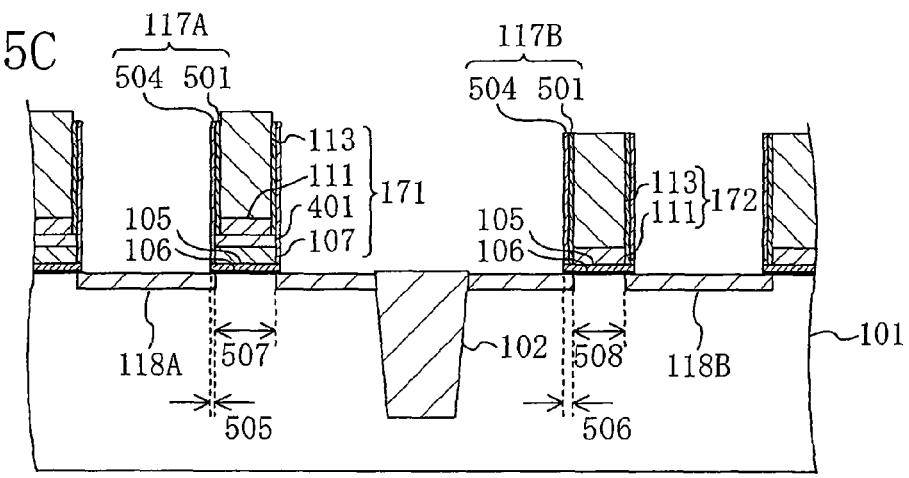

Then, after a second offset cover film 504 of a TEOS film having a thickness of about 5 nm is deposited by an LP-CVD method, for example, entirely across the n-channel region 103 and the p-channel region 104, after which the second offset cover film 504 and the first offset cover film 501 in the p-channel region 104 are etched back by an anisotropic dry etching. Thus, an offset spacer 117A is formed on the side surface of the gate electrode 171, as shown in FIG. 15C, wherein the offset spacer 117A includes the first offset cover film 501, which covers the side surface of the multi-layer structure of the second gate electrode material film (TiN film) 111 and the third gate electrode material film (polysilicon film) 113, and the second offset cover film 504, which covers the first offset cover film 501 and the side surface of the multi-layer structure of the first gate electrode material film (polysilicon film) 107 and the etching stopper film (conductive oxide film) 401. An offset spacer 117B including the first offset cover film 501 and the second offset cover film 504 is formed on the entire side surface of the gate electrode 172.

In the present embodiment, the multi-layer structure of the first gate electrode material film (polysilicon film) 107 and the etching stopper film (conductive oxide film) 401 of the gate electrode 171 has a larger width than that of the multi-layer structure of the second gate electrode material film (TiN film) 111 and the third gate electrode material film (polysilicon film) 113 of the gate electrode 171. The offset spacer 117A formed on the side surface of the multi-layer structure of the first gate electrode material film (polysilicon film) 107 and the etching stopper film (conductive oxide film) 401 of the gate electrode 171 has a smaller width than that of the offset spacer 117A formed on the side surface of the multi-layer structure of the second gate electrode material film (TiN film) 111 and the third gate electrode material film (polysilicon film) 113 of the gate electrode 171.

Then, as shown in FIG. 15C, the n-channel region 103 and the p-channel region 104 are each subjected to an ion implantation using the gate electrodes 171 and 172 and the offset spacers 117A and 117B as a mask, thereby forming the extension doped layer 118A on both sides of the gate electrode 171 in the n-channel region 103 and forming the extension doped layer 118B on both sides of the gate electrode 172 in the p-channel region 104.

In the present embodiment, the effective offset spacer width 505 in the n-channel region 103 is the thickness of the second offset cover film 504 of the offset spacer 117A, whereas the offset spacer width 506 in the p-channel region 104 is the sum of the thickness of the first offset cover film 501 and that of the second offset cover film 504. Thus, the offset spacer width 505 in the n-channel region 103 and the offset spacer width 506 in the p-channel region 104 can be set individually. Since the gate electrode width in each channel region is linked to the offset spacer width as discussed above, the effective gate electrode width 507 in the n-channel region 103 (i.e., the width of the lowermost first gate electrode material film 107) and the gate electrode width 508 in the p-channel region 104 can also be set individually.

Figure 16A:
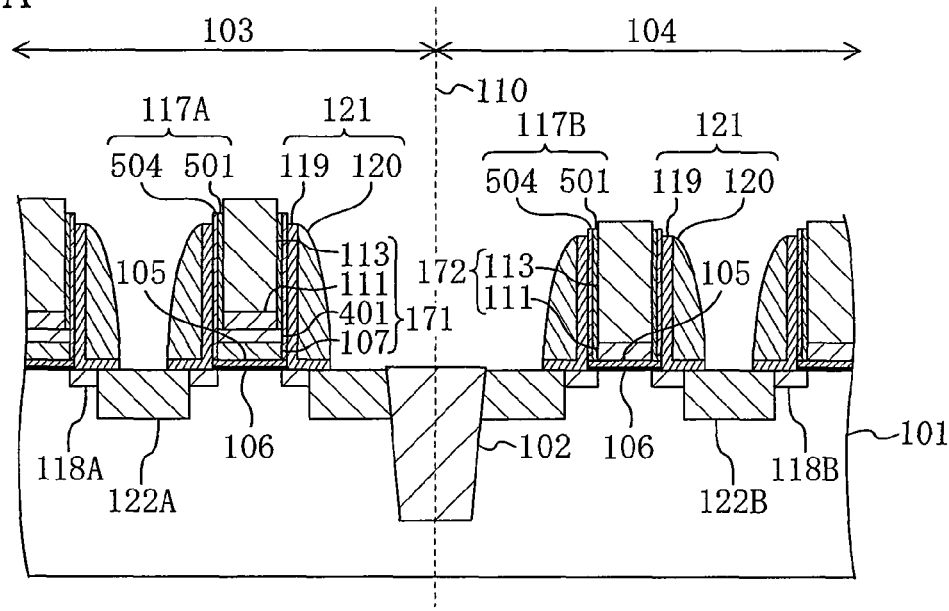
FIGS. 16A and 16B are cross-sectional views each showing a step in the method for manufacturing a semiconductor device according to the third embodiment of the present invention.

Then, as shown in FIG. 16A, an NSG film is deposited to a thickness of about 5 to 10 nm entirely across the n-channel region 103 and the p-channel region 104 by an SA-CVD method, for example, and then an SiN film is deposited to a thickness of about 20 to 40 nm by an ALD method, for example. Then, the multi-layer film of an NSG film and an SiN film is etched back by an anisotropic dry etching to thereby form a sidewall spacer 121 including a sidewall lower layer film 119 and a sidewall upper layer film 120 on the side surface of the gate electrodes 171 and 172 with the offset spacers 117A and 117B interposed therebetween. As the sidewall lower layer film 119, a TEOS film may be formed by an LP-CVD method, for example, instead of an NSG film. Then, ions of As (arsenic) and P (phosphorus) are implanted into the n-channel region 103, using the gate electrode 171, the offset spacer 117A and the sidewall spacer 121 as a mask, to thereby form a source/drain doped layer 122A on the outer side of the extension doped layer 118A in the n-channel region 103 as viewed from the gate electrode 171. Ions of B (boron) are implanted into the p-channel region 104, using the gate electrode 172, the offset spacer 117B and the sidewall spacer 121 as a mask, to thereby form a source/drain doped layer 122B on the outer side of the extension doped layer 118B in the p-channel region 104 as viewed from the gate electrode 172. Then, an activation heat treatment is performed so as to activate impurities, which have been introduced into the semiconductor substrate 101 through the ion implantation process.

Figure 16B:
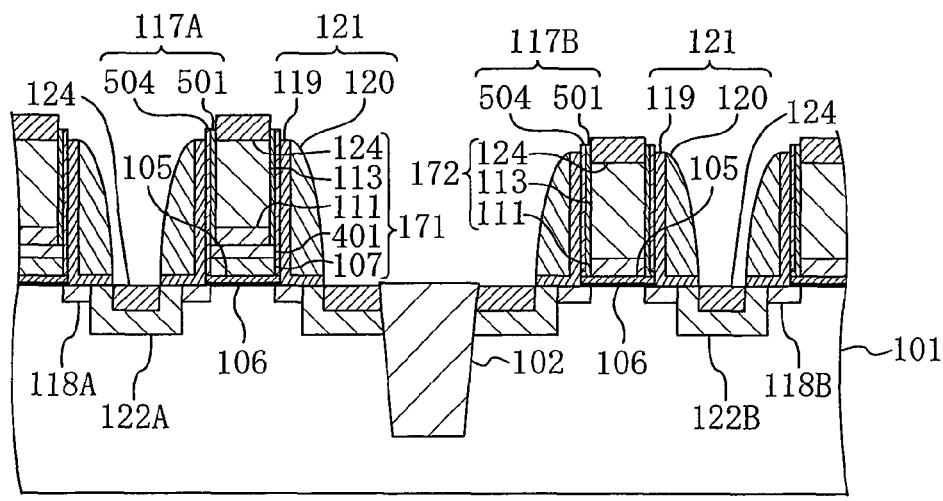

Then, an Ni film, for example, is deposited as a refractory metal film by a sputtering method, or the like, entirely across the n-channel region 103 and the p-channel region 104, and a silicidation heat treatment is performed, after which the Ni film in the un-silicided area is removed by a wet etching, for example. Thus, as shown in FIG. 16B, an Ni silicide layer 124 is formed on the surface of the source/drain doped layers 122A and 122B and on the surface of the gate electrodes 171 and 172.

In the third embodiment as described above, the first offset cover film 501, which is to serve as an etching stopper film, is formed in advance so as to cover the p-channel region 104 where there is a large amount of overetch, before the etching during the gate electrode process, i.e., before the etching of the etching stopper film 401 and the first gate electrode material 107 in the n-channel region 103. In other words, the thickness of the etching stopper film in the p-channel region 104 where there is an excessive amount of overetch during the gate electrode process is increased before the overetching. Thus, since the penetration of the gate insulating film 105 and the entailing problems such as the chipping of the substrate can be prevented, it is possible to avoid the risk of lowering the yield due to deterioration of the transistor characteristics, the increase in the particles, etc., whereby it is possible to provide a high-performance semiconductor device at a low cost.

In the third embodiment, the amount of overetch at the time of etching during the gate electrode process will not be excessive in either transistor region, whereby the gate dimension variations due to overetching can be equalized between the transistor regions. Therefore, it is possible to reduce the gate dimension variations between the transistors, i.e., the n-channel field effect transistor and the p-channel field effect transistor, whereby it is possible to provide a semiconductor device with stable transistor characteristics.

Fourth Embodiment

A semiconductor device according to a fourth embodiment of the present invention, and a method for manufacturing the same will now be described with reference to the drawings.

FIGS. 17A to 17C, 18A to 18C, 19A to 19C and 20A to 20C are cross-sectional views each showing a step in the method for manufacturing a semiconductor device according to the fourth embodiment of the present invention. In FIGS. 17A to 17C, 18A to 18C, 19A to 19C and 20A to 20C, like elements to those of the first embodiment shown in FIGS. 1A to 1C, 2A to 2C and 3A to 3C are denoted by like reference numerals and will not be further described below.

Figure 17A:
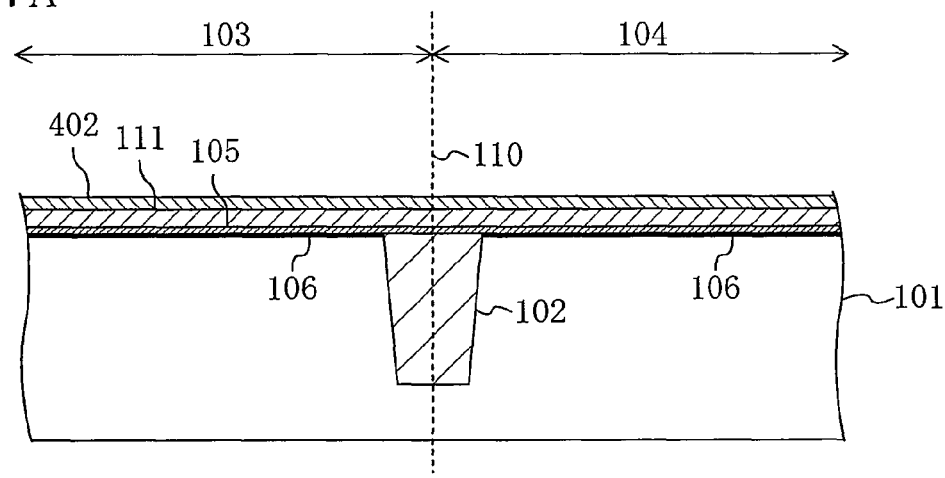
FIGS. 17A to 17C are cross-sectional views each showing a step in a method for manufacturing a semiconductor device according to a fourth embodiment of the present invention.

First, as shown in FIG. 17A, an isolation region 102 such as an STI, for example, is formed in a semiconductor substrate 101 to thereby separate an n-channel region 103 and a p-channel region 104 from each other, after which the n-channel region 103 and the p-channel region 104 are each subjected to a well-forming ion implantation. Then, the n-channel region 103 and the p-channel region 104 are each subjected to a threshold-adjusting ion implantation. Then, a process is performed to make a gate insulating film having an appropriate thickness and an appropriate film quality for each transistor function such as a logic transistor, an SRAM transistor and an input/output I/O transistor, for example. FIG. 17A shows a case where a gate insulating film 105 for a logic transistor, for example, is formed in each of the n-channel region 103 and the p-channel region 104. Specifically, the gate insulating film 105 is a high dielectric constant film whose relative dielectric constant is sufficiently higher than that of a silicon oxide film, e.g., a hafnium silicon oxide film (an $HfSi_xO_y$ film), formed on the surface of the semiconductor substrate 101. The EOT of the $HfSi_xO_y$ film is about 2.0 nm. At the interface between the gate insulating film 105 and the semiconductor substrate 101, the semiconductor substrate 101 is oxidized to thereby form an ultra thin silicon oxide film whose thickness is about 1 nm, for example, as an interface layer 106.

Then, as shown in FIG. 17A, a TiN film having a thickness of about 5 to 20 nm, for example, is deposited directly above the gate insulating film 105 as a gate electrode material film 111 for controlling the threshold of the transistor in the p-channel region 104.

Then, as shown in FIG. 17A, an etching stopper film 402 of an Ru (ruthenium) oxide, an Ir (iridium) oxide, or the like, being a conductive oxide is formed on the gate electrode material film 111.

Figure 17B:
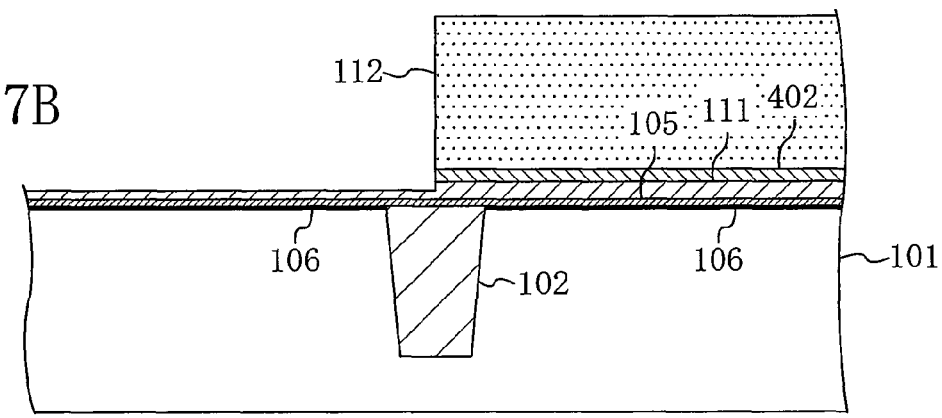

Then, as shown in FIG. 17B, a resist pattern 112 having an opening in the n-channel region 103 is formed on an etching stopper film 402, and an anisotropic dry etching is performed using the resist pattern 112 as a mask to thereby remove a portion of the etching stopper film 402 that is located in the n-channel region 103 while removing halfway a portion of the gate electrode material film 111 that is located in the n-channel region 103. Then, the resist pattern 112 is removed.

Figure 17C:
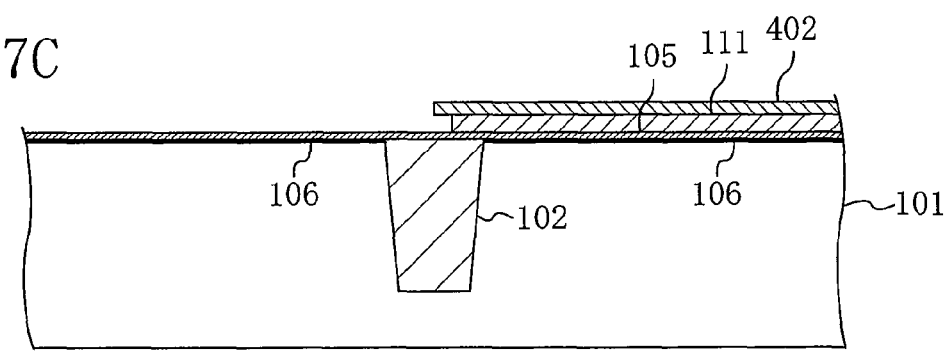

Then, as shown in FIG. 17C, the portion of the gate electrode material film 111 remaining in the n-channel region 103 is removed by using the etching stopper film 402 covering the p-channel region 104 as a mask. A chemical such as an SPM solution, diluted hydrochloric acid or hydrogen peroxide or a chemical dry etching using a low-damage remote plasma, for example, is used so as to remove the TiN film being the gate electrode material film 111.

In the present embodiment, since the gate electrode material film 111 is etched using the etching stopper film 402 as a mask, the substrate surface is not exposed to other chemicals, etc., after the etching, thus preventing damages, etc., to the surface of the gate insulating film 105.

Figure 18A:
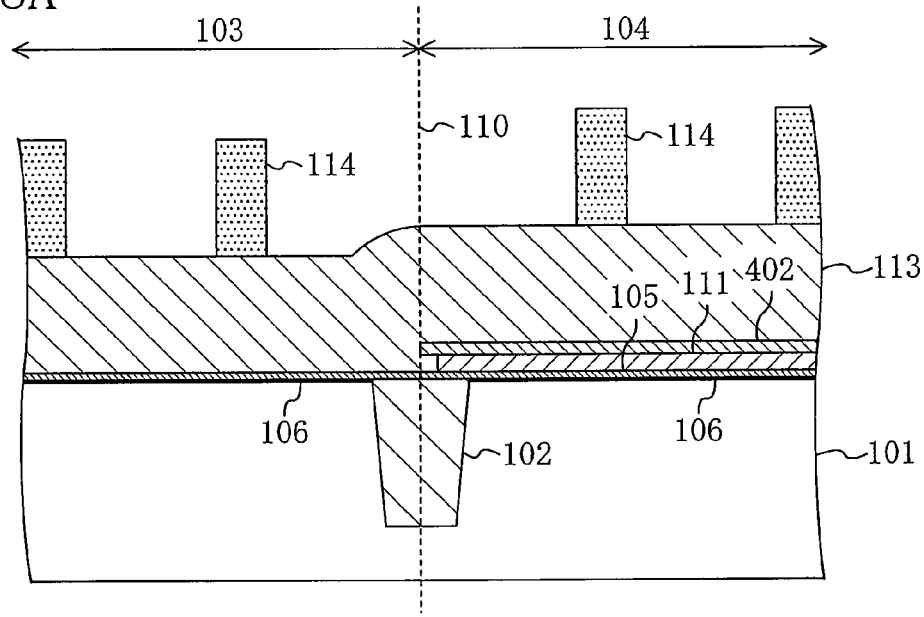
FIGS. 18A to 18C are cross-sectional views each showing a step in the method for manufacturing a semiconductor device according to the fourth embodiment of the present invention.

Then, as shown in FIG. 18A, a polysilicon film doped with P (phosphorus) and having a thickness of about 80 nm to 150 nm, for example, is deposited, as a gate electrode material film 113, across the entire surface of the semiconductor substrate 101, i.e., on the gate insulating film 105 in the n-channel region 103 and on the etching stopper film 402 in the p-channel region 104, and then a resist pattern 114 that covers the respective gate electrode formation regions of the n-channel region 103 and the p-channel region 104 is formed by photolithography on the gate electrode material film 113.

Figure 18B:
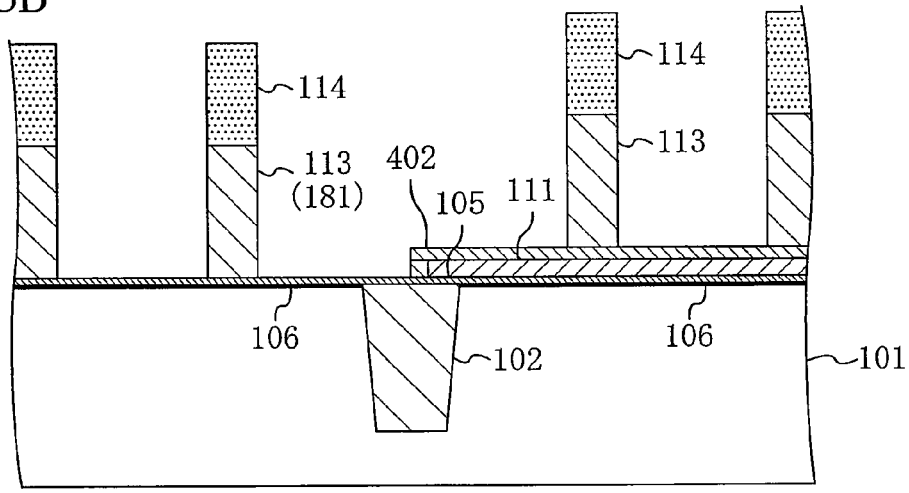

Then, as shown in FIG. 18B, the gate electrode material film 113 is subjected to an anisotropic dry etching using a halogen-based etching gas, for example, using the resist pattern 114 as a mask. Thus, a gate electrode 181 being the gate electrode material film (polysilicon film) 113 in contact with the gate insulating film is formed in the n-channel region 103. The etching of the gate electrode material film 113, which is formed as a common component in the n-channel region 103 and the p-channel region 104, completes simultaneously in the n-channel region 103 and in the p-channel region 104. Thus, etching is stopped in the p-channel region 104 by the etching stopper film 402 being the underlying conductive oxide film, and at the same time, etching is stopped in the n-channel region 103 by the underlying gate insulating film 105.

In the etching step shown in FIG. 18B, since the type and the thickness of the film to be etched in the n-channel region 103 are the same as those in the p-channel region 104, the amount of overetch to the gate insulating film 105 in the n-channel region 103 will not be excessive, thereby preventing the penetration of the gate insulating film 105 in the n-channel region 103.

Figure 18C:
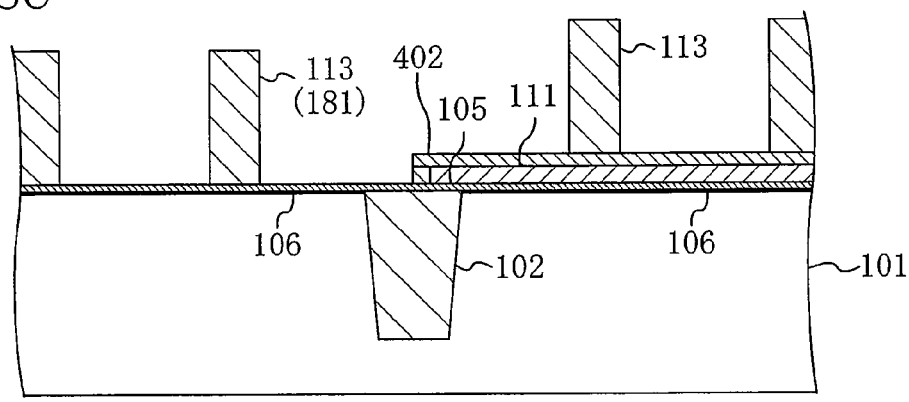
Figure 19A:
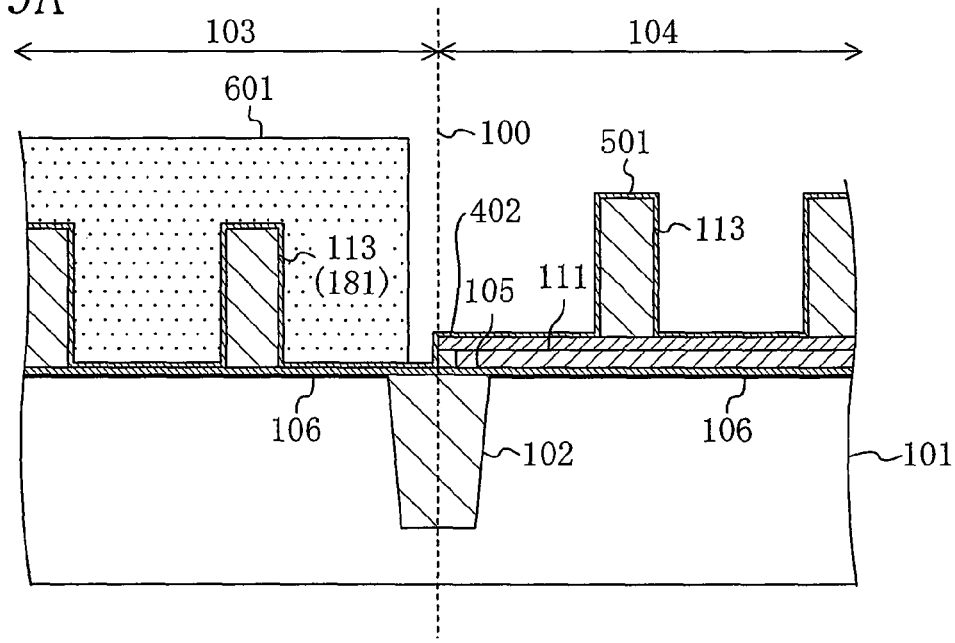
FIGS. 19A to 19C are cross-sectional views each showing a step in the method for manufacturing a semiconductor device according to the fourth embodiment of the present invention.

Then, the resist pattern 114 is removed, as shown in FIG. 18C, and a first offset cover film 501 of a TEOS film having a thickness of about 5 nm is deposited by an LP-CVD method, for example, entirely across the n-channel region 103 and the p-channel region 104, after which a resist pattern 601 having an opening in the p-channel region 104 is formed on the first offset cover film 501, as shown in FIG. 19A.

Figure 19B:
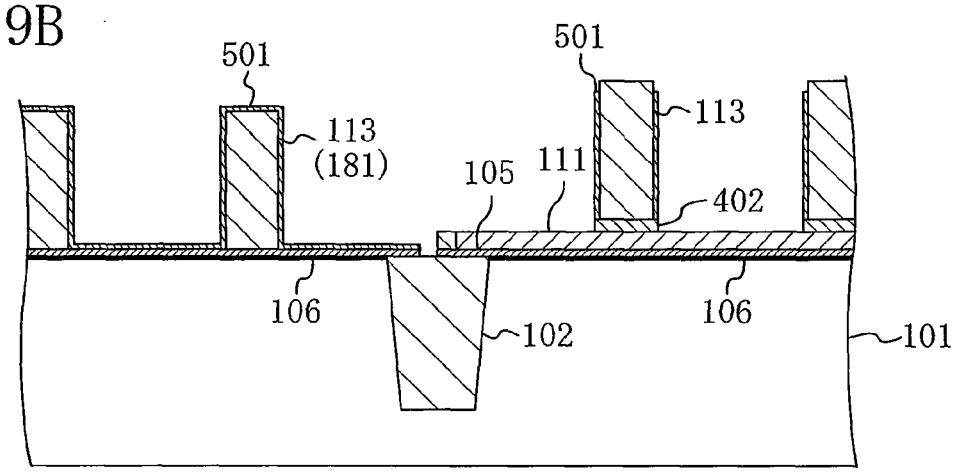

Then, the first offset cover film 501 and the etching stopper film 402 covering the p-channel region 104 is etched back using the resist pattern 601 as a mask to thereby remove the first offset cover film 501 and the etching stopper film 402 covering the p-channel region 104, as shown in FIG. 19B. Thus, the etching stopper film 402 is patterned into the shape of a gate electrode 182 in the p-channel region 104 (see FIG. 19C). The first offset cover film 501 remains on the side surface the gate electrode material film (polysilicon film) 113 to be a part of the gate electrode 182 in the p-channel region 104. With the first offset cover film 501, it is possible to increase the thickness of the etching stopper film on the surface of the semiconductor substrate 101 in the n-channel region 103 when etching the gate electrode material film 111 in the p-channel region 104 in a subsequent step. Then, the resist pattern 601 is removed by an ashing, an SPM solution, etc.

Figure 19C:
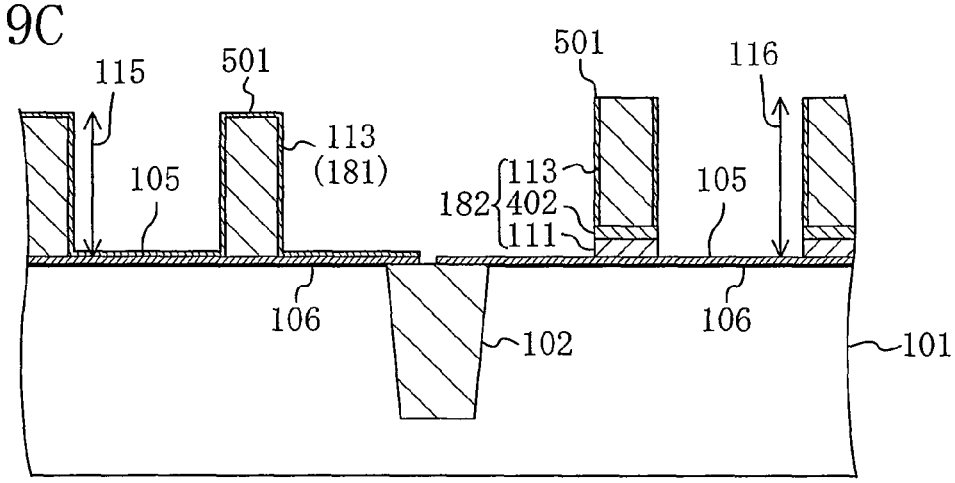

Then, as shown in FIG. 19C, the gate electrode material 111 in the p-channel region 104 is etched back, using the third gate electrode material film 113 and the first offset cover film 501 in the p-channel region 104 as a mask, while covering the n-channel region 103 with the first offset cover film 501, so as to expose the surface of the gate insulating film 105 in the p-channel region 104. Thus, the gate electrode 182 is formed in the p-channel region 104, wherein the gate electrode 182 includes the gate electrode material film (TiN film) 111 in contact with the gate insulating film, the etching stopper film (conductive oxide film) 402 formed thereon, and the gate electrode material film (polysilicon film) 113 formed thereon. Being protected by the first offset cover film 501, the surface of the semiconductor substrate 101 and the surface of the gate electrode 181 in the n-channel region 103 are not etched, thus preserving the shapes of these elements. When the etching stopper film 402 and the gate electrode material 111 in the p-channel region 104 are etched back, the gate electrode material film 113 is etched back at the same time since the upper surface of the gate electrode material film 113 in the p-channel region 104 is exposed, but the gate height 116 of the gate electrode 182 in the p-channel region 104 is brought closer to the gate height 115 of the gate electrode 181 in the n-channel region 103 because of this.

Figure 20A:
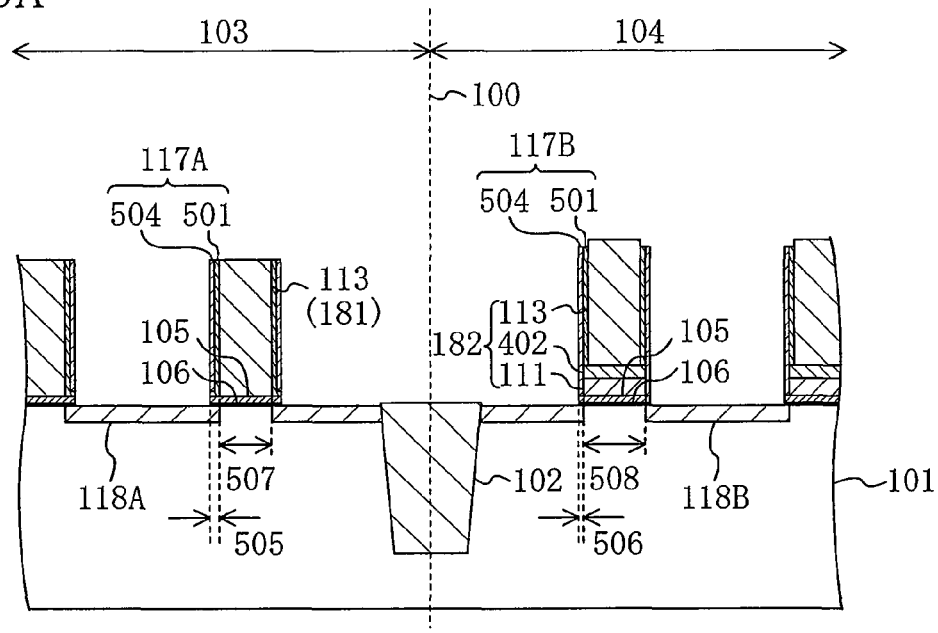
FIGS. 20A to 20C are cross-sectional views each showing a step in the method for manufacturing a semiconductor device according to the fourth embodiment of the present invention.

Then, after a second offset cover film 504 of a TEOS film having a thickness of about 5 nm is deposited by an LP-CVD method, for example, entirely across the n-channel region 103 and the p-channel region 104, after which the second offset cover film 504 and the first offset cover film 501 in the n-channel region 103 are etched back by an anisotropic dry etching. Thus, an offset spacer 117A is formed on the entire side surface of the gate electrode 181, as shown in FIG. 20A, wherein the offset spacer 117A includes the first offset cover film 501 and the second offset cover film 504. An offset spacer 117B is formed on the side surface of the gate electrode 182, wherein the offset spacer 117B includes the first offset cover film 501, which covers the side surface of the gate electrode material film (polysilicon film) 113, and the second offset cover film 504, which covers the first offset cover film 501 and the side surface of the multi-layer structure of the gate electrode material film (TiN film) 111 and the etching stopper film (conductive oxide film) 402.

In the present embodiment, the multi-layer structure of the gate electrode material film (TiN film) 111 and the etching stopper film (conductive oxide film) 402 of the gate electrode 182 has a larger width than that of the gate electrode material film (polysilicon film) 113 of the gate electrode 182. The offset spacer 117B formed on the side surface of the multi-layer structure of the gate electrode material film (TiN film) 111 and the etching stopper film (conductive oxide film) 402 of the gate electrode 182 has a smaller width than that of the offset spacer 117B formed on the side surface of the gate electrode material film (polysilicon film) 113 of the gate electrode 182.

Then, as shown in FIG. 20A, the n-channel region 103 and the p-channel region 104 are each subjected to an ion implantation using the gate electrodes 181 and 182 and the offset spacers 117A and 117B as a mask, thereby forming the extension doped layer 118A on both sides of the gate electrode 181 in the n-channel region 103 and forming the extension doped layer 118B on both sides of the gate electrode 182 in the p-channel region 104.

In the present embodiment, the offset spacer width 505 in the n-channel region 103 is the sum of the thickness of the first offset cover film 501 and that of the second offset cover film 504, whereas the effective offset spacer width 506 in the p-channel region 104 is the thickness of the second offset cover film 504 of the offset spacer 117B. Thus, the offset spacer width 505 in the n-channel region 103 and the offset spacer width 506 in the p-channel region 104 can be set individually. Since the gate electrode width in each channel region is linked to the offset spacer width as discussed above, the effective gate electrode width 507 in the n-channel region 103 (i.e., the width of the gate electrode material film 113) and the gate electrode width 508 in the p-channel region 104 (i.e., the width of the lowermost gate electrode material film 111) can also be set individually.

Figure 20B:
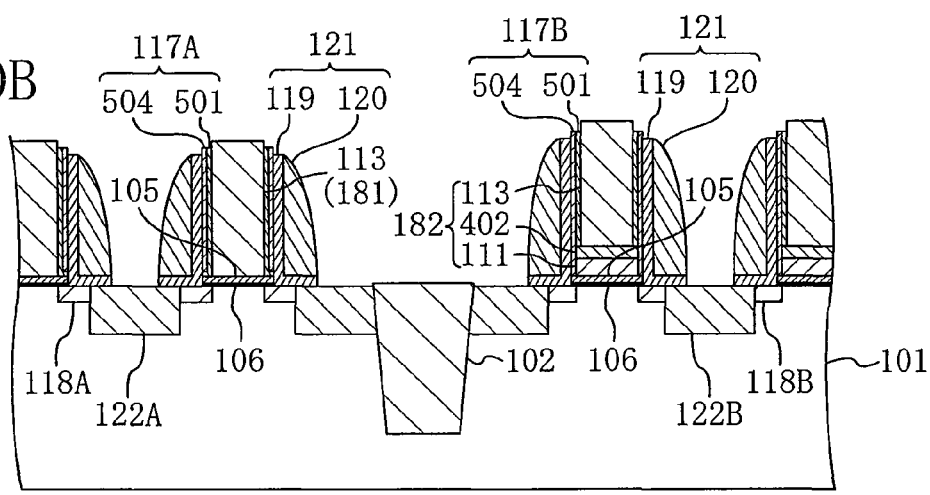

Then, as shown in FIG. 20B, an NSG film is deposited to a thickness of about 5 to 10 nm entirely across the n-channel region 103 and the p-channel region 104 by an SA-CVD method, for example, and then an SiN film is deposited to a thickness of about 20 to 40 nm by an ALD method, for example. Then, the multi-layer film of an NSG film and an SiN film is etched back by an anisotropic dry etching to thereby form a sidewall spacer 121 including a sidewall lower layer film 119 and a sidewall upper layer film 120 on the side surface of the gate electrodes 181 and 182 with the offset spacers 117A and 117B interposed therebetween. As the sidewall lower layer film 119, a TEOS film may be formed by an LP-CVD method, for example, instead of an NSG film. Then, ions of As (arsenic) and P (phosphorus) are implanted into the n-channel region 103, using the gate electrode 181, the offset spacer 117A and the sidewall spacer 121 as a mask, to thereby form a source/drain doped layer 122A on the outer side of the extension doped layer 118A in the n-channel region 103 as viewed from the gate electrode 181. Ions of B (boron) are implanted into the p-channel region 104, using the gate electrode 182, the offset spacer 117B and the sidewall spacer 121 as a mask, to thereby form a source/drain doped layer 122B on the outer side of the extension doped layer 118B in the p-channel region 104 as viewed from the gate electrode 182. Then, an activation heat treatment is performed so as to activate impurities, which have been introduced into the semiconductor substrate 101 through the ion implantation process.

Figure 20C:
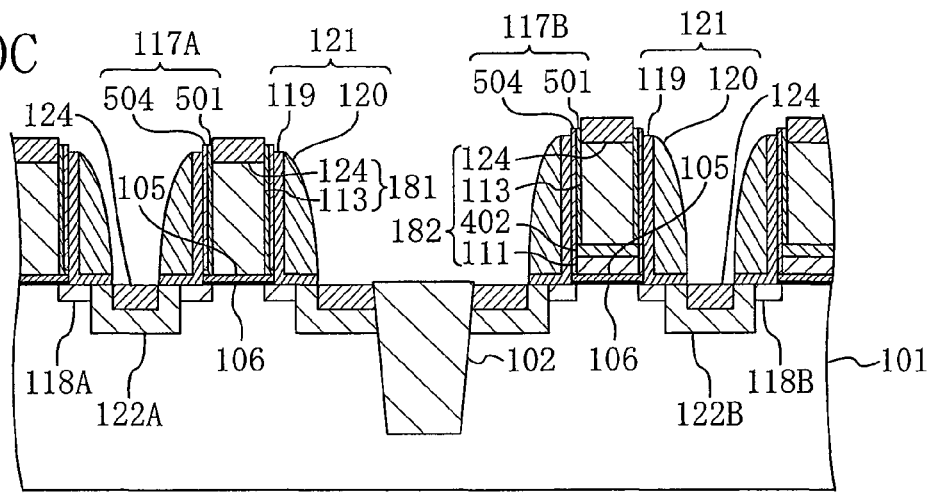
Figure 23A:
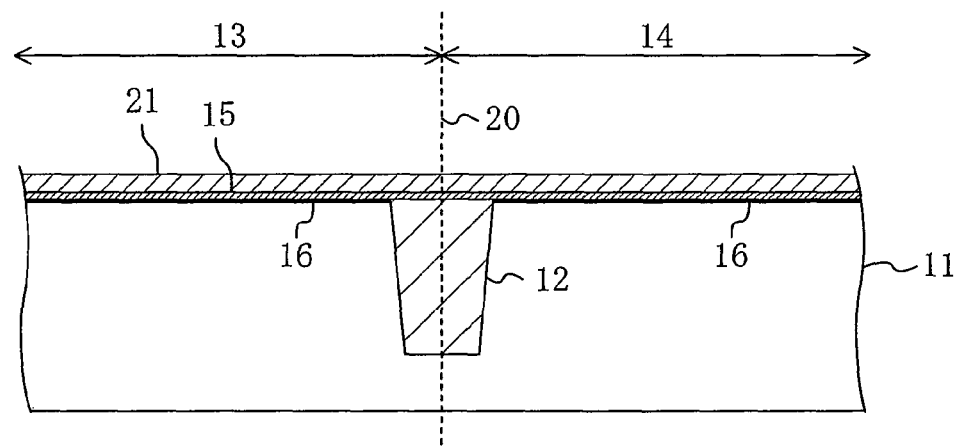
FIGS. 23A and 23B are cross-sectional views each showing a step in a method for forming a CMOSFET using a conventional hybrid metal gate electrode structure.
Figure 23B:
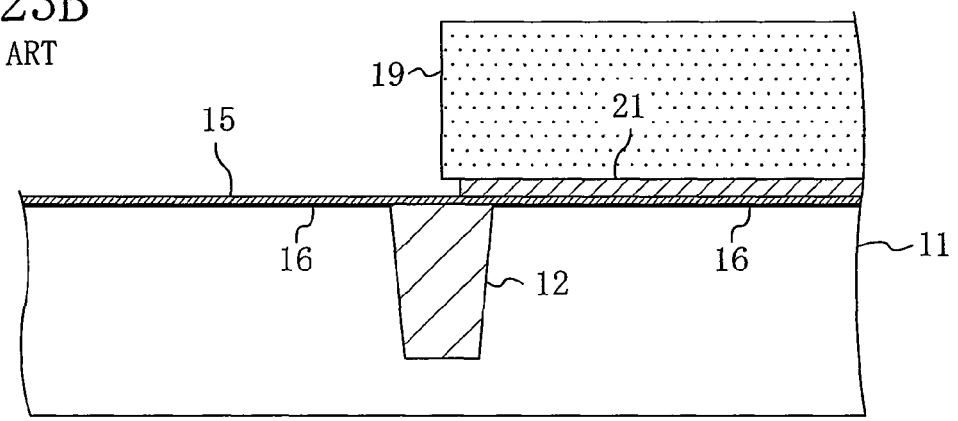
Figure 24A:
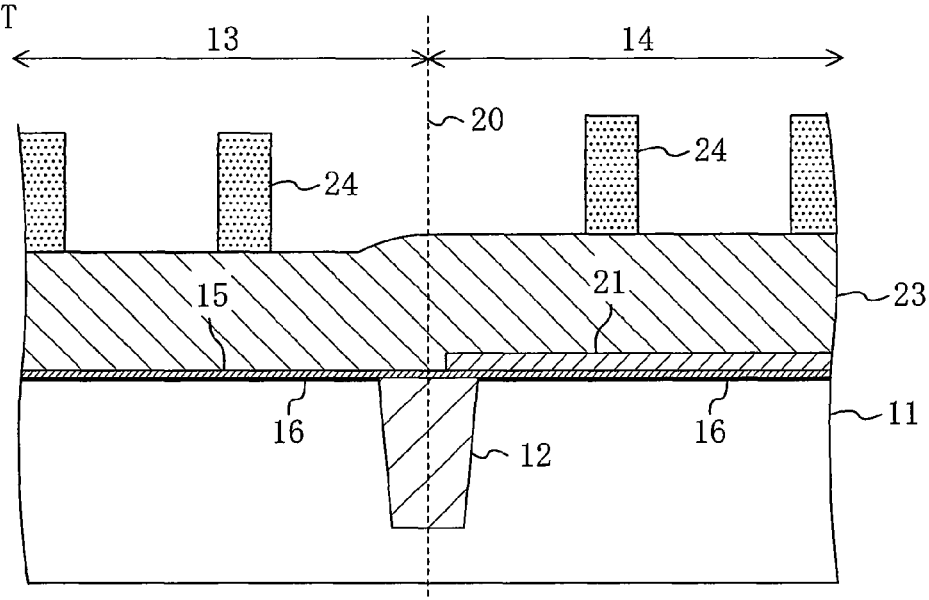
FIGS. 24A and 24B are cross-sectional views each showing a step in the method for forming a CMOSFET using a conventional hybrid metal gate electrode structure.
Figure 24B:
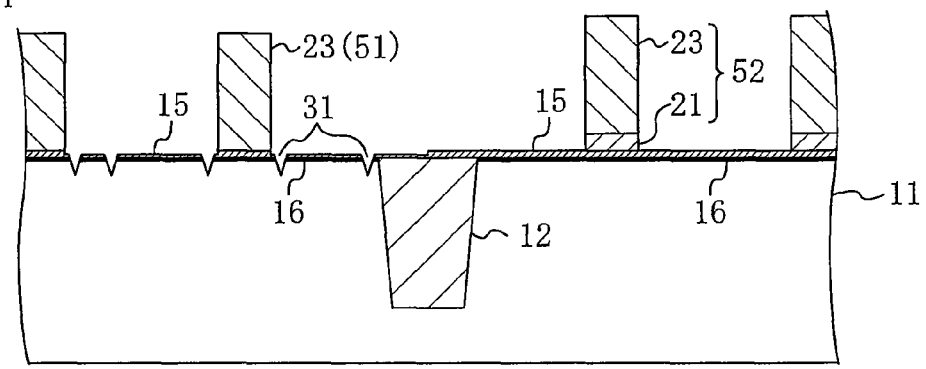
Figure 25:
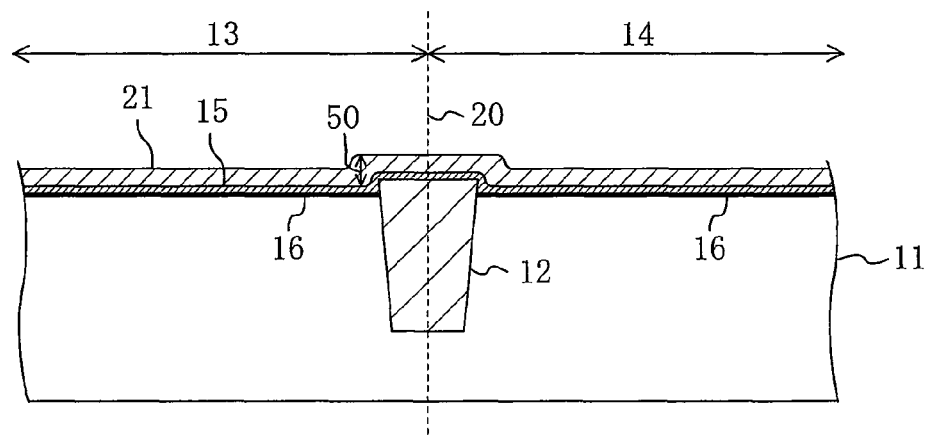
FIG. 25 shows a case where there occurs a step along the boundary between the isolation region and the active region in the step shown in FIG. 23A in a method for forming a CMOSFET using a conventional hybrid metal gate electrode structure, wherein the gate electrode material film being the metal material film is thickened on the step portion.

Then, an Ni film, for example, is deposited as a refractory metal film by a sputtering method, or the like, entirely across the n-channel region 103 and the p-channel region 104, and a silicidation heat treatment is performed, after which the Ni film in the un-silicided area is removed by a wet etching, for example. Thus, as shown in FIG. 20C, an Ni silicide layer 124 is formed on the surface of the source/drain doped layers 122A and 122B and on the surface of the gate electrodes 181 and 182.

In the fourth embodiment as described above, the first offset cover film 501, which is to serve as an etching stopper film, is formed in advance so as to cover the n-channel region 103 where there is a large amount of overetch, before the etching during the gate electrode process, i.e., before the etching of the etching stopper film 402 and the gate electrode material 111 in the p-channel region 104. In other words, the thickness of the etching stopper film in the n-channel region 103 where there is an excessive amount of overetch during the gate electrode process is increased before the overetching. Thus, since the penetration of the gate insulating film 105 and the entailing problems such as the chipping of the substrate can be prevented, it is possible to avoid the risk of lowering the yield due to deterioration of the transistor characteristics, the increase in the particles, etc., whereby it is possible to provide a high-performance semiconductor device at a low cost.

In the fourth embodiment, the amount of overetch at the time of etching during the gate electrode process will not be excessive in either transistor region, whereby the gate dimension variations due to overetching can be equalized between the transistor regions. Therefore, it is possible to reduce the gate dimension variations between the transistors, i.e., the n-channel field effect transistor and the p-channel field effect transistor, whereby it is possible to provide a semiconductor device with stable transistor characteristics.

While the gate insulating film 105 is a hafnium silicon oxide film (an HfSi$_x$O$_y$ film) whose EOT is about 2.0 nm in the first embodiment (including the first to third variations thereof), the second embodiment, the third embodiment and the fourth embodiment, the material and the thickness of the gate insulating film 105 are not limited thereto. For example, the gate insulating film 105 may be a single-layer film being an insulating film selected from the group consisting of a high-k film such as an HfO$_2$ film, an HfSi$_x$O$_y$ film or an HfAl$_x$O$_y$ film, an SiO$_2$ film, and a film obtained by adding nitrogen to one of these films, or a multi-layer insulating film including at least one insulating film selected from the group of insulating films. The thickness of the gate insulating film 105 can be appropriately determined in view of the acceptable ranges of the gate length, the EOT, the leak current, etc. A separate gate insulating film may be formed in each transistor region.

While the interface layer 106 is a silicon oxide film obtained by oxidizing the semiconductor substrate 101 in the first embodiment (including the first to third variations thereof), the second embodiment, the third embodiment and the fourth embodiment, it may alternatively be an SiON film obtained by nitriding a silicon oxide film, or a multi-layer film including a silicon oxide film obtained by oxidizing the semiconductor substrate 101 or an SiON film and an SiN film formed by an ALD method.

While the first gate electrode material film 107 (the gate electrode material film 113 in the fourth embodiment) is a polysilicon film doped with P (phosphorus) in the first embodiment (including the first to third variations thereof), the second embodiment, the third embodiment and the fourth embodiment, it may alternatively be an Si-containing material film obtained by doping an amorphous silicon film, a non-doped polysilicon film, a silicon germanium film, or the like, with at least one impurity selected from P (phosphorus), As (arsenic), B (boron), In (indium), N (nitrogen), C (carbon) and F (fluorine) through an ion implantation process. The specific material film can be determined in view of how easily it can be removed by etching in a subsequent step, the control of the threshold of the transistor, etc.

In the first embodiment (including the first to third variations thereof), the second embodiment, the third embodiment and the fourth embodiment, the material of the second gate electrode material film 111 (the gate electrode material film 111 in the fourth embodiment) may be a material having a work function close to that of $p^+$-type polysilicon so as to reduce the threshold voltage of the transistor in the p-channel region 104. Other than TiN as used in the various embodiments above, such a material may be, for example, a metal film of at least one metal selected from a group consisting of Ni, Pd, Pt, Co, Rh, Ru, Cu, Ag and Au, or a conductive film being a nitride, a silicide, a carbide, an oxide or other compounds of at least one metal selected from the group of metals. Such a metal oxide may be, for example, a metal Ru oxide, an Ir oxide, or the like. The material of the second gate electrode material film 111 (the gate electrode material film 111 in the fourth embodiment) may be, for example, a metal film of at least one metal selected from a group consisting of Ti, Zr, Hf, V, Nb, Ta, Cr, Mo and W, or a conductive film being a nitride, a silicide, a carbide, an oxide or other compounds of at least one metal selected from the group of metals. Such a metal nitride may be, for example, TiN, TaN, ZrN, HfN, NbN, or the like, of a stoichiometric composition.

While the third gate electrode material film 113 is a polysilicon film doped with P (phosphorus) in the first embodiment (including the first to third variations thereof), the second embodiment and the third embodiment, it may alternatively be an Si-containing material film obtained by doping an amorphous silicon film, a non-doped polysilicon film, a silicon germanium film, or the like, with at least one impurity selected from P (phosphorus), As (arsenic), B (boron), In (indium), N (nitrogen), C (carbon) and F (fluorine) through an ion implantation process. Even if the third gate electrode material film 113 is of an Si-containing material, the third gate electrode material film 113 does not serve as a threshold-controlling material film. Therefore, it is possible to select a material such that the silicidation in a subsequent step is easy, whereby problems caused by a silicide disconnection, such as a reduction of the yield or the characteristics deterioration, are less likely to occur. If Au, Ag, Pt, Al, Ni, Ti, Ta, W, or the like, is inserted as a resistance-reducing metal at the interface between the Si-containing material film to be the third gate electrode material film 113 and the underlying threshold-controlling electrode material film, it becomes easy to reduce the interface resistance, whereby problems in the circuit operation caused by a signal delay to the transistor gate due to the interface resistance are less likely to occur. The third gate electrode material film 113 does not need to be an Si-containing material film, but may alternatively be a film of a metal material with which the gate electrode resistance can be reduced, such as Au, Ag, Pt, Al, Ni, Ti, Ta or W.

While the first gate electrode material film 107 in the n-channel region 103 is formed before the formation of the second gate electrode material film 111 in the p-channel region 104 in the first embodiment (including the first to third variations thereof), the second embodiment and the third embodiment, the order of formation of these gate electrode material films may be reversed.

In the first embodiment (including the first to third variations thereof), the second embodiment and the third embodiment, the first gate electrode material film 107 may be a metal-containing material film and the second gate electrode material film 111 may be an Si-containing material film. In such a case, the first gate electrode material film 107 may be of a material having a work function close to that of $n^+$-type polysilicon so as to reduce the threshold voltage of the transistor in the n-channel region 103. For example, such a material may be a metal film of at least one metal selected from a group consisting of Ti, Zr, Hf, V, Nb, Ta, Cr, Mo and W, or a conductive film being a nitride, a silicide, a carbide, an oxide or other compounds of at least one metal selected from the group of metals. Note that with nitrides of Ti, Ta, Zr, Hf and Nb, those with a smaller N content than of the stoichiometric composition is preferred as the material of the first gate electrode material film 107. The second gate electrode material film 111 may be an Si-containing material film obtained by doping an amorphous silicon film, a non-doped polysilicon film, a silicon germanium film, or the like, with at least one impurity selected from P (phosphorus), As (arsenic), B (boron), In (indium), N (nitrogen), C (carbon) and F (fluorine) through an ion implantation process.

In the first embodiment (including the first to third variations thereof), the second embodiment and the third embodiment, there is no need for a step of etching away the metal-containing material film (the second gate electrode material film 111) deposited directly above the gate insulating film 105, whereby the layer produced through mixing of the gate insulating film 105 and the metal-containing material will not be etched. Therefore, it is possible to avoid a metal damage to the gate insulating film 105.

While the Ni silicide layer 124 is formed as a silicide layer in an upper portion of the source/drain doped layer or the gate electrode in the first embodiment (including the first to third variations thereof), the second embodiment, the third embodiment and the fourth embodiment, the layer may alternatively be a silicide layer containing at least one of Ni, Co, Ti, W and Pt. As described above in the embodiments of the present invention, the difference between the n-channel gate electrode height 115 in the n-channel region 103 and the p-channel gate electrode height 116 in the p-channel region 104 before the silicidation is small, and the gate electrode step at the np boundary between the n-channel region 103 and the p-channel region 104 can be made small, whereby it is possible to reduce the risk of gate electrode silicide disconnection at the np boundary. In the first embodiment (including the first and second variations thereof) and the second embodiment, the n-channel gate electrode height 115 in the n-channel region 103 and the p-channel gate electrode height 116 in the p-channel region 104 can be made equal to each other at the time of the photolithography for processing the gate electrode. Therefore, it is possible to increase the focus margin in the photolithography, and it is possible to stabilize the gate dimensions even when forming more minute gate electrodes, whereby it is possible to obtain a high-performance semiconductor device with more stable transistor characteristics.

While the offset spacer 117 is an insulating film such as a TEOS film or an SiN film in the first embodiment (including the first to third variations thereof) and the second embodiment, it may alternatively be an NSG film formed by an SA-CVD method with which a film can be deposited at a low temperature, a TEOS film formed by a low-temperature LP-CVD method, an SiN film formed by a low-temperature ALD method, an SiC film, an SiON film or an SiOC film formed at a low temperature, etc., for example, in order to suppress the oxidization of the gate electrode and the semiconductor substrate 101. Particularly, the use of an oxygen-free film as the offset spacer 117 is effective in suppressing the oxidization of the gate electrode and the semiconductor substrate 101.

While the first etching cover film 201 is an HDP-NSG film in the first to third variations of the first embodiment, it may alternatively be an NSG film formed by an SA-CVD method, an oxide film such as a TEOS film formed by a CVD method such as an LP-CVD method, or a nitride film such as an SiN film formed by an ALD method, for example.

While the second etching cover film 301 is an HDP-NSG film in the second variation of the first embodiment, it may alternatively be an NSG film formed by an SA-CVD method, an oxide film such as a TEOS film formed by a CVD method such as an LP-CVD method, or a nitride film such as an SiN film formed by an ALD method, for example. By forming the first etching cover film 201 and the second etching cover film 301 by the same material and with the same thickness in the second variation of the first embodiment, there is an advantage that the first etching cover film 201 and the second etching cover film 301 can be etched by an equal amount in a subsequent step.

While an Ir oxide or an Ru oxide is used as a conductive oxide of the etching stopper film 401 or 402 in the second to fourth embodiments, the same effect can be achieved with other conductive oxides. In the second embodiment, where the first etching stopper film 401 and the second etching stopper film 402 need to be etched together, the thickness of each etching stopper film is preferably determined so that each etching stopper film is etched by an equal amount. For example, where the first etching stopper film 401 and the second etching stopper film 402 are of the same material, these etching stopper films preferably have the same thickness.

While the first offset cover film 501 is a TEOS film formed by an LP-CVD method in the third embodiment and the fourth embodiment, it may alternatively be an NSG film formed by an SA-CVD method with which a film can be deposited at a low temperature, a TEOS film formed by a low-temperature LP-CVD method, an SiN film formed by a low-temperature ALD method, an SiC film, an SiON film or an SiOC film formed at a low temperature, etc., for example, in order to suppress the oxidization of the gate electrode and the semiconductor substrate 101. Particularly, the use of an oxygen-free film as the first offset cover film 501 is effective in suppressing the oxidization of the gate electrode and the semiconductor substrate 101.

While the second offset cover film 504 is a TEOS film formed by an LP-CVD method in the third embodiment and the fourth embodiment, it may alternatively be an NSG film formed by an SA-CVD method with which a film can be deposited at a low temperature, a TEOS film formed by a low-temperature LP-CVD method, an SiN film formed by a low-temperature ALD method, an SiC film, an SiON film or an SiOC film formed at a low temperature, etc., for example, in order to suppress the oxidization of the gate electrode and the semiconductor substrate 101. Particularly, the use of an oxygen-free film as the second offset cover film 504 is effective in suppressing the oxidization of the gate electrode and the semiconductor substrate 101.

In the first embodiment (including the first to third variations thereof) and the fourth embodiment, the gate electrode (the gate electrode 151 of the first embodiment (including the first to third variations thereof) or the gate electrode 181 of the fourth embodiment) may be fully silicided by siliciding the gate electrode after siliciding the active region (the source/drain doped layers 122A and 122B) in the presence of a hard mask on the gate electrode. In other words, the gate electrode 151 of the first embodiment (including the first to third variations thereof) or the gate electrode 181 of the fourth embodiment may be provided in a FUSI structure. Then, the threshold of the transistor in the n-channel region 103 is dictated by the fully-silicided gate electrode material, whereby it is possible to vary the threshold, i.e., to reduce the EOT, after the gate formation (gate patterning) step.

In the first embodiment (including the first to third variations thereof) and the second embodiment, since the etching rates ER1 and ER2 of the anisotropic dry etching according to Expressions 1 to 3 above are inversely proportional to the thicknesses TH1 and TH2, respectively, it is preferred to select an etching gas so that ER2>ER1 where TH1>TH2. Where ER1>ER2, it is preferred to set the thicknesses so that TH2>TH1.

How the etching rates ER1 and ER2 and the thicknesses TH1 and TH2 are set will now be described in detail. First, when setting the etching rates ER1 and ER2 and the thicknesses TH1 and TH2, attention should be drawn to the bond dissociation energy of each film to be etched before and after the etching reaction. FIGS. 21 and 22 show the bond dissociation energy D (M1-M2) of various materials when using a chlorine-based etching gas and that when using a bromine-based etching gas, respectively. Where the material of interest is TiN, for example, M1 and M2 denote Ti and N, respectively. The values of bond dissociation energy are those in a standard state (the temperature is 298K).

Consider the bond dissociation energy of the film to be etched before the etching reaction. Where a polysilicon film and a TiN film are the films to be etched, the etching rates ER1 and ER2 are influenced by the Si—Si bond dissociation energy D (Si—Si) in polysilicon and the Ti—N bond dissociation energy D (Ti—N) in TiN. As shown in FIGS. 21 and 22, D(Ti—N) is larger than D(Si—Si), indicating that the Ti—N bond is stronger, but D(Ti—N) is a relatively small value as is D(Si—Si).

Now consider the bond dissociation energy of the film to be etched after the etching reaction. Where a polysilicon film and a TiN film are the films to be etched and where a chlorine-based etching gas is used, the Si—Cl bond dissociation energy D (Si—Cl) is substantially equal to the Ti—Cl bond dissociation energy D (Ti—Cl) as shown in FIG. 21. Thus, although a higher energy than that for D(Ti—N) and D(Si—Si) is required for the etching reaction to proceed, once a sufficient energy is provided, the etching rate for the polysilicon film is substantially equal to that for the TiN film because D(Si—Cl) and D(Ti—Cl) are substantially equal to each other, though the TiN film has a slightly lower etching rate. Therefore, where a polysilicon film and a TiN film are the films to be etched and where a chlorine-based etching gas is used, ER1 and ER2 are substantially equal to each other, and therefore TH1=TH2 is preferred.

Consider the bond dissociation energy of the film to be etched before the etching reaction where a polysilicon film and a TaN film are the films to be etched. As shown in FIGS. 21 and 22, the Ta—N bond dissociation energy D (Ta—N) of TaN is larger than the Si—Si bond dissociation energy D (Si—Si) of polysilicon, indicating that the Ta—N bond is stronger. Since D(Ta—N) is about twice D(Si—Si), there is a significant difference between the etching rate ER1 and the etching rate ER2. An energy higher than D(Ta—N) and D(Si—Si) is required for the etching reaction to proceed, thus requiring a relatively high energy, and the thickness is therefore determined in view of the selectivity with respect to the underlying layer. Then, in some cases, the thickness of the polysilicon film is set to be about 1.2 to 3 times that of the TaN film, for example. Where a polysilicon film and a TaN film are the films to be etched, since the bond dissociation energy before etching is large, there is less influence of the bond dissociation energy of the film to be etched after the etching reaction.

Thus, in the first embodiment (including the first to third variations thereof) and the second embodiment, the thickness of the first gate electrode material film 107, i.e., the silicon-containing layer, and the thickness of the second gate electrode material film 111, i.e., the metal-containing layer, are determined based on the bond dissociation energy D (M1-M2), being an energy required for dissociating the bond between the metal M1 of the metal-containing layer and the element M2 thereof being the same as or different from the metal M1, and on the bond dissociation energy D (Si—Si), being an energy required for dissociating the silicon bond of the silicon-containing layer. Specifically, where the bond dissociation energy D (M1-M2) is larger than the bond dissociation energy D (Si—Si), the thickness of the silicon-containing layer is set to be larger than that of the metal-containing layer. Where the bond dissociation energy D (M1-M2) is smaller than the bond dissociation energy D (Si—Si), the thickness of the silicon-containing layer is set to be smaller than that of the metal-containing layer. Where the metal-containing layer is of Ti, Ta, or the like, and the silicon-containing layer is of polysilicon, the thickness of the silicon-containing layer is set to be smaller than that of the metal-containing layer. Where the metal-containing layer is of TiN, TiC, TiO, TaN, TaC, TaO, or the like, and the silicon-containing layer is of polysilicon, the thickness of the silicon-containing layer is set to be larger than that of the metal-containing layer.

How the etching rate and the thickness of the etching stopper film (the etching cover film in the first and second variations of the first embodiment) are set in the first and second variations of the first embodiment and the second to fourth embodiments will now be described. In the embodiments above, the etching stopper film is an $SiO_2$ film or an $HfO_2$ film similar to the gate insulating film, a TEOS film, an NSG film formed by an SA-CVD method, an insulative oxide film such as an HDP-NSG film, or a conductive oxide film of an oxide of Ir, Ru, or the like. As are the films to be etched discussed above, these etching stopper films are also influenced by the bond dissociation energy before and after the etching reaction as shown in FIGS. 21 and 22, and the formation of a by-product, the gasification thereof, etc., due to the bonding between the etching gas and the etching stopper film. Herein, an $SiO_2$ film or an $HfO_2$ film similar to the gate insulating film is preferred as an etching stopper film as thin as about 2 nm because the bond dissociation energies D (Si—O) and D(Hf—O) of $SiO_2$ and $HfO_2$ exhibit very high values and they do not react with Cl and Br in the etching gas.

A TEOS film, an NSG film formed by an SA-CVD method or an HDP-NSG film is also preferred as a thin etching stopper film because the bond dissociation energies D (Si—O) thereof exhibit very high values and they do not react with Cl and Br in the etching gas.

A conductive oxide film of an oxide of Ir or Ru can be used as an etching stopper film whose thickness is about 5 to 20 nm because they do not react with Cl and Br in the etching gas, though the bond dissociation energies D (Ir—O) and D(Ru—O) thereof are relatively low.

It is understood that the etching rate as described above is not dictated solely by the bond dissociation energy, but is also influenced by, for example, the formation of a by-product, the gasification thereof, etc., due to the bonding between the etching gas and the etched film.

What is claimed is:

1. A semiconductor device, comprising an n-channel field effect transistor and a p-channel field effect transistor formed on a semiconductor substrate, wherein:
   a gate electrode of one of the n-channel field effect transistor and the p-channel field effect transistor includes a metal-containing layer in contact with a gate insulating film, and a first silicon-containing layer formed on the metal-containing layer;
   a gate electrode of the other one of the n-channel field effect transistor and the p-channel field effect transistor includes a second silicon-containing layer in contact with a gate insulating film, a conductive oxide layer formed on the second silicon-containing layer, another metal-containing layer formed on the conductive oxide layer, and a third silicon-containing layer formed on the other metal-containing layer;
   the metal-containing layer and the other metal-containing layer are formed by a same metal-containing film;
   the first silicon-containing layer and the third silicon-containing layer are formed by a same silicon-containing material film,
   an offset spacer is formed on a side surface of the gate electrode of the other one of the n-channel field effect transistor and the p-channel field effect transistor, and
   a width of a lower portion of the offset spacer in the gate length direction is smaller than that of an upper portion of the offset spacer in the gate length direction.

2. The semiconductor device of claim 1, wherein:
   another offset spacer is formed on a side surface of the gate electrode of the one of the n-channel field effect transistor and the p-channel field effect transistor; and
   the another offset spacer is a multi-layer film of a first offset film and a second offset film formed outside the first offset film.

3. The semiconductor device of claim 2, wherein
   a part of the offset spacer formed on a side surface of a multi-layer structure of the second silicon-containing layer and the conductive oxide layer is a single-layer film of the second offset film, and
   a part of the offset spacer formed on a side surface of a multi-layer structure of the other metal-containing layer and the third silicon-containing layer is a multi-layer film of the first offset film and the second offset film.

4. The semiconductor device of claim 1, wherein:
   a width of the multi-layer structure of the second silicon-containing layer and the conductive oxide layer is larger than that of the multi-layer structure of the other metal-containing layer and the third silicon-containing layer; and
   a width of the offset spacer on the side surface of the multi-layer structure of the second silicon-containing layer and the conductive oxide layer is smaller than that of the offset spacer on the side surface of the multi-layer structure of the other metal-containing layer and the third silicon-containing layer.

5. The semiconductor device of claim 1, wherein at least an upper portion of each of the first silicon-containing layer and the third silicon-containing layer is a silicide layer containing at least one of Ni, Co, Ti, W and Pt.

6. The semiconductor device of claim 1, wherein the second silicon-containing layer is of a material obtained by doping polysilicon, amorphous silicon or silicon germanium with at least one impurity selected from P (phosphorus), As (arsenic), B (boron), In (indium), N (nitrogen), C (carbon) and F (fluorine).

7. A semiconductor device, comprising an n-channel field effect transistor and a p-channel field effect transistor formed on a semiconductor substrate, wherein:
a gate electrode of one of the n-channel field effect transistor and the p-channel field effect transistor includes a metal-containing layer in contact with a gate insulating film, a conductive oxide layer formed on the metal-containing layer, and a silicon-containing layer formed on the conductive oxide layer;
a gate electrode of the other one of the n-channel field effect transistor and the p-channel field effect transistor includes another silicon-containing layer in contact with a gate insulating film;
the silicon-containing layer and the other silicon-containing layer are formed by a same silicon-containing material film,
an offset spacer is formed on a side surface of the gate electrode of the one of the n-channel field effect transistor and the p-channel field effect transistor, and
a width of a lower portion of the offset spacer in the gate length direction is smaller than that of an upper portion of the offset spacer in the gate length direction.

8. The semiconductor device of claim 7, wherein an entirety of the other silicon-containing layer is a silicide layer.

9. The semiconductor device of claim 7, wherein at least an upper portion of each of the silicon-containing layer and the other silicon-containing layer is a silicide layer containing at least one of Ni, Co, Ti, W and Pt.

10. The semiconductor device of claim 7, wherein:
another offset spacer is formed on a side surface of the gate electrode of the other one of the n-channel field effect transistor and the p-channel field effect transistor;
the another offset spacer is a multi-layer film of a first offset film and a second offset film formed outside the first offset film.

11. The semiconductor device of claim 10, wherein
a part of the offset spacer formed on a side surface of a multi-layer structure of the metal-containing layer and the conductive oxide layer is a single-layer film of the second offset film, and
a part of the offset spacer formed on a side surface of the silicon-containing layer is a multi-layer film of the first offset film and the second offset film.

12. The semiconductor device of claim 7, wherein:
a width of the multi-layer structure of the metal-containing layer and the conductive oxide layer is larger than that of the silicon-containing layer; and
a width of the offset spacer on the side surface of the multi-layer structure of the metal-containing layer and the conductive oxide layer is smaller than that of the offset spacer on the side surface of the silicon-containing layer.

13. The semiconductor device of claim 2, wherein the first offset film and the second offset film are each a silicon oxide film, a silicon nitride film, a silicon carbide film, a silicon oxide nitride film or a silicon oxide carbide film.

14. The semiconductor device of claim 1, wherein the conductive oxide layer is of an oxide containing at least one of Ir and Ru.

15. The semiconductor device of claim 1, wherein the metal-containing layer and the other metal-containing layer is a metal film of at least one metal selected from a group consisting of Ni, Pd, Pt, Co, Rh, Ru, Cu, Ag and Au, or a film of a silicide or a carbide of at least one metal selected from the group of metals.

16. The semiconductor device of claim 1, wherein the metal-containing layer and the other metal-containing layer is a metal film of at least one metal selected from a group consisting of Ti, Zr, Hf, V, Nb, Ta, Cr, Mo and W, or a film of a nitride, a silicide or a carbide of at least one metal selected from the group of metals.

17. The semiconductor device of claim 1, wherein the gate insulating film is a single-layer film of an insulating film selected from the group consisting of an $SiO_2$ film, an $HfO_2$ film, an $HfAl_xO_y$ film, an $HfSi_xO_y$ film and a film obtained by adding nitrogen to one of these films, or a multi-layer insulating film including at least one insulating film selected from the group of insulating films.

18. The semiconductor device of claim 10, wherein the first offset film and the second offset film are each a silicon oxide film, a silicon nitride film, a silicon carbide film, a silicon oxide nitride film or a silicon oxide carbide film.

19. The semiconductor device of claim 7, wherein the conductive oxide layer is of an oxide containing at least one of Ir and Ru.

20. The semiconductor device of claim 7, wherein the metal-containing layer is a metal film of at least one metal selected from a group consisting of Ni, Pd, Pt, Co, Rh, Ru, Cu, Ag and Au, or a film of a silicide or a carbide of at least one metal selected from the group of metals.

21. The semiconductor device of claim 7, wherein the metal-containing layer is a metal film of at least one metal selected from a group consisting of Ti, Zr, Hf, V, Nb, Ta, Cr, Mo and W, or a film of a nitride, a silicide or a carbide of at least one metal selected from the group of metals.

22. The semiconductor device of claim 7, wherein the gate insulating film is a single-layer film of an insulating film selected from the group consisting of an $SiO_2$ film, an $HfO_2$ film, an $HfAl_xO_y$ film, an $HfSi_xO_y$ film and a film obtained by adding nitrogen to one of these films, or a multi-layer insulating film including at least one insulating film selected from the group of insulating films.

* * * * *